US011300826B2

(12) United States Patent
Yamazaki et al.

(10) Patent No.: US 11,300,826 B2
(45) Date of Patent: Apr. 12, 2022

(54) DISPLAY DEVICE, ELECTRONIC DEVICE, AND MOBILE INFORMATION TERMINAL

(71) Applicant: Semiconductor Energy Laboratory Co., Ltd., Atsugi (JP)

(72) Inventors: Shunpei Yamazaki, Tokyo (JP); Satoshi Seo, Kanagawa (JP); Ryo Hatsumi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/726,313

(22) Filed: Dec. 24, 2019

(65) Prior Publication Data

US 2020/0133064 A1 Apr. 30, 2020

Related U.S. Application Data

(62) Division of application No. 15/671,750, filed on Aug. 8, 2017, now abandoned.

(30) Foreign Application Priority Data

Aug. 17, 2016 (JP) .................................. 2016-159793

(51) Int. Cl.
*G02F 1/1335* (2006.01)
*H01L 27/32* (2006.01)
(Continued)

(52) U.S. Cl.
CPC ...... *G02F 1/133553* (2013.01); *G02F 1/1343* (2013.01); *G02F 1/13718* (2013.01);
(Continued)

(58) Field of Classification Search
CPC ......... G02F 1/133553; G02F 1/133514; G02F 1/133621; G02F 1/1343; G02F 1/13718;
(Continued)

(56) References Cited

U.S. PATENT DOCUMENTS 6,714,268 B2 3/2004 Wang et al.
7,038,641 B2 5/2006 Hirota et al.
(Continued)

FOREIGN PATENT DOCUMENTS

EP 1770676 A 4/2007
JP 2001-066593 A 3/2001
(Continued)

OTHER PUBLICATIONS

International Search Report (Application No. PCT/IB2017/052675) dated Aug. 15, 2017.
(Continued)

*Primary Examiner* — Nathanael R Briggs
(74) *Attorney, Agent, or Firm* — Fish & Richardson P.C.

(57) ABSTRACT

A display device capable of displaying images with wide color gamut is provided. A display device capable of displaying images with wide color gamut and capable of relaxing contrast made by narrow spectra is provided. The display device includes a liquid crystal element and a light-emitting element. Light obtained from the liquid crystal element through a color filter has an NTSC area ratio of more than or equal to 20 percent and less than or equal to 60 percent and light emitted by the light-emitting element has a BT.2020 area ratio of more than or equal to 80 percent and less than or equal to 100 percent.

20 Claims, 19 Drawing Sheets

(51) Int. Cl.
  *G02F 1/13357* (2006.01)
  *G02F 1/1343* (2006.01)
  *G02F 1/137* (2006.01)
  *H04N 1/60* (2006.01)
  *H01L 51/50* (2006.01)

(52) U.S. Cl.
  CPC .. *G02F 1/133514* (2013.01); *G02F 1/133621* (2013.01); *H01L 27/3232* (2013.01); *H04N 1/6058* (2013.01); *H04N 1/6066* (2013.01); *G02F 2201/44* (2013.01); *H01L 27/322* (2013.01); *H01L 27/3244* (2013.01); *H01L 51/504* (2013.01)

(58) Field of Classification Search
  CPC ............. G02F 2201/44; H01L 27/3232; H01L 27/322; H01L 27/3244; H01L 51/504; H04N 1/6058; H04N 1/6066
  See application file for complete search history.

(56) References Cited

U.S. PATENT DOCUMENTS

| | | |
|---|---|---|
| 7,084,936 B2 | 8/2006 | Kato |
| 7,102,704 B2 | 9/2006 | Mitsui et al. |
| 7,176,991 B2 | 2/2007 | Mitsui et al. |
| 7,239,361 B2 | 7/2007 | Kato |
| 7,248,235 B2 | 7/2007 | Fujii et al. |
| 7,385,654 B2 | 6/2008 | Mitsui et al. |
| 7,951,450 B2 | 5/2011 | Helber et al. |
| 7,973,902 B2 | 7/2011 | Helber et al. |
| 7,982,385 B2 | 7/2011 | Kimura et al. |
| 8,101,755 B2 | 1/2012 | Inoue et al. |
| 8,278,817 B2 | 10/2012 | Kimura et al. |
| 8,329,903 B2 | 12/2012 | Inoue et al. |
| 8,462,298 B2 | 6/2013 | Helber et al. |
| 8,629,612 B2 | 1/2014 | Kimura et al. |
| 9,099,374 B2 | 8/2015 | Kimura et al. |
| 9,343,691 B2 | 5/2016 | Seo et al. |
| 9,411,165 B2 | 8/2016 | Yamazaki et al. |
| 9,563,063 B2 | 2/2017 | Yamazaki et al. |
| 9,583,735 B2 | 2/2017 | Seo et al. |
| 9,711,110 B2 | 7/2017 | Yamazaki et al. |
| 9,873,796 B2 | 1/2018 | Sakamoto et al. |
| 9,876,196 B2 | 1/2018 | Seo et al. |
| 9,887,236 B2 | 2/2018 | Kimura et al. |
| 10,043,849 B2 | 8/2018 | Kimura et al. |
| 10,082,700 B2 | 9/2018 | Ohyama et al. |
| 10,680,017 B2 | 6/2020 | Uesaka et al. |
| 10,790,329 B2 | 9/2020 | Kimura et al. |
| 2003/0201960 A1 | 10/2003 | Fujieda |
| 2006/0072047 A1 | 4/2006 | Sekiguchi |
| 2007/0035243 A1 | 2/2007 | Lee |
| 2007/0085789 A1 | 4/2007 | De Vaan |
| 2008/0180618 A1 | 7/2008 | Fujieda |
| 2009/0015770 A1* | 1/2009 | Ito ............... G02F 1/133555 349/108 |
| 2009/0170230 A1 | 7/2009 | Kidu et al. |
| 2010/0171905 A1 | 7/2010 | Huang et al. |
| 2011/0273080 A1* | 11/2011 | Kimura ........... H01L 27/3216 313/498 |
| 2012/0147296 A1* | 6/2012 | Montgomery .... G02F 1/133615 349/70 |
| 2013/0264549 A1 | 10/2013 | Yamazaki et al. |
| 2013/0301124 A1 | 11/2013 | Yamazaki et al. |
| 2015/0255029 A1* | 9/2015 | Niikura ........... G09G 3/3648 345/98 |
| 2016/0042696 A1 | 2/2016 | Hirakata et al. |
| 2016/0190500 A1 | 6/2016 | Watabe et al. |
| 2016/0299387 A1 | 10/2016 | Yamazaki et al. |
| 2016/0343782 A1* | 11/2016 | Wen ............... G02F 1/133553 |
| 2017/0040402 A1 | 2/2017 | Yasumoto et al. |
| 2017/0075155 A1 | 3/2017 | Oikawa et al. |
| 2017/0098689 A1 | 4/2017 | Ikeda et al. |
| 2020/0411586 A1 | 12/2020 | Kimura et al. |

FOREIGN PATENT DOCUMENTS

| | | |
|---|---|---|
| JP | 2002-196702 A | 7/2002 |
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-053090 A | 3/2007 |
| JP | 2007-122033 A | 5/2007 |
| JP | 2007-515662 | 6/2007 |
| JP | 2007-232882 A | 9/2007 |
| JP | 4161574 | 10/2008 |
| JP | 2009-158140 A | 7/2009 |
| JP | 2009-164236 A | 7/2009 |
| JP | 2010-509638 | 3/2010 |
| JP | 2010-120931 A | 6/2010 |
| JP | 2013-221965 A | 10/2013 |
| JP | 2016-038490 A | 3/2016 |
| JP | 2016-039151 A | 3/2016 |
| JP | 2016-066046 A | 4/2016 |
| JP | 2016-096137 A | 5/2016 |
| JP | 2016-126342 A | 7/2016 |
| JP | 2016-127287 A | 7/2016 |
| TW | 200837396 | 9/2008 |
| TW | 201531533 | 8/2015 |
| WO | WO-2004/053819 | 6/2004 |
| WO | WO-2005/031693 | 4/2005 |
| WO | WO-2008/063353 | 5/2008 |
| WO | WO-2008/073188 | 6/2008 |
| WO | WO-2016/063812 | 4/2016 |

OTHER PUBLICATIONS

Written Opinion (Application No. PCT/IB2017/052675) dated Aug. 15, 2017.
Shieh.H, "Transflective display by Hybrid OLED and LCD", LEOS 2005 (IEEE Lasers and Electro-Optics Society Annual Meeting), Oct. 22, 2005, pp. 650-651, IEEE.
Lee.J et al., "High ambient-contrast-ratio display using tandem reflective liquid crystal display and organic light-emitting device", Optics Express, Nov. 14, 2005, vol. 13, No. 23, pp. 9431-9438.
Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.
Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.
Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.
Taiwanese Office Action (Application No. 110110256) dated Apr. 27, 2021.

\* cited by examiner

FIG. 7A
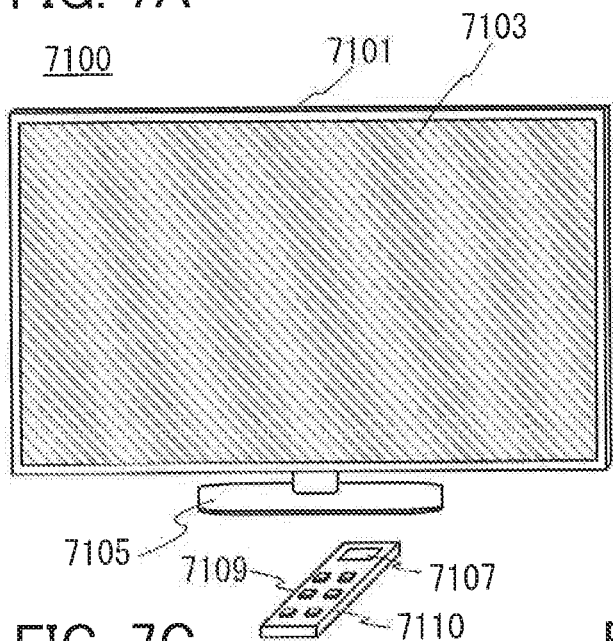
FIG. 7B
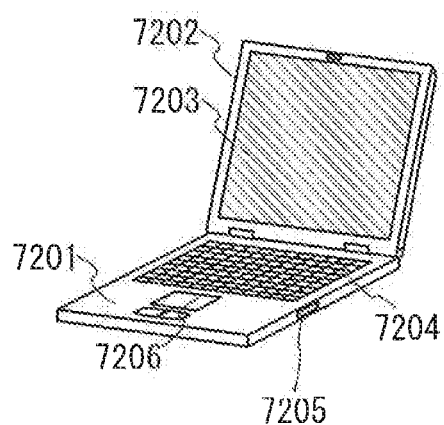
FIG. 7C
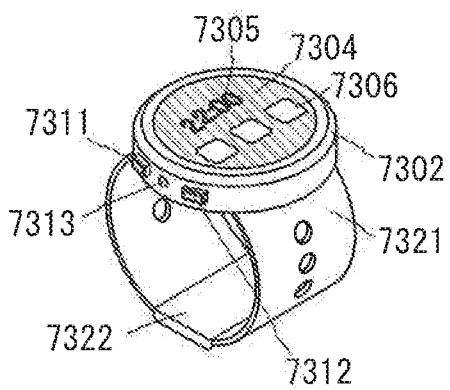
FIG. 7D
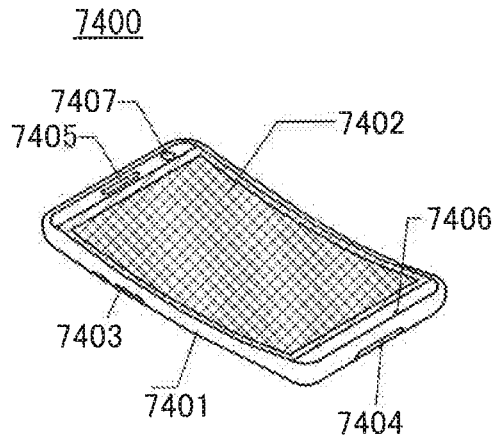
FIG. 7D'-1   FIG. 7D'-2   FIG. 7E
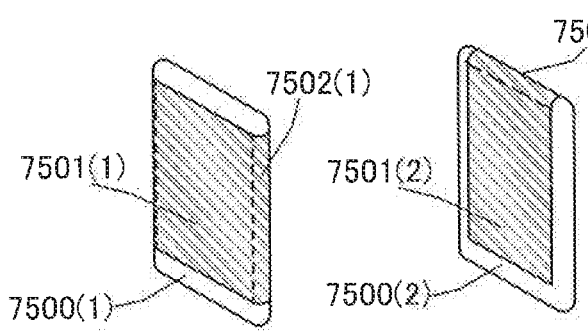
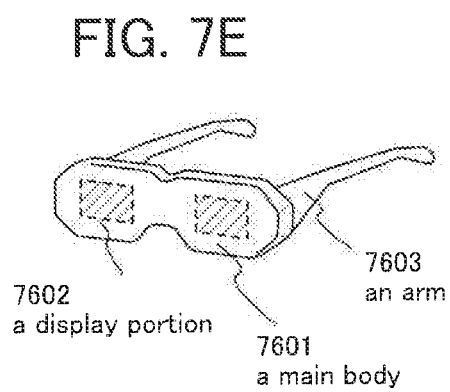

(The incident light is set to 100%)

(The reflectance of a standard white plate is set to 100%)

(The reflectance of a standard white plate is set to 100%)

DISPLAY DEVICE, ELECTRONIC DEVICE, AND MOBILE INFORMATION TERMINAL

CROSS-REFERENCE TO RELATED APPLICATIONS

This application is a divisional of U.S. application Ser. No. 15/671,750, filed Aug. 8, 2017, now pending, which claims the benefit of a foreign priority application filed in Japan as Serial No. 2016-159793 on Aug. 17, 2016, both of which are incorporated by reference.

TECHNICAL FIELD

One embodiment of the present invention relates to a display device and an electronic device. Note that one embodiment of the present invention is not limited thereto. That is, one embodiment of the present invention relates to an object, a method, a manufacturing method, or a driving method. In addition, one embodiment of the present invention relates to a process, a machine, manufacture, and a composition of matter. As specific examples, a semiconductor device, a display device, a liquid crystal display device, a lighting device, and the like can be given.

BACKGROUND ART

As display devices, liquid crystal display devices including a liquid crystal element as their display element, light-emitting devices including a light-emitting element (EL element) as their display element, and the like are known. For example, in a liquid crystal display device, a liquid crystal element including a liquid crystal material is interposed between a pair of electrodes facing each other with alignment films provided between the liquid crystal element and the electrodes, and the liquid crystal display device displays images by utilizing the optical modulation action of the liquid crystal. A light-emitting device includes a light-emitting element in which an EL layer is interposed between a pair of electrodes, and displays images by utilizing light emission obtained from the light-emitting element when voltage is applied between the pair of electrodes.

In order to perform full-color display with the use of the display elements, in the case of the liquid crystal element, a color filter is used in combination with the liquid crystal element, whereby full-color display can be performed. In the case of the light-emitting element, a plurality of light-emitting elements in which EL layers include light-emitting materials for different light emission colors are formed, whereby full-color display can be performed. Alternatively, the light emitting element can also be used in combination with a color filter.

As specific methods for displaying full-color images with light-emitting elements, so-called side-by-side patterning in which light-emitting elements which emit light of different colors are separately formed, a white-color filter method in which a white color light-emitting element is combined with a color filter, and a color conversion method in which a light-emitting element which emits monochromatic light such as a blue light-emitting element is combined with a color conversion filter can be given.

REFERENCE

Patent Document

[Patent Document 1] Japanese Published Patent Application No. 2007-53090

DISCLOSURE OF INVENTION

In order to make such a display device display full-color images, the chromaticities (x, y) of emission colors of light-emitting elements are set within desired ranges, so that images with wide color gamut can be displayed.

However, although light emitted by a light-emitting element has an excellent chromaticity, the light has extremely narrow spectra, such that the display has strong contrast, and thus is too intense for the viewers and likely to tire them.

Then, one embodiment of the present invention provides a display device capable of displaying images with wide color gamut. Another embodiment of the present invention provides a display device capable of displaying images with wide color gamut and capable of relaxing contrast made by narrow spectra. Another embodiment of the present invention provides a display device capable of displaying eye-friendly images with wide color gamut. Another embodiment of the present invention provides a novel light-emitting element. Another embodiment of the present invention provides a light-emitting element with excellent color purity.

Note that the descriptions of these objects do not preclude the existence of other objects. In one embodiment of the present invention, there is no need to achieve all the objects. Other objects will be apparent from and can be derived from the description of the specification, the drawings, the claims, and the like.

One embodiment of the present invention is a display device including a liquid crystal element and a light-emitting element. In the display device, light obtained from the liquid crystal element through a color filter has an NTSC area ratio of more than or equal to 20% and less than or equal to 60% and light emitted by the light-emitting element has a BT.2020 area ratio of more than or equal to 80% and less than or equal to 100%. Note that the light emitted by the light-emitting element preferably has a BT.2020 area ratio of more than or equal to 90% and less than or equal to 100%.

Another embodiment of the present invention is a display device including a liquid crystal element and a light-emitting element. In the display device, light obtained from the liquid crystal element through a color filter has an NTSC coverage of more than or equal to 20% and less than or equal to 60% and light emitted by the light-emitting element has a BT.2020 coverage of more than or equal to 75% and less than or equal to 100%. Note that the light emitted by the light-emitting element preferably has a BT.2020 coverage of more than or equal to 75% and less than or equal to 100%.

Another embodiment of the present invention is a display device including a liquid crystal element and a light-emitting element. In the display device, light obtained from the liquid crystal element has an NTSC coverage of more than or equal to 20% and less than or equal to 60% and light emitted by the light-emitting element has CIE 1931 chromaticity coordinates (x, y), where x is more than or equal to 0.130 and less than or equal to 0.250 and y is more than 0.710 and less than or equal to 0.810.

Another embodiment of the present invention is a display device including a liquid crystal element and a light-emitting element. In the display device, light obtained from the liquid crystal element has an NTSC coverage of more than or equal to 20% and less than or equal to 60% and light emitted by the light-emitting element has CIE 1931 chromaticity coordinates (x, y), where x is more than 0.680 and less than or equal to 0.720 and y is more than or equal to 0.260 and less than or equal to 0.320.

Another embodiment of the present invention is a display device including a liquid crystal element and a light-emitting element. In the display device, light obtained from the liquid crystal element has an NTSC coverage of more than or equal to 20% and less than or equal to 60% and light emitted by the light-emitting element has CIE 1931 chromaticity coordinates (x, y), where x is more than or equal to 0.120 and less than or equal to 0.170 and y is more than or equal to 0.020 and less than 0.060.

Note that, in each of the above structures, the liquid crystal element is a reflective liquid crystal element and the light-emitting element is a light-emitting element including an EL layer between a reflective electrode and a semi-transmissive and semi-reflective electrode.

In the above structures, the EL layer included in the light-emitting element preferably emits white light. The EL layer includes at least a light-emitting layer. A plurality of EL layers may be provided. The EL layers may be stacked with a charge generation layer provided therebetween.

Another embodiment of the present invention is an electronic device that includes the display device of one embodiment of the present invention and an operation key, a speaker, a microphone, or an external connection portion.

Another embodiment of the present invention is a mobile information terminal that includes the display device of one embodiment of the present invention and an operation key, a speaker, a microphone, or an external connection portion.

One embodiment of the present invention includes, in its category, in addition to a display device including a display element, an electronic device including the display device (specifically, an electronic device including the display element or the display device and a connection terminal or an operation key) and a lighting device including the display device (specifically, a lighting device including the display element or the display device and a housing). Accordingly, a display device in this specification means an image display device or a light source (including a lighting device). Furthermore, the display device includes the following modules in its category: a module in which a connector such as a flexible printed circuit (FPC) or a tape carrier package (TCP) is attached to a display device; a module having a TCP whose end is provided with a printed wiring board; and a module in which an integrated circuit (IC) is directly mounted on a display element by a chip on glass (COG) method.

According to one embodiment of the present invention, a display device capable of displaying images with wide color gamut can be provided. According to another embodiment of the present invention, a display device capable of displaying images with wide color gamut and capable of relaxing contrast made by narrow spectra can be provided. According to another embodiment of the present invention, a display device capable of displaying eye-friendly images with wide color gamut can be provided. According to another embodiment of the present invention, a novel light-emitting element can be provided. According to another embodiment of the present invention, a light-emitting element with excellent color purity can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 5A, 5B1, and 5B2 are diagrams each illustrating a display device of one embodiment of the present invention;

FIGS. 7A to 7D, 7D'-1, 7D'-2, and 7E are diagrams each illustrating an electronic device;

BEST MODE FOR CARRYING OUT THE INVENTION

Figure 1A:
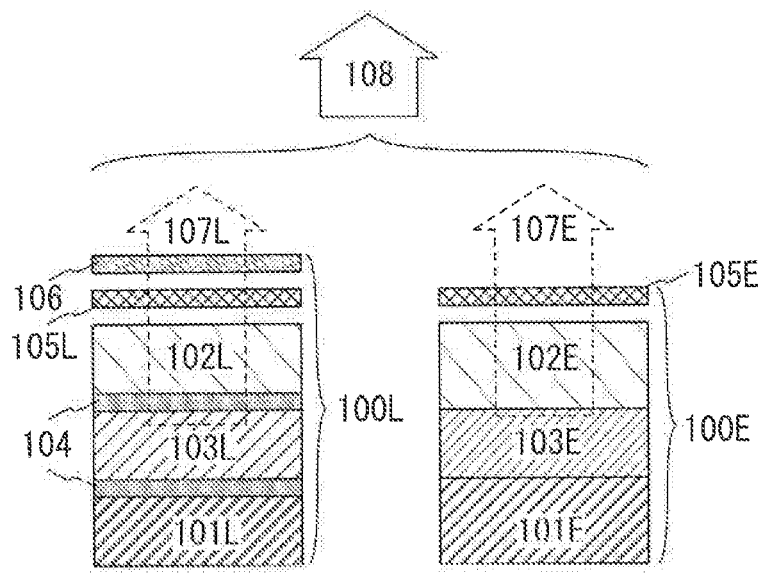
FIGS. 1A and 1B are diagrams illustrating a display device of one embodiment of the present invention.

Embodiments of the present invention will be described below with reference to the drawings. However, the present invention is not limited to the following description, and the mode and details can be variously changed unless departing from the scope and spirit of the present invention. Thus, the present invention should not be construed as being limited to the description in the following embodiments.

Note that the position, the size, the range, or the like of each structure illustrated in the drawings and the like are not accurately represented in some cases for easy understanding.

Therefore, the disclosed invention is not necessarily limited to the position, size, range, or the like as disclosed in the drawings and the like.

In describing the structures of the invention with reference to the drawings in this specification and the like, common reference numerals are used for the same portions in different drawings.

Embodiment 1

In this embodiment, a display device of one embodiment of the present invention will be described with reference to FIGS. 1A and 1B.

FIG. 1A illustrates a structure of a display device of one embodiment of the present invention, which includes a liquid crystal element 100L and a light-emitting element 100E.

The liquid crystal element 100L includes a liquid crystal layer 103L and alignment films 104 between a first electrode 101L and a second electrode 102L. The first electrode 101L is a reflective electrode which can reflect ambient light. The second electrode 102L is a transparent electrode that has a light-transmitting property and is capable of transmitting visible light.

A color filter (also referred to as a coloring layer) 105L and a polarizing layer 106 are provided on the side where light transmitted through the second electrode 102L exits to the outside. Accordingly, the light transmitted through the second electrode 102L is transmitted through the color filter 105L and the polarizing layer 106 to become light 107L.

The light-emitting element 100E includes an EL layer 103E between a first electrode 101E and a second electrode 102E. Note that at least one of electrodes included in the light-emitting element, the second electrode 102E, is a transparent electrode that has a light-transmitting property and is capable of transmitting visible light. The EL layer 103E can contain a light-emitting material from which a desirable light emission color can be obtained or can contain a plurality of light-emitting materials of different light emission colors in combination. A color filter (also referred to as a coloring layer) 105E is provided as needed on the side where light transmitted through the second electrode 102E is emitted outward.

The light emitted by the EL layer 103E is transmitted through the second electrode 102E and transmitted through the color filter 105E, if the color filter 105E is provided, to become light 107E.

The display device in this embodiment includes the liquid crystal element 100L and the light-emitting element 100E; thus, light obtained from the display device is light 108 including the light 107L exiting from the liquid crystal element 100L and the light 107E emitted by the light-emitting element 100E.

Note that light exiting from the liquid crystal element 100L (the light 107L) in the display device in this embodiment meets the National Television System Committee (NTSC) standard among quality indicators for full-color display. The NTSC standard is a color gamut standard for analog television and was established by the NTSC. The NTSC standard color gamut is shown in FIG. 1B. Specifically, the light 107L has a full-color display quality that meets chromaticity coordinates (x, y), in the CIE 1931 chromaticity coordinates (xy chromaticity coordinates), of red (R) at (0.670, 0.330); green (G), (0.210, 0.710); and blue (B), (0.140, 0.080). The CIE 1931 chromaticity coordinates are provided by the International Commission on Illumination (CIE). Note that an NTSC area ratio is obtained in the following manner: an area P of a triangle formed by connecting the CIE 1931 chromaticity coordinates of R, G, and B which fulfill the NTSC standard (the above xy chromaticity coordinates) and an area Q of a triangle formed by connecting the CIE chromaticity coordinates (x, y) of the liquid crystal elements (R, G, and B) of one embodiment of the present invention are calculated and then the area ratio (Q/P) is calculated. An NTSC coverage is a value which represents how much percentage of the NTSC standard color gamut (the inside of the above triangle) can be reproduced using a combination of the CIE chromaticity coordinates (x, y) of the liquid crystal elements (R, G, and B) of one embodiment of the present invention.

In this embodiment, a reflective liquid crystal element is preferably used as the liquid crystal element 100L included in the display device. In the liquid crystal element 100L, an NTSC area ratio or an NTSC coverage is preferably more than or equal to 20% and less than or equal to 60%. This is because a reflectance of more than or equal to 15% can be obtained in a panel including a reflective liquid crystal element when the NTSC area ratio or an NTSC coverage of the liquid crystal element 100L is more than or equal to 20% and less than or equal to 60%. The display device in this embodiment is a panel including a light-emitting element capable of meeting BT.2020 and a liquid crystal element. Therefore, when the liquid crystal element has an NTSC area ratio or an NTSC coverage of more than or equal to 20% and less than or equal to 60% and a panel including the liquid crystal element is so bright as to have a reflectance of more than or equal to 15%, the display device, as a whole, can display eye-friendly images with wide color gamut and high visibility. Note that to examine the relation of the reflectance to the NTSC area ratio or coverage in the panel including a reflective liquid crystal element, simulation results will be described in Examples.

When a reflective liquid crystal element is used as the liquid crystal element 100L included in the display device, eye-friendly images can be displayed because the viewers seeing images displayed by the liquid crystal element do not directly see the light source of the element (the light source is an indirect light source). Note that when the viewers can see the display without directly seeing the light source in the above manner, a transmissive liquid crystal element, a MEMS element, or the like can also be used.

As a driving mode for the liquid crystal element 100L, a vertical alignment (VA) mode, a twisted nematic (TN) mode, an in-plane-switching (IPS) mode, a fringe field switching (FFS) mode, an optically compensated birefringence (OCB) mode, a blue phase, or the like can be used. Note that as a specific example of the VA mode, a multi-domain vertical alignment (MVA) mode, a patterned vertical alignment (PVA) mode, an electrically controlled birefringence (ECB) mode, a continuous pinwheel alignment (CPA) mode, an advanced super view (ASV) mode, or the like can be given.

As the liquid crystal used for the liquid crystal element 100L, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal exhibits a cholesteric phase, a smectic phase, a cubic phase, a chiral nematic phase, an isotropic phase, or the like depending on conditions. In addition, either a positive liquid crystal or a negative liquid crystal may be used, and an appropriate liquid crystal material can be used depending on the mode or design to be used.

For materials used for the electrodes of the liquid crystal element 100L (the first electrode 101L and the second electrode 102L), any of the materials below can be used in an appropriate combination as long as the above functions (e.g., a light-transmitting property) can be fulfilled. For example, a metal, an alloy, an electrically conductive compound, a mixture of these, and the like can be appropriately used. Specifically, an In—Sn oxide (also referred to as ITO), an In—Si—Sn oxide (also referred to as ITSO), an In—Zn oxide, an In—W—Zn oxide, or the like can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), zirconium (Zr), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The color filter 105E and the color filter 105L are each a filter that transmits visible light in a specific wavelength range and blocks visible light in a specific wavelength range. Thus, when the color filters 105E and 105L transmitting only light in a desired wavelength range are provided appropriately, colors of light exiting from the liquid crystal element can be adjusted. Note that the color filters 105E and 105L can be formed by a staining method, a pigment dispersion method, a printing method, an evaporation method, and the like.

The polarizing layer 106 is a filter that lets light having limited vibration directions pass through the polarizing layer 106. The polarizing layer 106 may be provided on the inner side of the substrate placed outside the electrodes of the liquid crystal element 100L (the first electrode 101L and the second electrode 102L) (on the side close to the electrodes) or may be provided on the outer side of the substrate. Although not illustrated in FIG. 1A, a retardation layer may be provided.

In addition, light emitted by the light-emitting element 100E (the light 107E) in the display device of one embodiment of the present invention preferably has a chromaticity (x, y) that meets a standard established by Japan Broadcasting Corporation (NHK) and used for ultra high definition television (UHDTV, also referred to as Super Hi-Vision television) among quality indicators for full-color display. The standard is so-called BT.2020 standard. The BT.2020 standard color gamut is shown in FIG. 1B. Specifically, the BT.2020 standard meets a full-color display quality that meets chromaticity coordinates (x, y), in the CIE 1931 chromaticity coordinates (xy chromaticity coordinates), of red at (0.708, 0.292); green, (0.170, 0.797); and blue, (0.131, 0.046). The CIE 1931 chromaticity coordinates are established by the International Commission on Illumination (CIE).

For materials used for the electrodes of the light-emitting element 100E (the first electrode 101E and the second electrode 102E), the materials described above as the materials used for the electrodes of the liquid crystal element 100L (the first electrode 101L and the second electrode 102L) can be used in an appropriate combination as long as the above functions (e.g., transmittance) can be fulfilled.

Figure 2A:
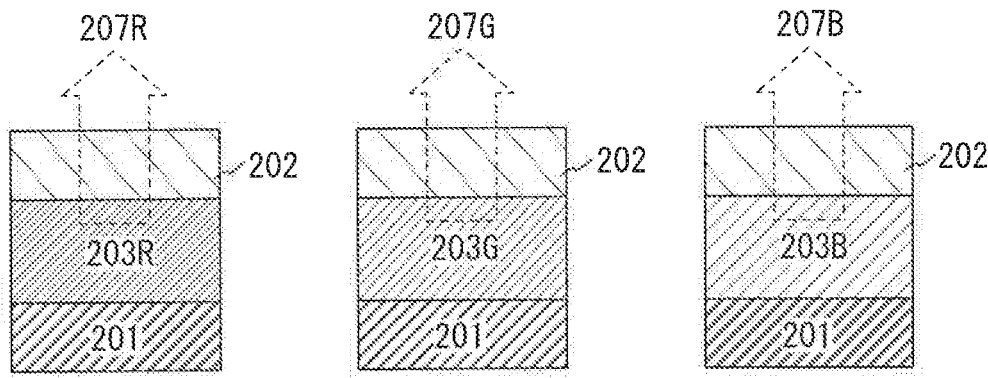
FIGS. 2A to 2C are diagrams each illustrating a display device of one embodiment of the present invention.

The light-emitting elements meeting the BT.2020 standard include a light-emitting element (red) 200R which emits red light, a light-emitting element (green) 200G which emits green light, and a light-emitting element (blue) 200B which emits blue light as illustrated in FIG. 2A. These light-emitting elements can include respective EL layers (203R, 203G, and 203B) which include different light-emitting materials. Note that stack structures and materials of the EL layers are preferably selected such that the chromaticity (x, y) of the light-emitting element (red) 200R is (0.708, 0.292), the chromaticity of the light-emitting element (green) 200G is (0.170, 0.797), and the chromaticity of the light-emitting element (blue) 200B is (0.131, 0.046).

Note that the light-emitting elements (200R, 200G, and 200B) in FIG. 2A each include a first electrode 201 and a second electrode 202. In the case of the light-emitting elements (200R, 200G, and 200B) in FIG. 2A, a transparent electrode which transmits visible light is used at least as the second electrode 202. In addition, red light 207R is emitted by the EL layer 203R in the light-emitting element (red) 200R, green light 207G is emitted by the EL layer 203G in the light-emitting element (green) 200G, and blue light 207B is emitted by the EL layer 203B in the light-emitting element (blue) 200B.

Figure 2B:
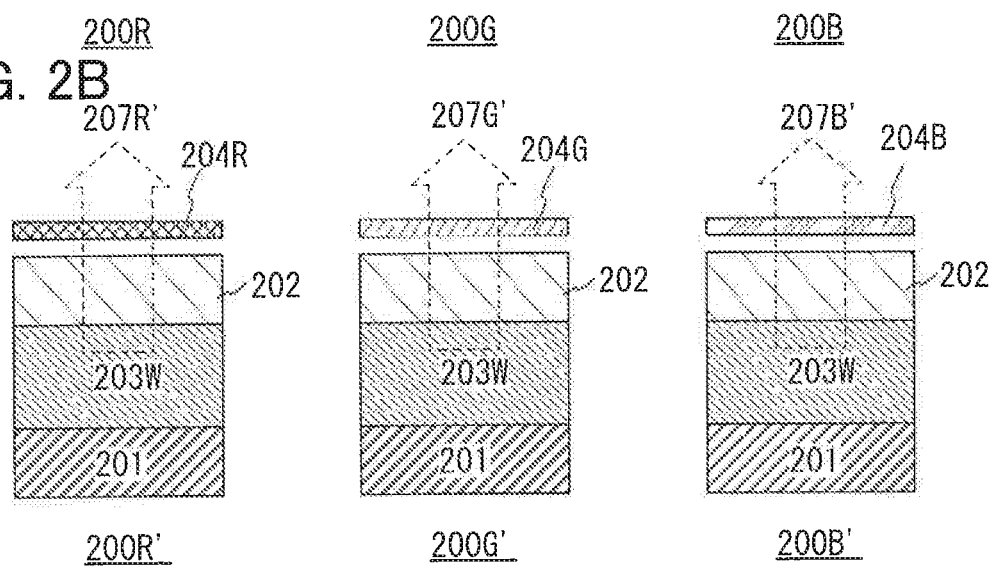

Light-emitting elements having the structures illustrated in FIG. 2B are also formed so as to meet the BT.2020 standard. Each of the light-emitting elements in FIG. 2B is identical to each of the light-emitting elements in FIG. 2A in the structure of the first electrode 201 and the second electrode 202, and is different in that a light-emitting element (red) 200R', a light-emitting element (green) 200G', and a light-emitting element (blue) 200B' includes a common EL layer 203W which emits white light. Note that red light 207R' is obtained from the light-emitting element (red) 200R' by passing through a color filter (red) 204R having a function of transmitting red light. In addition, green light 207G' is obtained from the light-emitting element (green) 200G' by passing through a color filter (green) 204G having a function of transmitting green light. Furthermore, blue light 207B' is obtained from the light-emitting element (blue) 200B' by passing through a color filter (blue) 204B having a function of transmitting blue light.

Figure 2C:
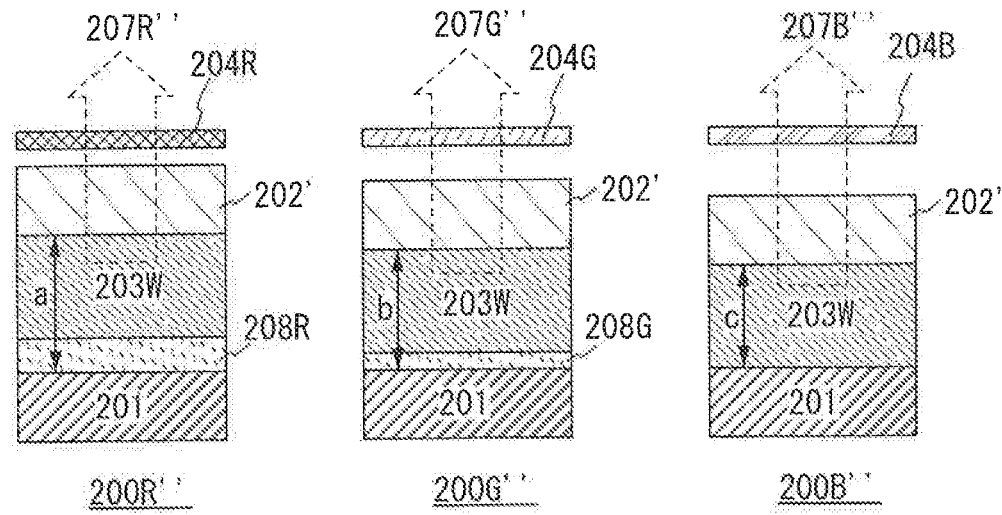

Light-emitting elements having the structures illustrated in FIG. 2C are also formed so as to meet the BT.2020 standard. The light-emitting elements having the structures illustrated in FIG. 2C are preferable for forming light-emitting elements meeting the BT.2020 standard because the light-emitting elements in FIG. 2C have a micro optical resonator (microcavity) structure having a function of strengthening light emission depending on colors of the light to be obtained from the light-emitting elements. Accordingly, in the light-emitting elements in FIG. 2C, the first electrode 201 is a reflective electrode and a second electrode 202' is a semi-transmissive and semi-reflective electrode. Note that even light-emitting elements including the separately formed EL layers as illustrated in FIG. 2A can be combined with a micro optical resonator (microcavity) structure.

In FIG. 2C, a light-emitting element (red) 200R" is a light-emitting element which emits red light; thus, it is preferable that a light-transmitting conductive film 208R be stacked over the first electrode 201 and an optical path length between the first electrode 201 and the second electrode 202' be adjusted so as to be an optical path length a, which is suitable for strengthening red light emission. In addition, a light-emitting element (green) 200G" is a light-emitting element which emits green light; thus, it is preferable that a light-transmitting conductive film 208G be stacked over the first electrode 201 and the optical path length between the first electrode 201 and the second electrode 202' be adjusted so as to be an optical path length b, which is suitable for strengthening green light emission. Furthermore, a light-emitting element (blue) 200B" is a light-emitting element which emits blue light; therefore, the EL layer 203W is formed such that the optical path length between the first electrode 201 and the second electrode 202' becomes an optical path length c, which is suitable for strengthening blue light emission. As needed, a light-transmitting conductive film can be stacked over the first electrode 201 to adjust the optical path length.

When white light is emitted from the EL layer 203W as illustrated in FIGS. 2B and 2C, it is desirable that red, green, and blue light emission, which compose white light emission, each have an independent light emission spectrum. The spectra desirably do not overlap with each other in order to prevent the decrease in the color purity. The spectra of specifically green light emission and red light emission have peak wavelengths close to each other and are likely to overlap with each other. In order to prevent such overlap of light emission spectra, a favorable light-emitting material is used for the EL layer included in the EL layer 203W and a specific stack structure is employed in the light-emitting element described in this embodiment. Thus, overlap of different light emission spectra can be prevented, so that light-emitting elements which show excellent color chromaticities for every color can be obtained.

Figure 1B:
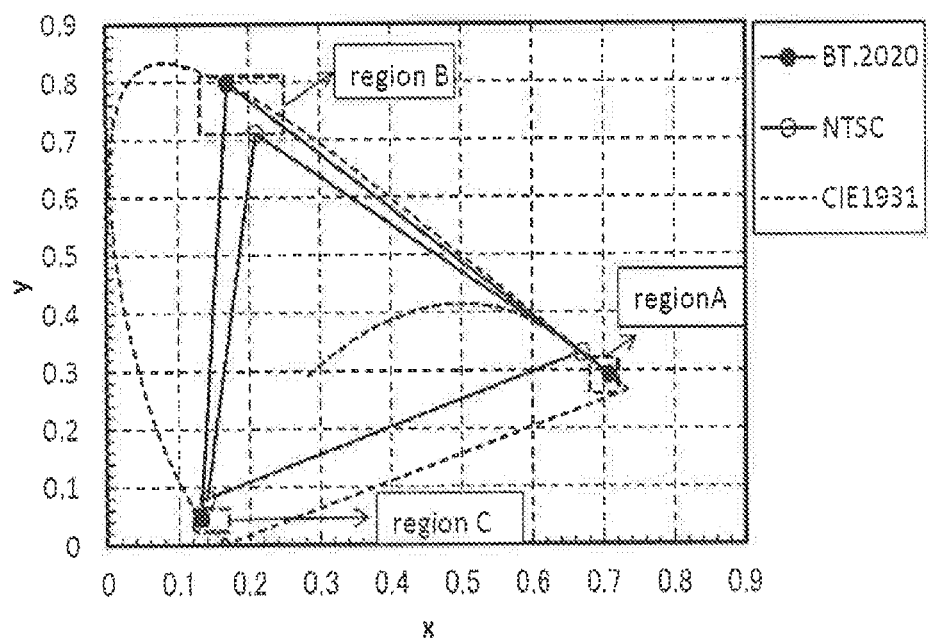

As the light-emitting element 100E included in the display device in this embodiment, light-emitting elements which cover chromaticity ranges (a region A, a region B, and a region C) represented in the chromaticity coordinates in FIG. 1B are preferably used. As specific chromaticity ranges for the light-emitting elements, the light-emitting element (red) (200R, 200R', or 200R") covers a chromaticity range represented by the region A, the light-emitting element (green) (200G, 200G', or 200G") covers a chromaticity range represented by the region B, and the light-emitting element (blue) (200B, 200B', or 200B") covers a chromaticity range represented by the region C. In the CIE 1931 chromaticity coordinates, the region A has x of more than 0.680 and less than or equal to 0.720 and y of more than or equal to 0.260 and less than or equal to 0.320, the region B has x of more than or equal to 0.130 and less than or equal to 0.250 and y of more than 0.710 and less than or equal to 0.810, and the region C has x of more than or equal to 0.120 and less than or equal to 0.170 and y of more than or equal to 0.020 and less than 0.060.

Note that the peak wavelength of the light emission spectrum of each of the light-emitting elements (red) (200R, 200R', and 200R") in FIGS. 2A to 2C is preferably more than or equal to 620 nm and less than or equal to 680 nm. In addition, the peak wavelength of the light emission spectrum of each of the light-emitting elements (green) (200G, 200G', and 200G") is preferably more than or equal to 500 nm and less than or equal to 530 nm. Furthermore, the peak wavelength of the light emission spectrum of each of the light-emitting elements (blue) (200B, 200B', and 200B") is preferably more than or equal to 430 nm and less than or equal to 460 nm. The half widths of the light emission spectra of the light-emitting element (red) (200R, 200R', or 200R"), the light-emitting element (green) (200G, 200G', or 200G"), and the light-emitting element (blue) (200B, 200B', or 200B") are preferably more than or equal to 5 nm and less than or equal to 45 nm, more than or equal to 5 nm and less than or equal to 35 nm, and more than or equal to 5 nm and less than or equal to 25 nm, respectively.

In one embodiment of the present invention, light emitted by the light-emitting element preferably meets the above chromaticity, and the area ratio thereof to the BT.2020 color gamut in the CIE chromaticity coordinates (x, y) is preferably more than or equal to 80% or the coverage of the BT.2020 color gamut is preferably more than or equal to 75%. Further preferably, the area ratio is more than or equal to 90% or the coverage is more than or equal to 85%.

Accordingly, in the display device in this embodiment, light exiting from the liquid crystal element through a color filter has an NTSC area ratio or an NTSC coverage of more than or equal to 20% and less than or equal to 60%, and light emitted by the light-emitting element has a BT.2020 area ratio of more than or equal to 80% and less than or equal to 100% or a BT.2020 coverage of more than or equal to 75% and less than or equal to 100%. Note that the light emitted by the light-emitting element further preferably has a BT.2020 area ratio of more than or equal to 90% and less than or equal to 100% or a BT.2020 coverage of more than or equal to 85% and less than or equal to 100%.

Note that in order to calculate the chromaticity, any of a luminance colorimeter, a spectroradiometer, and an emission spectrometer may be used, and it is sufficient that the above chromaticity be met by any one of the measuring methods. However, it is further preferable that the above chromaticity be met by all of the measuring methods.

Note that the structure described in this embodiment can be used in an appropriate combination with any of the structures described in the other embodiments.

Embodiment 2

In this embodiment, an example of a light-emitting element which can be applied to a display device of one embodiment of the present invention will be described.

<<Basic Structure of Light-Emitting Element>>

Figure 3A:
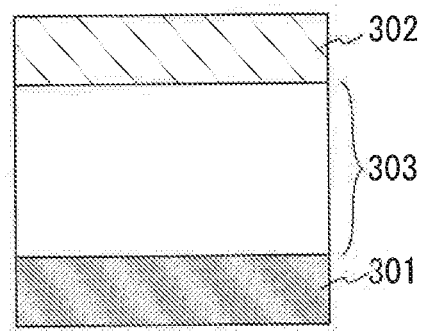
FIGS. 3A to 3D are diagrams each illustrating a display device of one embodiment of the present invention.

A basic structure of a light-emitting element will be described. FIG. 3A illustrates a light-emitting element in which an EL layer including a light-emitting layer is provided between a pair of electrodes. Specifically, an EL layer 303 is provided between a first electrode 301 and a second electrode 302.

Figure 3B:
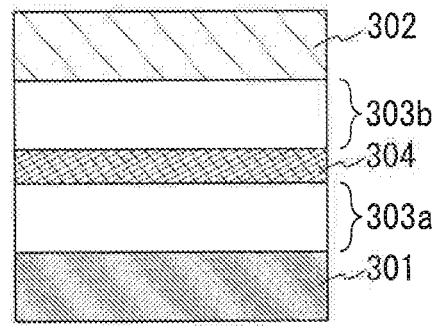

FIG. 3B illustrates a light-emitting element that has a stacked-layer structure (tandem structure) in which a plurality of EL layers (two EL layers 303a and 303b in FIG. 3B) are provided between a pair of electrodes and a charge generation layer 304 is provided between the EL layers. Such a tandem light-emitting element can be driven at low voltage.

The charge generation layer 304 has a function of injecting electrons into one of the EL layers (303a or 303b) and injecting holes into the other of the EL layers (303b or 303a) when a voltage is applied between the first electrode 301 and the second electrode 302. Thus, in FIG. 3B, when a voltage is applied between the first electrode 301 and the second electrode 302 such that the potential of the first electrode 301 is higher than that of the second electrode 302, the charge generation layer 304 injects electrons into the EL layer 303a and injects holes into the EL layer 303b.

Note that in terms of light extraction efficiency, the charge generation layer 304 preferably has a property of transmitting visible light (specifically, the charge generation layer 304 has a visible light transmittance of 40% or higher). Furthermore, the charge generation layer 304 functions even if it has lower conductivity than the first electrode 301 or the second electrode 302.

Figure 3C:
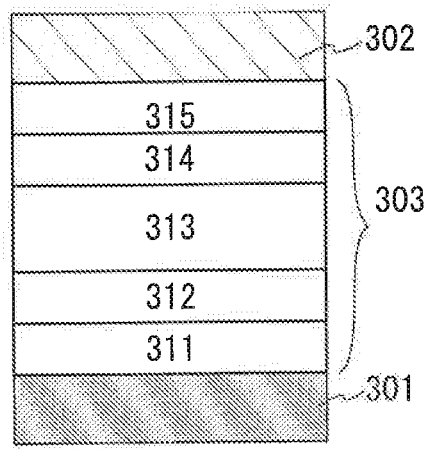

FIG. 3C illustrates the EL layer 303 of the light-emitting element having a stacked-layer structure. In this case, the first electrode 301 is regarded as functioning as an anode. The EL layer 303 has a structure in which a hole-injection layer 311, a hole-transport layer 312, a light-emitting layer 313, an electron-transport layer 314, and an electron-injection layer 315 are stacked in this order over the first electrode 301. Even in the case where a plurality of EL layers are provided as in the tandem structure illustrated in FIG. 3B, the layers in each EL layer are sequentially stacked from the anode side as described above. When the first electrode 301 is a cathode and the second electrode 302 is an anode, the stacking order of the layers is reversed.

The light-emitting layer 313 included in the EL layers (303, 303a, and 303b) contains an appropriate combination of a light-emitting material and a plurality of materials, so that fluorescence or phosphorescence of a desired light emission color can be obtained. The light-emitting layer 313 may include a stacked-layer structure having different light emission colors. In that case, the light-emitting material and other materials are different between the stacked light-emitting layers. Alternatively, the plurality of EL layers (303a and 303b) in FIG. 3B may exhibit the respective light emission colors. Also in that case, the light-emitting material and other materials are different between the light-emitting layers.

As one embodiment of the present invention, the light-emitting element in FIG. 3C has, for example, a micro optical resonator (microcavity) structure in which the first electrode 301 is a reflective electrode and the second electrode 302 is a semi-transmissive and semi-reflective electrode, whereby light emission from the light-emitting layer 313 in the EL layer 303 can be resonated between the electrodes. Thus, light emission obtained through the second electrode 302 can be intensified.

Note that when the first electrode 301 of the light-emitting element is a reflective electrode with a structure in which a reflective conductive material and a light-transmitting conductive material (a transparent conductive film) are stacked, optical adjustment can be performed by controlling the thickness of the transparent conductive film. Specifically, when the wavelength of light from the light-emitting layer 313 is X, the distance between the first electrode 301 and the second electrode 302 is preferably adjusted to around $m\lambda/2$ (m is a natural number).

To amplify desired light (wavelength: $\lambda$) obtained from the light-emitting layer 313, the optical path length from the first electrode 301 to a region in the light-emitting layer 313 emitting the desired light (light-emitting region) and the optical path length from the second electrode 302 to the region in the light-emitting layer 313 emitting the desired light (light-emitting region) are each preferably adjusted to around $(2m'+1)\lambda/4$ (m' is a natural number). Here, the light-emitting region means a region where holes and electrons are recombined in the light-emitting layer 313.

By such optical adjustment, the spectrum of specific monochromatic light from the light-emitting layer 313 can be narrowed and light emission with a high color purity can be obtained.

In that case, the optical path length between the first electrode 301 and the second electrode 302 is, to be exact, represented by the total thickness from a reflective region in the first electrode 301 to a reflective region in the second electrode 302. However, it is difficult to precisely determine the reflective region in the first electrode 301 or the second electrode 302; therefore, it is presumed that the above effect can be sufficiently obtained when appropriate positions in the first electrode 301 and the second electrode 302 are assumed to be the reflective regions. Furthermore, the optical path length between the first electrode 301 and the light-emitting layer emitting desired light is, to be exact, the optical path length between the reflective region in the first electrode 301 and the light-emitting region in the light-emitting layer emitting desired light. However, it is difficult to precisely determine the reflective region in the first electrode 301 or the light-emitting region in the light-emitting layer emitting desired light; therefore, it is presumed that the above effect can be sufficiently obtained when appropriate positions in the first electrode 301 are assumed to be the reflective regions and appropriate positions in the light-emitting layer emitting desired light are assumed to be the light-emitting regions.

The light-emitting element in FIG. 3C has a microcavity structure, so that light (monochromatic light rays) with different wavelengths can be extracted even if the same EL layer is employed. Thus, separate coloring aimed at plural light emission colors (e.g., R, G, and B) is not necessary. Therefore, higher-resolution display can be easily achieved. Note that a combination with color filters is also possible. Furthermore, light emission intensity with a specific wavelength in the front direction can be increased, whereby power consumption can be reduced.

In the above light-emitting element, at least one of the first electrode 301 and the second electrode 302 is a light-transmitting electrode (a transparent electrode, a semi-transmissive and semi-reflective electrode, or the like). In the case where the light-transmitting electrode is a transparent electrode, the transparent electrode has a visible light transmittance of more than or equal to 40%. In the case where the light-transmitting electrode is a semi-transmissive and semi-reflective electrode, the semi-transmissive and semi-reflective electrode has a visible light reflectance of more than or equal to 20% and less than or equal to 80%, preferably more than or equal to 40% and less than or equal to 70%. These electrodes preferably have a resistivity of $1\times10^{-2}$ Ωcm or less.

Furthermore, when one of the first electrode 301 and the second electrode 302 is a reflective electrode in the above light-emitting element, the visible light reflectance of the reflective electrode is more than or equal to 40% and less than or equal to 100%, preferably more than or equal to 70% and less than or equal to 100%. This electrode preferably has a resistivity of $1\times10^{-2}$ Ωcm or less.

<<Specific Structure and Forming Method of Light-Emitting Element>>

Next, a specific structure and a specific forming method of the light-emitting element will be described. Here, a light-emitting element having the tandem structure in FIG. 3B and microcavity structures is described with reference to FIG. 3D. In the light-emitting element in FIG. 3D, a reflective electrode is formed as the first electrode 301 and a semi-transmissive and semi-reflective electrode is formed as the second electrode 302. Therefore, a single-layer structure or a stacked-layer structure can be formed using one or more kinds of desired electrode materials. Note that the second electrode 302 is formed with the use of a material selected as described above after the EL layer 303b is formed. These electrodes can be formed by a sputtering method or a vacuum evaporation method.

<First Electrode and Second Electrode>

For materials used for the first electrode 301 and the second electrode 302, any of the materials below can be used in an appropriate combination as long as the functions of the electrodes described above can be fulfilled. For example, a metal, an alloy, an electrically conductive compound, a mixture of these, and the like can be appropriately used. Specifically, an In—Sn oxide (also referred to as ITO), an In—Si—Sn oxide (also referred to as ITSO), an In—Zn oxide, an In—W—Zn oxide, or the like can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

Figure 3D:
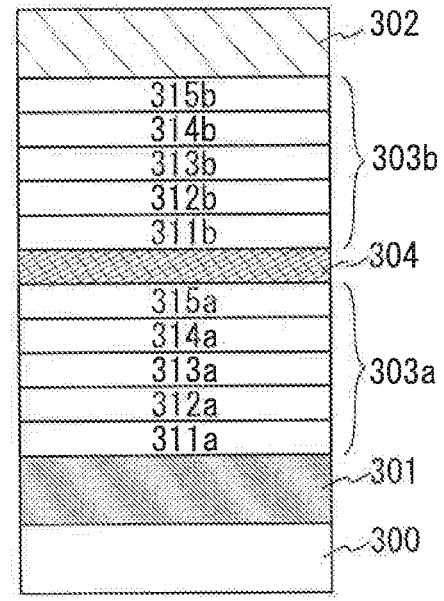

In the light-emitting element in FIG. 3D, when the first electrode 301 is an anode, a hole-injection layer 311a and a hole-transport layer 312a of the EL layer 303a are sequentially stacked over the first electrode 301 by a vacuum evaporation method. After the EL layer 303a and the charge generation layer 304 are formed, a hole-injection layer 311b and a hole-transport layer 312b of the EL layer 303b are sequentially stacked over the charge generation layer 304 in a similar manner.

<Hole-Injection Layer and Hole-Transport Layer>

The hole-injection layers (311a and 311b) inject holes from the first electrode 301 that is an anode to the EL layers (303a and 303b) and each contain a material with a high hole-injection property.

As examples of the material with a high hole-injection property, transition metal oxides such as molybdenum oxide, vanadium oxide, ruthenium oxide, tungsten oxide, and manganese oxide can be given. Alternatively, it is possible to use any of the following materials: phthalocyanine-based compounds such as phthalocyanine (abbreviation: H$_2$Pc) and copper phthalocyanine (abbreviation: CuPc); aromatic amine compounds such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD); high molecular compounds such as poly(3,4-ethylenedioxythiophene)/poly(styrenesulfonic acid) (abbreviation: PEDOT/PSS); and the like.

Alternatively, as the material with a high hole-injection property, a composite material containing a hole-transport material and an acceptor material (an electron-accepting material) can also be used. In that case, the acceptor material extracts electrons from a hole-transport material, so that holes are generated in the hole-injection layer 311, and the holes are injected into the light-emitting layers (313a and 313b) through the hole-transport layers (312a and 312b). Note that each of the hole-injection layers (311a and 311b) may be formed to have a single-layer structure using a composite material containing a hole-transport material and an acceptor material (an electron-accepting material), or a stacked-layer structure in which a layer including a hole-transport material and a layer including an acceptor material (an electron-accepting material) are stacked.

The hole-transport layers (312a and 312b) transport the holes, which are injected from the first electrode 301 by the hole-injection layers (311a and 311b), to the light-emitting layers (313a and 313b). Note that the hole-transport layers (312a and 312b) each contain a hole-transport material. It is particularly preferable that the HOMO level of the hole-transport material included in the hole-transport layers (312a and 312b) be the same as or close to that of the hole-injection layers (311a and 311b).

Examples of the acceptor material used for the hole-injection layers (311a and 311b) include an oxide of a metal belonging to any of Group 4 to Group 8 of the periodic table. Specifically, molybdenum oxide, vanadium oxide, niobium oxide, tantalum oxide, chromium oxide, tungsten oxide, manganese oxide, and rhenium oxide can be given. Among these, molybdenum oxide is especially preferable since it is stable in the air and its hygroscopic property is low and is easily treated. Alternatively, organic acceptors such as a quinodimethane derivative, a chloranil derivative, and a hexaazatriphenylene derivative can be used. Specifically, 7,7,8,8-tetracyano-2,3,5,6-tetrafluoroquinodimethane (abbreviation: F$_4$-TCNQ), chloranil, 2,3,6,7,10,11-hexacyano-1,4,5,8,9,12-hexaazatriphenylene (abbreviation: HAT-CN), or the like can be used.

The hole-transport materials used for the hole-injection layers (311a and 311b) and the hole-transport layers (312a and 312b) are preferably materials with a hole mobility of more than or equal to $10^{-6}$ cm$^2$/Vs. Note that other materials may be used as long as the materials have a hole-transport property higher than an electron-transport property.

Preferred hole-transport materials are π-electron rich heteroaromatic compounds (e.g., carbazole derivatives and indole derivatives) and aromatic amine compounds, examples of which include compounds having an aromatic amine skeleton, such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 3-[4-(9-phenanthryl)-phenyl]-9-phenyl-9H-carbazole (abbreviation: PCPPn), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); compounds having a carbazole skeleton, such as 1,3-bis(N-carbazolyl) benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA); compounds having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

A high molecular compound such as poly(N-vinylcarbazole) (abbreviation: PVK), poly(4-vinyltriphenylamine) (abbreviation: PVTPA), poly [N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can also be used.

Note that the hole-transport material is not limited to the above examples and one of or a combination of various known materials may be used as the hole-transport material for the hole-injection layers (311a and 311b) and the hole-transport layers (312a and 312b).

Next, in the light-emitting element in FIG. 3D, the light-emitting layer 313a is formed over the hole-transport layer 312a of the EL layer 303a by a vacuum evaporation method. After the EL layer 303a and the charge generation layer 304 are formed, the light-emitting layer 313b is formed over the hole-transport layer 312b of the EL layer 303b by a vacuum evaporation method.

<Light-Emitting Layer>

The light-emitting layers (313a and 313b) each contain a light-emitting material. Note that as the light-emitting material, a material whose light emission color is blue, violet, bluish violet, green, yellowish green, yellow, orange, red, or the like is appropriately used. When the plurality of light-emitting layers (313a and 313b) are formed using different light-emitting materials, different light emission colors can be exhibited (for example, complementary light emission colors are combined to achieve white light emission). Furthermore, a stacked-layer structure in which one light-emitting layer contains two or more kinds of light-emitting materials may be employed.

The light-emitting layers (313a and 313b) each may contain one or more kinds of organic compounds (a host material and an assist material) in addition to a light-emitting material (a guest material). As the one or more kinds of organic compounds, one or both of the hole-transport material and the electron-transport material described in this embodiment can be used.

In one embodiment of the present invention, it is preferable that a light-emitting material which emits blue light (a blue-light-emitting material) be used as a guest material in one of the light-emitting layers (313a and 313b) in the light-emitting element and a material which emits green light (a green-light-emitting material) and a material which emits red light (a red-light-emitting material) be used in the other light-emitting layer. This manner is effective in the case where the blue-light-emitting material (the blue-light-emitting layer) has a lower light emission efficiency or a shorter lifetime than the materials (layers) which emit other colors. Here, it is preferable that a light-emitting material that converts singlet excitation energy into emission of light in the visible light range be used as the blue-light-emitting material and light-emitting materials that convert triplet excitation energy into emission of light in the visible light range be used as the green- and red-light-emitting materials, whereby the spectrum balance between R, G, and B is improved.

There is no particular limitation on the light-emitting materials that can be used for the light-emitting layers (313a and 313b), and a light-emitting material that converts singlet excitation energy into emission of light in the visible light range or a light-emitting material that converts triplet excitation energy into emission of light in the visible light range can be used. Examples of the light-emitting material are given below.

As an example of the light-emitting material that converts singlet excitation energy into light emission, a material emitting fluorescence (a fluorescent material) can be given. Examples of the material emitting fluorescence include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high light emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (abbreviation: 1,6mMemFLPAPm), N,N'-diphenyl-N,N'-bis[4-(9-phenyl-9H-fluoren-9-yl)phenyl]pyrene-1,6-diamine (abbreviation: 1,6FLPAPm), N,N'-bis(dibenzofuran-2-yl)-N,N'-diphenylpyrene-1,6-diamine (abbreviation: 1,6FrAPm), N,N-bis(dibenzothiophen-2-yl)-N,N'-diphenylpyrene-1,6-diamine (abbreviation: 1,6ThAPm), N,N-(pyrene-1,6-diyl)bis[(N-phenylbenzo[b]naphtho[1,2-d]furan)-6-amine](abbreviation: 1,6BnfAPm), N,N-(pyrene-1,6-diyl)bis[(N-phenylbenzo[b]naphtho[1,2-d]furan)-8-amine] (abbreviation: 1,6BnfAPm-02), and N,N'-(pyrene-1,6-diyl)bis[(6,N-diphenylbenzo[b]naphtho[1,2-d]furan)-8-amine] (abbreviation: 1,6BnfAPm-03). In addition, the pyrene derivative is a group of compounds effective for meeting the chromaticity of blue (the chromaticity range represented by the region C) in one embodiment of the present invention.

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8,11-tetra(tert-butyl)perylene (abbreviation: TBP), N,N'-(2-tert-butylanthracene-9,10-diyldi-4,1-phenylene)bis[N,N', N'-triphenyl-1,4-phenylenediamine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N,N',N-triphenyl-1, 4-phenylenediamine (abbreviation: 2DPAPPA), or the like.

As examples of a light-emitting material that converts triplet excitation energy into light emission, a material emitting phosphorescence (a phosphorescent material) and a thermally activated delayed fluorescence (TADF) material that exhibits thermally activated delayed fluorescence can be given.

Examples of a phosphorescent material include an organometallic complex, a metal complex (a platinum complex), and a rare earth metal complex. These materials exhibit the respective light emission colors (light emission peaks) and thus, any of them is appropriately selected according to need.

As examples of a phosphorescent material which emits blue or green light and whose light emission spectrum has a peak wavelength of greater than or equal to 450 nm and less than or equal to 570 nm, the following materials can be given.

For example, organometallic complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such asfac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); organometallic complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), bis[2-(4',6'-difluorophenyl)pyridinato-N,C$^{2'}$]iridium(III) acetylacetonate (abbreviation: FIr(acac)); and the like can be given.

As examples of a phosphorescent material which emits green or yellow light and whose light emission spectrum has a peak wavelength of greater than or equal to 495 nm and less than or equal to 590 nm, the following materials can be given.

For example, organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(t-Buppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-N3]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); organometallic complexes such as bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}iridium(III) acetylacetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]) can be given.

Among the above, an organometallic complex having a pyridine skeleton (particularly, a phenylpyridine skeleton) or a pyrimidine skeleton is a group of compounds effective for meeting the chromaticity of green (the chromaticity range represented by the region B) in one embodiment of the present invention.

As examples of a phosphorescent material which emits yellow or red light and whose emission spectrum has a peak wavelength of greater than or equal to 570 nm and less than or equal to 750 nm, the following materials can be given.

For example, organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl)pyrimidinato](dipivaloylmethanato)iridium(III) (abbreviation: [Ir(d1npm)$_2$(dpm)]); organometallic complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)pyrazinyl-κN]phenyl-κC}(2,2,6,6-tetramethyl-3,5-heptanedionato-κ$^2$O,O')iridium(III) (abbreviation: [Ir(dmdppr-dmCP)$_2$(dpm)]), (acetylacetonato)bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), and (acetylacetonato)bis[2,3-bis(4-fluorophenyl)quinoxalinato]iridium(III) (abbreviation: [Ir(Fdpq)$_2$(acac)]); organometallic complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato]

(monophenanthroline)europium(III) (abbreviation: [Eu(TTA)$_3$(Phen)]) can be given.

Among the above, an organometallic complex having a pyrazine skeleton is a group of compounds effective for meeting the chromaticity of red (the chromaticity range represented by the region A) in one embodiment of the present invention. In particular, an organometallic complex containing a cyano group (e.g., [Ir(dmdppr-dmCP)$_2$(dpm)]) is preferable because it is stable.

Note that as the blue-light-emitting material, a material whose photoluminescence peak wavelength is greater than or equal to 430 nm and less than or equal to 470 nm, preferably greater than or equal to 430 nm and less than or equal to 460 nm may be used. As the green-light-emitting material, a material whose photoluminescence peak wavelength is greater than or equal to 500 nm and less than or equal to 540 nm, preferably greater than or equal to 500 nm and less than or equal to 530 nm may be used. As the red-light-emitting material, a material whose photoluminescence peak wavelength is greater than or equal to 610 nm and less than or equal to 680 nm, preferably greater than or equal to 620 nm and less than or equal to 680 nm may be used. Note that the photoluminescence may be measured with either a solution or a thin film.

With the parallel use of such compounds and microcavity effect, the above chromaticity can be more easily met. Here, a semi-transmissive and semi-reflective electrode (a metal thin film portion) that is needed for obtaining microcavity effect preferably has a thickness of more than or equal to 20 nm and less than or equal to 40 nm, further preferably more than 25 nm and less than or equal to 40 nm. However, the thickness of more than 40 nm possibly reduces the efficiency.

As the organic compounds (the host material and the assist material) used in the light-emitting layers (313a and 313b), one or more kinds of materials having a larger energy gap than the light-emitting material (the guest material) are used.

When the light-emitting material is a fluorescent material, it is preferable to use an organic compound that has a high energy level in a singlet excited state and has a low energy level in a triplet excited state. For example, an anthracene derivative or a tetracene derivative is preferably used. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 5,12-diphenyltetracene, and 5,12-bis(biphenyl-2-yl)tetracene.

In the case where the light-emitting material is a phosphorescent material, an organic compound having triplet excitation energy (energy difference between a ground state and a triplet excited state) which is higher than that of the light-emitting material is preferably selected. In that case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, and the like.

Specific examples include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), 2,9-bis(naphthalen-2-yl)-4,7-diphenyl-1,10-phenanthroline (abbreviation: NBphen), and 9-[4-(5-phenyl-1,3,4-oxadiazol-2-yl)phenyl]-9H-carbazole (abbreviation: COll); and aromatic amine compounds such as NPB, TPD, and BSPB.

In addition, condensed polycyclic aromatic compounds such as anthracene derivatives, phenanthrene derivatives, pyrene derivatives, chrysene derivatives, and dibenzo[g,p]chrysene derivatives can be used. Specifically, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 2PCAPA, 6,12-dimethoxy-5,11-diphenylchrysene, DBC1,9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), or the like can be used.

In the case where a plurality of organic compounds are used for the light-emitting layers (313a and 313b), it is preferable to use compounds that form an exciplex in combination with each other. In that case, although any of various organic compounds can be combined appropriately to be used, to form an exciplex efficiently, it is particularly preferable to combine a compound that easily accepts holes (a hole-transport material) and a compound that easily accepts electrons (an electron-transport material). As the hole-transport material and the electron-transport material, specifically, any of the materials described in this embodiment can be used.

Note that the TADF material is a material that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excitation level and the singlet excitation level is greater than or equal to 0 eV and less than or equal to 0.2 eV, preferably greater than or equal to 0 eV and less than or equal to 0.1 eV. Note that "delayed fluorescence" exhibited by the TADF material refers to light emission having the same spectrum as normal fluorescence and an extremely long lifetime. The lifetime is $10^{-6}$ seconds or longer, preferably $10^{-3}$ seconds or longer.

Examples of the TADF material are fullerene, a derivative thereof, an acridine derivative such as proflavine, eosin, and the like. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ), 2-{4-[3-(N-phenyl-9H-carbazol-3-yl)-9H-carbazol-9-yl]phenyl}-4,6-diphenyl-1,3,5-triazine (PCCzPTzn), 2-[4-(10H-phenoxazin-10-yl)phenyl]-4,6-diphenyl-1,3,5-triazine (PXZ-TRZ), 3-[4-(5-phenyl-5,10-dihydrophenazin-10-yl)phenyl]-4,5-diphenyl-1,2,4-triazole (PPZ-3TPT), 3-(9,9-dimethyl-9H-acridin-10-yl)-9H-xanthen-9-one (ACRXTN), bis[4-(9,9-dimethyl-9,10-dihydroacridine)phenyl]sulfone (DMAC-DPS), or 10-phenyl-10H,10'H-spiro[acridin-9,9'-anthracen]-10'-one (ACRSA) can be used. Note that a substance in which the π-electron rich heteroaromatic ring is directly bonded to the π-electron deficient heteroaromatic ring is particularly preferable because both the donor property of the π-electron rich heteroaromatic ring and the acceptor property of the π-electron deficient heteroaromatic ring are increased and the energy difference between the singlet excited state and the triplet excited state becomes small.

Note that a TADF material can also be used in combination with another organic compound.

Next, in the light-emitting element in FIG. 3D, the electron-transport layer 314a is formed over the light-emitting layer 313a of the EL layer 303a by a vacuum evaporation method. After the EL layer 303a and the charge generation layer 304 are formed, the electron-transport layer 314b is formed over the light-emitting layer 313b of the EL layer 303b by a vacuum evaporation method.

<Electron-Transport Layer>

The electron-transport layers (314a and 314b) transport the electrons, which are injected from the second electrode 302 by the electron-injection layers (315a and 315b), to the light-emitting layers (313a and 313b). Note that the electron-transport layers (314a and 314b) each contain an electron-transport material. It is preferable that the electron-transport materials included in the electron-transport layers (314a and 314b) be materials with an electron mobility of higher than or equal to $1 \times 10^{-6}$ cm$^2$/Vs. Note that other materials may also be used as long as the materials have an electron-transport property higher than a hole-transport property.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

Specifically, it is possible to use metal complexes such as Alq3, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, and bis[2-(2-hydroxyphenyl)benzothiazolato]zinc (abbreviation: Zn(BTZ)$_2$), heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4''-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), and 4,4'-bis(5-methylbenzoxazol-2-yl)stilbene (abbreviation: BzOs), and quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used.

Each of the electron-transport layers (314a and 314b) is not limited to a single layer, but may be a stack of two or more layers each containing any of the above materials.

Next, in the light-emitting element in FIG. 3D, the electron-injection layer 315a is formed over the electron-transport layer 314a of the EL layer 303a by a vacuum evaporation method. Subsequently, the EL layer 303a and the charge generation layer 304 are formed, the components up to the electron-transport layer 314b of the EL layer 303b are formed and then, the electron-injection layer 315b is formed thereover by a vacuum evaporation method.

<Electron-Injection Layer>

The electron-injection layers (315a and 315b) each contain a material having a high electron-injection property. The electron-injection layers (315a and 315b) can each be formed using an alkali metal, an alkaline earth metal, or a compound thereof, such as lithium fluoride (LiF), cesium fluoride (CsF), calcium fluoride (CaF$_2$), or lithium oxide (LiO$_x$). A rare earth metal compound like erbium fluoride (ErF$_3$) can also be used. Electride may also be used for the electron-injection layers (315a and 315b). Examples of the electride include a material in which electrons are added at high concentration to calcium oxide-aluminum oxide. Any of the materials for forming the electron-transport layers (314a and 314b), which are given above, can also be used.

A composite material in which an organic compound and an electron donor (donor) are mixed may also be used for the electron-injection layers (315a and 315b). Such a composite material is excellent in an electron-injection property and an electron-transport property because electrons are generated in the organic compound by the electron donor. The organic compound here is preferably a material excellent in transporting the generated electrons; specifically, for example, the electron-transport materials for forming the electron-transport layers (314a and 314b) (e.g., a metal complex or a heteroaromatic compound) can be used. As the electron donor, a material showing an electron-donating property with respect to the organic compound may be used. Preferable examples are an alkali metal, an alkaline earth metal, and a rare earth metal. Specifically, lithium, cesium, magnesium, calcium, erbium, ytterbium, and the like can be given. Furthermore, an alkali metal oxide and an alkaline earth metal oxide are preferable, and a lithium oxide, a calcium oxide, a barium oxide, and the like can be given. Alternatively, Lewis base such as magnesium oxide can be used. Further alternatively, an organic compound such as tetrathiafulvalene (abbreviation: TTF) can be used.

In the case where light obtained from the light-emitting layer 313b is amplified, for example, the optical path length between the second electrode 302 and the light-emitting layer 313b is preferably less than one fourth of the wavelength X of light emitted by the light-emitting layer 313b. In that case, the optical path length can be adjusted by changing the thickness of the electron-transport layer 314b or the electron-injection layer 315b.

<Charge Generation Layer>

The charge generation layer 304 has a function of injecting electrons into the EL layer 303a and injecting holes into the EL layer 303b when a voltage is applied between the first electrode (anode) 301 and the second electrode (cathode) 302. The charge generation layer 304 may have either a structure in which an electron acceptor (acceptor) is added to a hole-transport material or a structure in which an electron donor (donor) is added to an electron-transport material. Alternatively, both of these structures may be stacked. Note that by formation of the charge generation layer 304 with the use of any of the above materials, it is possible to suppress the increase in drive voltage caused when the EL layers are stacked.

In the case where the charge generation layer 304 has a structure in which an electron acceptor is added to a hole-transport material, any of the materials described in this embodiment can be used as the hole-transport material. As the electron acceptor, it is possible to use 7,7,8,8-tetracyano-2,3,5,6-tetrafluoroquinodimethane (abbreviation: $F_4$-TCNQ), chloranil, and the like. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, rhenium oxide, or the like is used.

In the case where the charge generation layer 304 has a structure in which an electron donor is added to an electron-transport material, any of the materials described in this embodiment can be used as the electron-transport material. As the electron donor, it is possible to use an alkali metal, an alkaline earth metal, a rare earth metal, metals that belong to Groups 2 and 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the electron donor.

<Substrate>

The light-emitting element described in this embodiment can be formed over a variety of substrates. Note that the type of the substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of a flexible substrate, an attachment film, and a base material film include plastics typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper.

For formation of the light-emitting element in this embodiment, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers (311a and 311b), the hole-transport layers (312a and 312b), the light-emitting layers (313a and 313b), the electron-transport layers (314a and 314b), the electron-injection layers (315a and 315b)) included in the EL layers and the charge generation layer 304 of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

Note that materials that can be used for the functional layers (the hole-injection layers (311a and 311b), the hole-transport layers (312a and 312b), the light-emitting layers (313a and 313b), the electron-transport layers (314a and 314b), and the electron-injection layers (315a and 315b)) that are included in the EL layers (303a and 303b) and the charge generation layer 304 in the light-emitting element described in this embodiment are not limited to the above materials, and other materials can be used in combination as long as the functions of the layers are fulfilled. For example, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot may be a colloidal quantum dot, an alloyed quantum dot, a core-shell quantum dot, a core quantum dot, or the like.

The structure described in this embodiment can be used in an appropriate combination with any of the structures described in the other embodiments.

Embodiment 3

In this embodiment, a display device of one embodiment of the present invention which has a first element layer including a liquid crystal element and a second element layer including a light-emitting element and in which the display elements can perform the respective kinds of display is described. Note that such a display device can also be referred to as an emission and reflection hybrid display or an emission/reflection hybrid display (ER-hybrid display) or the like.

The display device in this embodiment, which can perform both display using the liquid crystal element and display using the light-emitting element, can be driven with extremely low power consumption in the outdoors and other bright places where ambient light is intense when a reflective liquid crystal element is used as the liquid crystal element because the display can be performed with the reflective liquid crystal element utilizing the ambient light. In the case where the ambient light is too intense resulting in surface reflection, images can be displayed with the use of both the liquid crystal element and the light-emitting element at the same time. On the other hand, the display device can perform image display with a wide viewing angle and a high color reproducibility and can be driven with low power consumption in the nighttime or in the indoors and other dark places where ambient light is weak when the light-emitting element, which does not need a light source, is used. Alternatively, a structure can be employed in which a transmissive (or a semi-transmissive and semi-reflective electrode) liquid crystal element is used as the liquid crystal element and the light-emitting element is used as both the light source of the liquid crystal element and a display element. Thus, a combination of the liquid crystal element and the light-emitting element can display images with high color reproducibility at low power consumption as compared to conventional display panels.

Figure 4A:
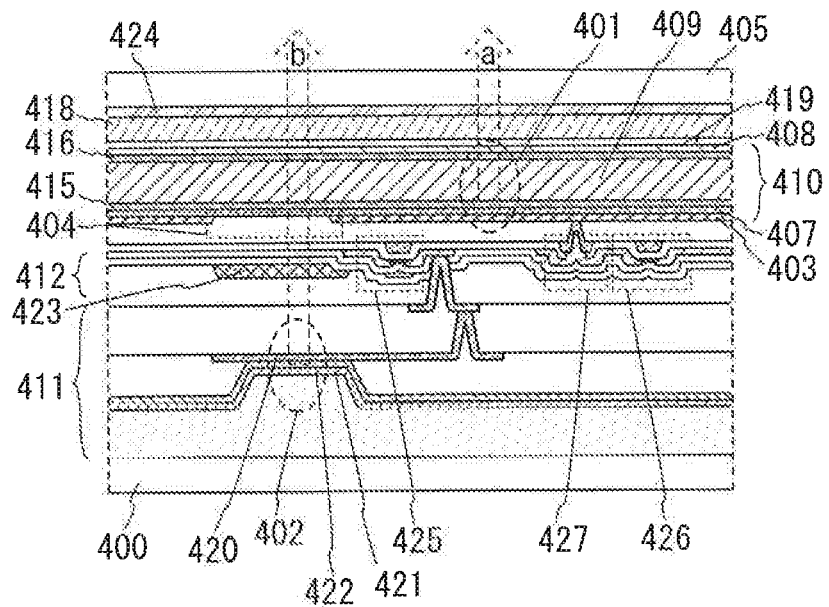
FIGS. 4A to 4E are diagrams each illustrating a display device of one embodiment of the present invention.
Figure 4B:
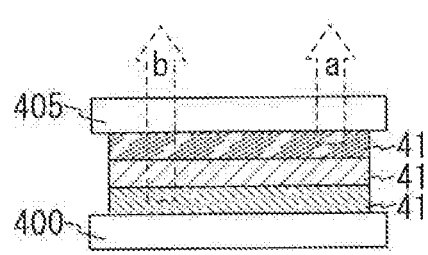
Figure 4C:
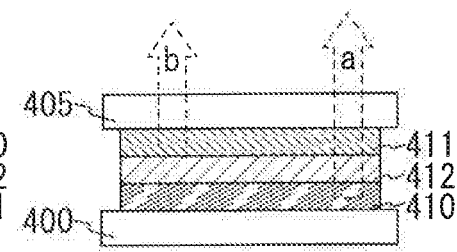
Figure 4D:
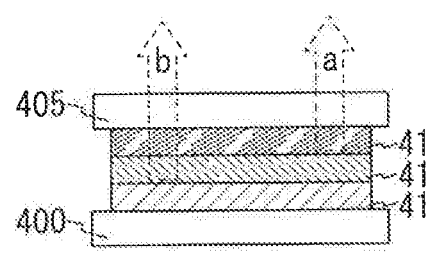
Figure 4E:
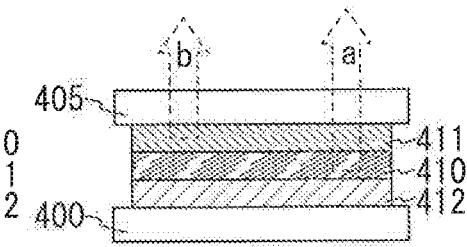

The display device in FIG. 4A has a structure in which a first element layer (display element layer) 410 including a reflective liquid crystal element 401, a second element layer (display element layer) 411 including a light-emitting element 402, a third element layer (driving element layer) 412 including transistors (425 and 426) which drive these elements (the liquid crystal element 401 and the light-emitting element 402) are stacked. In FIG. 4A, the third element layer (driving element layer) 412 is positioned between the first element layer (display element layer) 410 and the second element layer (display element layer) 411. However, the present invention is not limited thereto. When the structure in FIG. 4A is simplified and illustrated like the structure in FIG. 4B, the display device can have the stacked layer structures in FIGS. 4C to 4E as the other variations.

In each of the display devices in FIGS. 4A to 4E, the liquid crystal element 401 included in the first element layer (display element layer) 410 and the light-emitting element 402 included in the second element layer (display element layer) 411 can be driven in the following modes: display is performed with the liquid crystal element 401 by reflection of visible light on the conductive layer 403 serving as a first electrode (reflective electrode) in a first mode; and display is performed by emission of light from the light-emitting element 402 through an opening 404 in the conductive layer 403 in a second mode, for example.

Note that the first element layer 410 including the liquid crystal element 401, the second element layer 411 including the light-emitting element 402, and the third element layer 412 including the transistors (driving elements) (425 and 426) can be stacked by a technique in which the layers are formed separately, peeled, and bonded to each other. Note that in the case where the stacked-layer structure is formed by bonding in the above manner, the element layers are stacked with insulating layers provided therebetween. The elements (the liquid crystal element 401, the light-emitting element 402, the transistors (425 and 426), and the like) formed in the element layers can be electrically connected via conductive films (wirings) formed in the insulating layers that insulate the elements from one another.

The liquid crystal element 401 included in the first element layer 410 is a reflective liquid crystal element. The conductive layer 403 serves as a reflective electrode, and is thus formed using a material with high reflectivity. Note that the conductive layer 403 includes the opening 404. Furthermore, a conductive layer 407 serves as a transparent electrode, and is thus formed using a material that transmits visible light. The conductive layer 403 and the conductive layer 407 are in contact with each other and function as one electrode of the liquid crystal element 401. A conductive layer 408 functions as the other electrode of the liquid crystal element 401. Alignment films 415 and 416 are provided on the conductive layers 407 and 408, respectively and in contact with the liquid crystal layer 409. An insulating layer 419 formed in contact with a color filter 418 serves as an overcoat. Note that the alignment films 415 and 416 are not necessarily provided when not needed.

In addition, it is preferable that a spacer which has a function of preventing the electrodes of the liquid crystal element 401 from being too close to each other (a function of keeping a cell gap) be provided, though not illustrated here.

The light-emitting element 402 included in the second element layer 411 has a stacked-layer structure in which an EL layer 422 is provided between a conductive layer 420 serving as one electrode and a conductive layer 421 serving as the other electrode. Note that the conductive layer 421 includes a material transmitting visible light and the conductive layer 420 includes a material reflecting visible light. Thus, light emitted from the light-emitting element 402 which is transmitted through the conductive layer 420 is emitted to the outside of the substrate 405 such that the light is transmitted through a color filter 423, transmitted through the liquid crystal element 401 via the opening 404, and then transmitted through a polarizing layer 424.

One of a source and a drain of the transistor 426, which is one of the transistors (425 and 426) included in the third element layer 412, is electrically connected to the conductive layer 403 and the conductive layer 407 of the liquid crystal element 401 through a terminal portion 427. Note that the transistor 426 corresponds to a transistor SW1 in FIG. 6 that will be described later. One of a source and a drain of the transistor 425 is electrically connected to the conductive layer 420 in the light-emitting element 402. For example, the transistor 425 corresponds to a transistor M in FIG. 6.

Note that the transistors (425 and 426) are electrically connected to the outside via an FPC or the like, though not illustrated here.

Figure 5A:
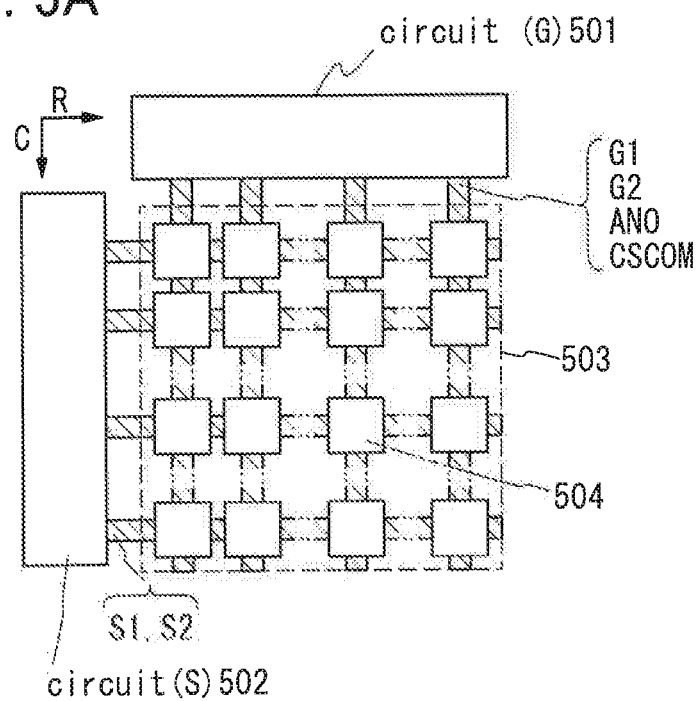
Figure 5A:
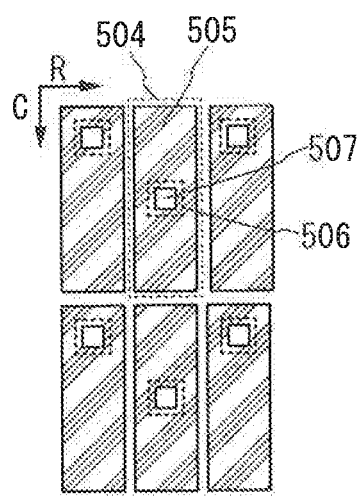
Figure 5A:
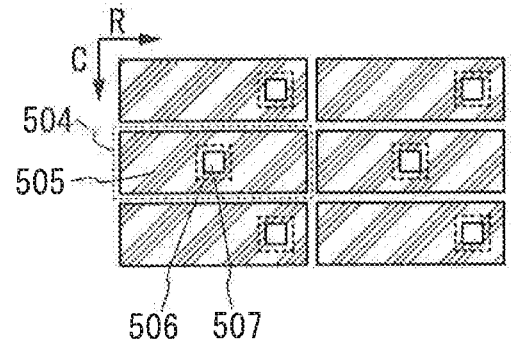

FIG. 5A is a block diagram illustrating a display device. A display device includes a circuit (G) 501, a circuit (S) 502, and a display portion 503. In the display portion 503, a plurality of pixels 504 are arranged in an R direction and a C direction in a matrix. A plurality of wirings G1, wirings G2, wirings ANO, and wirings CSCOM are electrically connected to the circuit (G) 501. These wirings are also electrically connected to the plurality of pixels 504 arranged in the R direction. A plurality of wirings S1 and wirings S2 are electrically connected to the circuit (S) 502, and these wirings are also electrically connected to the plurality of pixels 504 arranged in the C direction.

Each of the plurality of pixels 504 includes a liquid crystal element and a light-emitting element. The liquid crystal element and the light-emitting element include portions overlapping with each other.

FIG. 5B1 shows the shape of a conductive film 505 serving as a reflective electrode of the liquid crystal element included in the pixel 504. Note that an opening 507 is provided in a position 506 which is part of the conductive film 505 and which overlaps with the light-emitting element. That is, light emitted from the light-emitting element is emitted through the opening 507.

The pixels 504 in FIG. 5B1 are arranged such that the pixels 504 adjacent in the R direction exhibit different colors. Furthermore, the openings 507 are provided so as not to be arranged in a line in the R direction. Such arrangement has an effect of suppressing crosstalk between the light-emitting elements of adjacent pixels 504. Furthermore, there is an advantage that element formation is facilitated.

The opening 507 can have a polygonal shape, a quadrangular shape, an elliptical shape, a circular shape, a cross shape, a stripe shape, or a slit-like shape, for example.

FIG. 5B2 illustrates another example of the arrangement of the conductive films 505.

The ratio of the opening 507 to the total area of the conductive film 505 (excluding the opening 507) affects the display of the display device. That is, a problem is caused in that as the area of the opening 507 is larger, the display using the liquid crystal element becomes darker; in contrast, as the area of the opening 507 is smaller, the display using the light-emitting element becomes darker. Furthermore, in addition to the problem of the ratio of the opening, a small area of the opening 507 itself also causes a problem in that extraction efficiency of light emitted from the light-emitting element is decreased. The ratio of the opening 507 to the total area of the conductive film 505 (excluding the opening 507) is preferably 5% or more and 60% or less because the visibility can be maintained even when the liquid crystal element and the light-emitting element are used in a combination.

Figure 6:
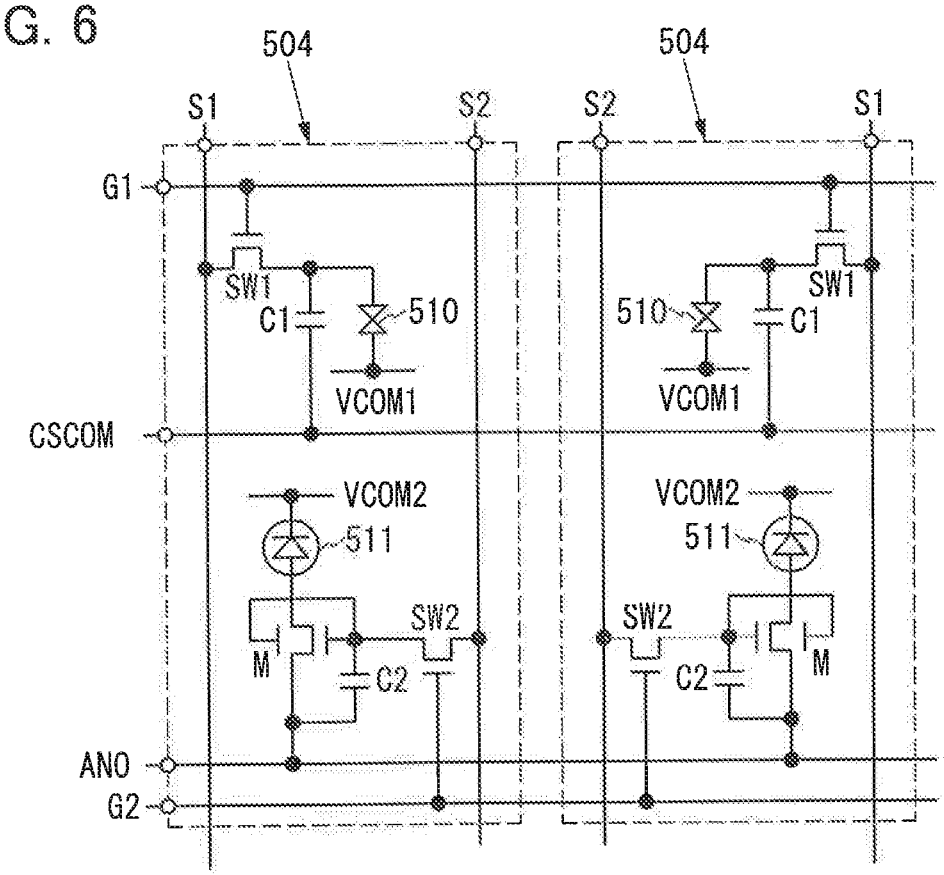
FIG. 6 is a diagram illustrating a display device of one embodiment of the present invention.

Next, an example of a circuit configuration of the pixel 504 is described with reference to FIG. 6. FIG. 6 illustrates two adjacent pixels 504.

The pixel 504 includes the transistor SW1, a capacitor C1, a liquid crystal element 510, a transistor SW2, the transistor M, a capacitor C2, a light-emitting element 511, and the like. Note that these components are electrically connected to any of the wiring G1, the wiring G2, the wiring ANO, the wiring CSCOM, the wiring S1, and the wiring S2 in the pixel 504. The liquid crystal element 510 and the light-emitting element 511 are electrically connected to a wiring VCOM1 and a wiring VCOM2, respectively.

A gate of the transistor SW1 is connected to the wiring G1. One of a source and a drain of the transistor SW1 is connected to the wiring S1, and the other of the source and the drain is connected to one electrode of the capacitor C1 and one electrode of the liquid crystal element 510. The other electrode of the capacitor C1 is electrically connected to the wiring CSCOM. The other electrode of the liquid crystal element 510 is connected to the wiring VCOM1.

A gate of the transistor SW2 is connected to the wiring G2. One of a source and a drain of the transistor SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 511. Furthermore, the other electrode of the light-emitting element 511 is connected to the wiring VCOM2.

Note that the transistor M includes two gates between which a semiconductor is provided and which are electrically connected to each other. With such a structure, the amount of current flowing through the transistor M can be increased.

The on/off state of the transistor SW1 is controlled by a signal from the wiring G1. A predetermined potential is applied from the wiring VCOM1. Furthermore, orientation of liquid crystals of the liquid crystal element 510 can be controlled by a signal from the wiring S1. A predetermined potential is applied from the wiring CSCOM.

The on/off state of the transistor SW2 is controlled by a signal from the wiring G2. By the difference between the potentials applied from the wiring VCOM2 and the wiring ANO, the light-emitting element 511 can emit light. Furthermore, the conduction state of the transistor M is controlled by a signal from the wiring S2.

In the above structure, in the case of the first mode, for example, the liquid crystal element 510 is controlled by the signals applied from the wiring G1 and the wiring S1 and optical modulation is utilized, whereby display can be performed. In the case of the second mode, the light-emitting element 511 emits light when the signals are applied from the wiring G2 and the wiring S2, whereby display can be performed. In the case where both modes are performed at the same time, desired display can be performed by the liquid crystal element 510 and the light-emitting element 511 on the basis of the signals from the wiring G1, the wiring G2, the wiring S1, and the wiring S2.

Note that the structure described in this embodiment can be used in an appropriate combination with any of the structures described in the other embodiments.

Embodiment 4

In this embodiment, an example of the transistor formed in the driving element layer included in the element layer of the display device of one embodiment of the present invention is described. As the transistor, for example, a planar transistor, a staggered transistor, an inverted staggered transistor, or the like can be used. A top-gate or bottom-gate transistor structure can be employed. Gate electrodes may be provided above and below a channel. Thus, there are no particular limitations on the structure of any of the transistors.

As a semiconductor material used for the semiconductor layer of the transistor, an element of Group 14 (e.g., silicon or germanium), a compound semiconductor, or an oxide semiconductor can be used, for example. A semiconductor containing silicon, a semiconductor containing gallium arsenide, an oxide semiconductor containing indium, or the like can be typically used.

There is no particular limitation on the crystallinity of a semiconductor material used for the semiconductor layer of the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

Among the above semiconductor materials used for the semiconductor layer of the transistor, it is particularly preferable to use a metal oxide.

In this specification and the like, a metal oxide means an oxide of metal in a broad sense. Metal oxides are classified into oxide insulators, oxide conductors (including transparent oxide conductors), oxide semiconductors (also simply referred to as OS), and the like. For example, a metal oxide used in an active layer of a transistor is called an oxide semiconductor in some cases. In other words, an OS FET can mean a transistor including a metal oxide or an oxide semiconductor.

In this specification and the like, a metal oxide including nitrogen is also called a metal oxide in some cases. Moreover, a metal oxide including nitrogen may be called a metal oxynitride.

Next, an oxide semiconductor which is a metal oxide will be described.

An oxide semiconductor is a semiconductor material having a wider band gap and a lower carrier density than silicon and thus can reduce the off-state current of a transistor. It is particularly preferable to use an oxide semiconductor having an energy gap of 2 eV or more, further preferably 2.5 eV or more, and still further preferably 3 eV or more.

When a transistor has a reduced off-state current, charge accumulated in a capacitor that is connected in series to the transistor can be held for a long time. Accordingly, when such a transistor is used for a pixel, operation of a driver circuit can be stopped while a gray scale of an image displayed in each display region is maintained. As a result, a display device with extremely low power consumption can be obtained.

In this specification and the like, "c-axis aligned crystal (CAAC)" or "cloud-aligned composite (CAC)" may be stated. CAAC refers to an example of a crystal structure, and CAC refers to an example of a function or a material composition.

In this specification and the like, CAC-OS or CAC-metal oxide has a function of a conductor in a part of the material and has a function of a dielectric (or insulator) in another part of the material; as a whole, CAC-OS or CAC-metal oxide has a function of a semiconductor. In the case where CAC-OS or CAC-metal oxide is used in an active layer of a transistor, the conductor has a function of letting electrons (or holes) serving as carriers flow, and the dielectric has a function of not letting electrons serving as carriers flow. By the complementary action of the function as a conductor and the function as a dielectric, CAC-OS or CAC-metal oxide can have a switching function (on/off function). In the CAC-OS or CAC-metal oxide, separation of the functions can maximize each function.

In this specification and the like, CAC-OS or CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. The conductor regions are observed to be coupled in a cloud-like manner with their boundaries blurred, in some cases.

In other words, CAC-OS or CAC-metal oxide can be called a matrix composite or a metal matrix composite.

Furthermore, in the CAC-OS or CAC-metal oxide, the conductor regions and the dielectric regions each have a size of more than or equal to 0.5 nm and less than or equal to 10 nm, preferably more than or equal to 0.5 nm and less than or equal to 3 nm and are dispersed in the material, in some cases.

Next, the above-mentioned CAC-OS will be described in detail.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, an element M (one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is intentionally not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θscan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, energy dispersive X-ray spectroscopy (EDX) is used to obtain EDX mapping, and according to the EDX mapping, the CAC-OS of the In—Ga—Zn oxide has a composition in which the regions including $GaO_{X3}$ as a main component and the regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor layer of a transistor, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

When a CAC-OS is used for a semiconductor layer of a transistor, the transistor can have increased reliability.

It is preferable that the atomic ratio of metal elements of a sputtering target used for depositing the In-M-Zn-based oxide satisfy In≥M and Zn≥M. As the atomic ratio of metal elements of such a sputtering target, In:M:Zn=1:1:1, In:M:Zn=1:1:1.2, In:M:Zn=3:1:2, In:M:Zn=4:2:4.1 and the like are preferable. Note that the atomic ratio of metal elements in the formed film varies from the atomic ratio of those in the above-described sputtering target, within a range of ±40%.

The formed film preferably has a low carrier density. An oxide semiconductor with a low carrier density has a low impurity concentration and a low density of defect states and can be regarded as an oxide semiconductor with stable characteristics. For example, for an oxide semiconductor film with a low carrier density, it is desirable to use an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$.

Note that without limitation to the compositions and materials described above, a material with an appropriate composition can be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

Alkali metal and alkaline earth metal might generate carriers when bonded to an oxide semiconductor, in which case the off-state current of the transistor might be increased. Therefore, the concentration of alkali metal or alkaline earth metal of the semiconductor layer, which is measured by secondary ion mass spectrometry, is lower than or equal to $1\times10^{18}$ atoms/$cm^3$, preferably lower than or equal to $2\times10^{16}$ atoms/$cm^3$.

When an oxide semiconductor is used, the crystal structure thereof may be a non-single-crystal structure. Examples of the non-single-crystal structure include the above-described CAAC-OS, a polycrystalline structure, a microcrystalline structure, and an amorphous structure. Among the non-single-crystal structures, the amorphous structure has the highest density of defect states, whereas a CAAC-OS has the lowest density of defect states. The amorphous structure has disordered atomic arrangement or an absolutely amorphous structure and no crystal portion.

Note that the semiconductor layer may be a mixed film including two or more of the following: a region having an amorphous structure, a region having a microcrystalline structure, a region having a polycrystalline structure, a region of CAAC-OS, and a region having a single-crystal structure. The mixed film has, for example, a single-layer structure or a stacked-layer structure including two or more of the above regions in some cases.

When a transistor in the driving element layer included in the element layer of the display device of one embodiment of the present invention is the transistor described in this embodiment, the display device can have high reliability.

Note that the structure described in this embodiment can be used in an appropriate combination with any of the structures described in the other embodiments.

Embodiment 5

In this embodiment, examples of a variety of electronic devices and an automobile manufactured using a display device of one embodiment of the present invention are described.

Examples of the electronic device including the display device are television devices (also referred to as TV or television receivers), monitors for computers and the like, digital cameras, digital video cameras, digital photo frames, mobile phones (also referred to as cellular phones or portable telephone devices), portable game consoles, goggle-type displays (e.g., VR goggles), mobile information terminals, audio playback devices, large game machines such as pachinko machines, and the like. Specific examples of these electronic devices are illustrated in FIGS. 7A, 7B, 7C, 7D, 7D'-1, 7D'-2, and 7E, and FIGS. 8A to 8C.

FIG. 7A illustrates an example of a television device. In a television device 7100, a display portion 7103 is incorporated in a housing 7101. The display portion 7103 can display images and may be a touch panel (an input/output device) including a touch sensor (an input device). Note that the display device of one embodiment of the present invention can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be changed and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasts can be received. Moreover, when the television device is connected to a communication network with or without wires via the modem, one-way (from a sender to a receiver) or two-way (between a sender and a receiver or between receivers) information communication can be performed.

FIG. 7B illustrates a computer, which includes a main body 7201, a housing 7202, a display portion 7203, a keyboard 7204, an external connection port 7205, a pointing device 7206, and the like. Note that this computer can be manufactured using the display device of one embodiment of the present invention for the display portion 7203. The display portion 7203 may be a touch panel (an input/output device) including a touch sensor (an input device). Note that the computer can be especially suitable for outdoor use by including the display device of one embodiment of the present invention because a reduction in visibility due to reflection of ambient light can be prevented in the display device.

FIG. 7C illustrates a smart watch, which includes a housing 7302, a display portion 7304, operation buttons 7311 and 7312, a connection terminal 7313, a band 7321, a clasp 7322, and the like.

The display portion 7304 mounted in the housing 7302 serving as a bezel includes a non-rectangular display region. The display portion 7304 can display an icon 7305 indicating time, another icon 7306, and the like. The display portion 7304 may be a touch panel (an input/output device) including a touch sensor (an input device). Note that the smart watch can be especially suitable for outdoor use by including the display device of one embodiment of the present invention because a reduction in visibility due to reflection of ambient light can be prevented in the display device.

The smart watch illustrated in FIG. 7C can have a variety of functions, such as a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the display device for the display portion 7304.

FIG. 7D illustrates an example of a mobile phone (e.g., a smartphone). A mobile phone 7400 includes a housing 7401 provided with a display portion 7402, a microphone 7406, a speaker 7405, a camera 7407, an external connection portion 7404, an operation button 7403, and the like. In the case where a display device is manufactured in the manner that the liquid crystal element and light-emitting element of one embodiment of the present invention are formed over a flexible substrate, the display device can be used for the display portion 7402 having a curved surface as illustrated in FIG. 7D.

When the display portion 7402 of the mobile phone 7400 illustrated in FIG. 7D is touched with a finger or the like, data can be input into the mobile phone 7400. Furthermore, operations such as making a call and composing an e-mail can be performed by touch on the display portion 7402 with a finger or the like.

The display portion 7402 has mainly three screen modes. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 and text input operation can be performed using characters displayed on the screen. In this case, it is preferable to display a keyboard or number buttons on almost the entire screen of the display portion 7402.

When a detection device such as a gyroscope sensor or an acceleration sensor is provided inside the mobile phone 7400, display on the screen of the display portion 7402 can be automatically changed by determining the orientation of the mobile phone 7400 (whether the mobile phone is placed horizontally or vertically).

The screen modes are changed by touch on the display portion 7402 or operation with the operation button 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may also function as an image sensor. For example, an image of a palm print, a fingerprint, or the like is taken by touch on the display portion 7402 with the palm or the finger, whereby personal authentication can be performed. In addition, when a backlight or a sensing light source that emits near-infrared light is provided in the display portion, an image of a finger vein, a palm vein, or the like can be taken. Note that the mobile phone can be especially suitable for outdoor use by including the display device of one embodiment of the present invention in the display portion 7402 because a reduction in visibility due to reflection of ambient light can be prevented in the display device.

Furthermore, the display device can be used for a mobile phone having a structure illustrated in FIG. 7D'-1 or FIG. 7D'-2, which is another structure of the mobile phone (e.g., smartphone).

Note that in the case of the structure illustrated in FIG. 7D'-1 or FIG. 7D'-2, text data, image data, or the like can be displayed on second screens 7502(1) and 7502(2) of housings 7500(1) and 7500(2) as well as first screens 7501(1) and 7501(2). Such a structure enables the user to easily see text data, image data, or the like displayed on the second screens 7502(1) and 7502(2) while the mobile phone is placed in user's breast pocket.

FIG. 7E shows a goggle-type display (a head-mounted display), which includes a main body 7601, a display portion 7602, and an arm 7603. Note that the goggle-type display can be especially suitable for outdoor use by including the display device of one embodiment of the present invention in the display portion 7602 because a reduction in visibility due to reflection of ambient light can be prevented.

Figure 8A:
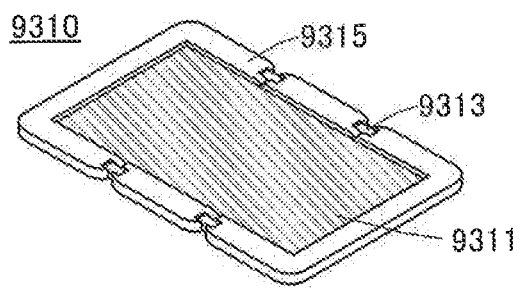
FIGS. 8A to 8C are diagrams illustrating an electronic device.
Figure 8B:
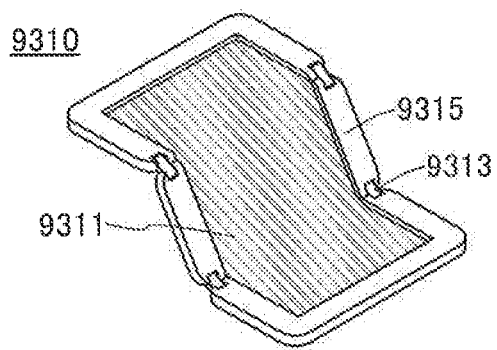
Figure 8C:
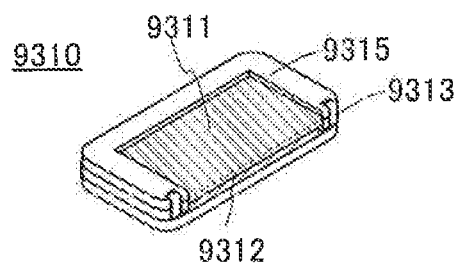

Another electronic device including the display device is a foldable mobile information terminal illustrated in FIGS. 8A to 8C. FIG. 8A illustrates a mobile information terminal 9310 which is opened. FIG. 8B illustrates the mobile information terminal 9310 which is being opened or being folded. FIG. 8C illustrates the mobile information terminal 9310 which is folded. The mobile information terminal 9310 is highly portable when folded and is highly browsable when opened because of a seamless large display region.

A display portion 9311 is supported by three housings 9315 joined together by hinges 9313. Note that the display portion 9311 may be a touch panel (an input/output device) including a touch sensor (an input device). When the display portion 9311 is bent at a connection portion between two housings 9315 with the use of the hinges 9313, the mobile information terminal 9310 can be reversibly changed in shape from an opened state to a folded state. A display region 9312 in the display portion 9311 is a display region that is positioned at a side surface of the mobile information terminal 9310 that is folded. On the display region 9312, information icons, file shortcuts of frequently used applications or programs, and the like can be displayed, and confirmation of information and start of application can be smoothly performed. Note that the mobile information terminal can be especially suitable for outdoor use by including the display device of one embodiment of the present invention in the display portion 9311 because a reduction in visibility due to reflection of ambient light can be prevented in the display device.

Figure 9A:
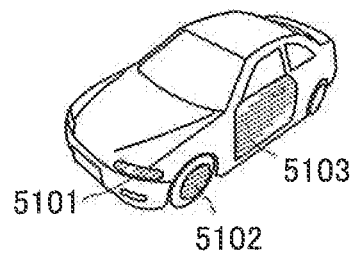
FIGS. 9A and 9B are diagrams illustrating an automobile.
Figure 9B:
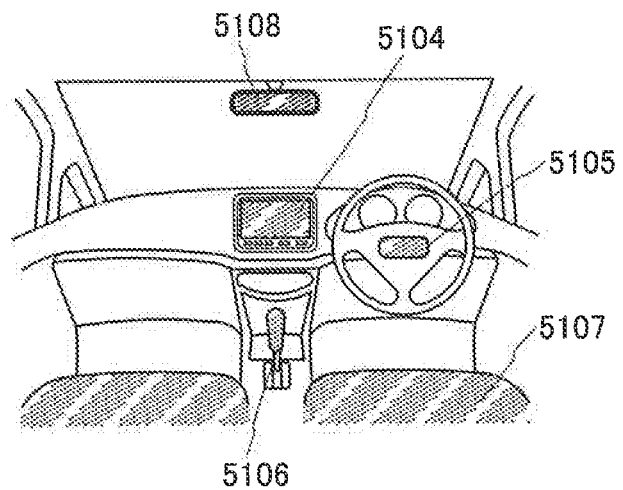

FIGS. 9A and 9B illustrate an automobile including the display device. The display device can be incorporated in the automobile, and specifically, can be included in lights 5101 (including lights of the rear part of the car), a wheel 5102 of a tire, a part or whole of a door 5103, or the like on the outer side of the automobile which is illustrated in FIG. 9A. The display device can also be included in a display portion 5104, a steering wheel 5105, a gear lever 5106, a seat 5107, an inner rearview mirror 5108, or the like on the inner side of the automobile which is illustrated in FIG. 9B, or in a part of a glass window. Note that the display device of one embodiment the present invention which is provided in part of the automobilecan be especially suitable for outdoor use because a reduction in visibility due to reflection of ambient light from the display device can be prevented.

As described above, the electronic devices and automobiles can be obtained using the display device of one embodiment of the present invention. Note that the display device can be used for electronic devices and automobiles in a variety of fields without being limited to the electronic devices and automobiles described in this embodiment.

Note that the structure described in this embodiment can be used in an appropriate combination with any of the structures described in the other embodiments.

Example 1

Simulations were performed to examine the relation between the brightness (reflectance) and the NTSC coverage in a display including a reflective liquid crystal element (a reflective display) and the results are described in this example.

The light source of a reflective display is ambient light, and it is difficult to adjust the luminance of the light source as appropriate. The outside light is transmitted twice through a color filter when entering a display and exiting from the display; thus, it can be said that the reflectivity is largely affected by the color filter. That is, the reflectivity can be controlled as the thickness of the color filter is adjusted.

Then, the reflectivity of a display was changed as the thickness of the color filter was adjusted, and the relation between the reflectance and the NTSC coverage was estimated by liquid crystal alignment simulation. For the calculation, LCD Master 1D manufactured by SHINTECH, Inc. was used. The calculation conditions are shown in Table 1 below. Note that the incident light was set to 100% on the assumption that the reflectance was specular reflection.

TABLE 1

| Algorithm | 2 × 2 (Single reflection) |
|---|---|
| Light source | D65 |
| Polar angle | 0 |
| LC mode | Twisted ECB |
| LC | ZLI-4792 |
| Gap | 2 μm |
| Twist | 70 |
| Applied Voltage | 0/6 V |

Figure 10:
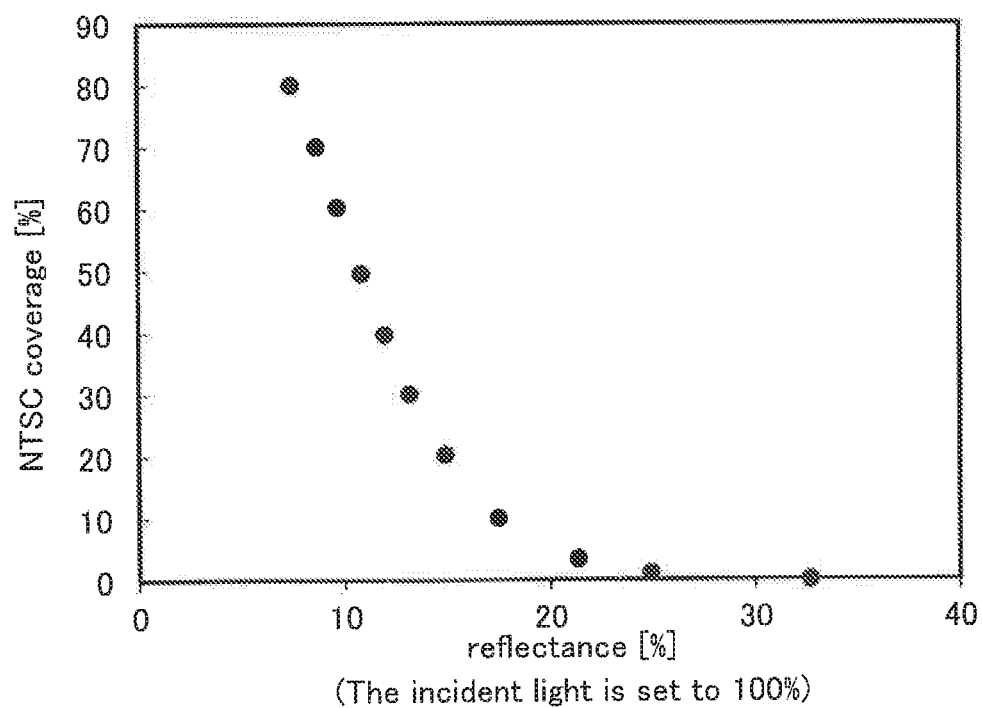
FIG. 10 is a diagram showing an NTSC coverage—reflectance characteristic (simulated values) of a liquid crystal panel.

FIG. 10 shows the simulation results.

Next, the NTSC area ratio and the NTSC coverage as a function of the reflectance were measured using an actual reflective display. The measurement was performed in the manner that light was incident at a polar angle of 30° and received at 0°. Specular reflection is not employed; thus, the reflectance of a standard white plate is set to 100%. Note that the conditions of a reflective display panel used for this measurement are shown in Table 2 below.

TABLE 2

| LC mode | Twisted ECB |
|---|---|
| Pixel density | 212 ppi |
| Aperture ratio | 83.4% |
| Dn | 0.100 |
| De | 3.56 |
| Gap | 2 μm |
| Twist | 70 |
| Applied Voltage | 0/6 V |

Figure 11:
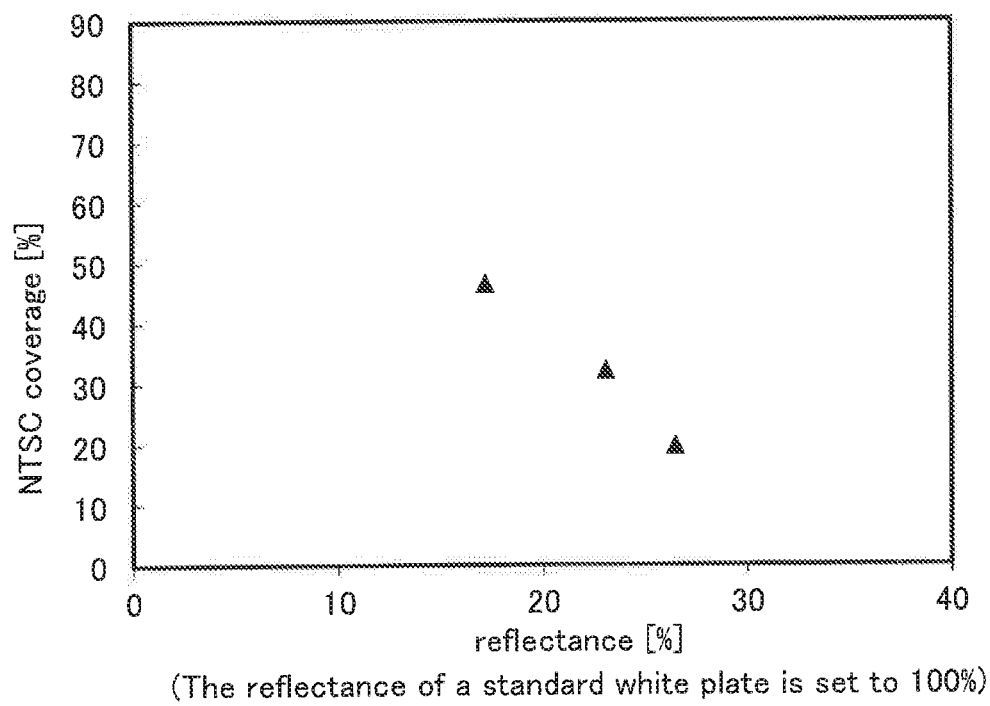
FIG. 11 is a diagram showing an NTSC coverage—reflectance characteristic (actual values) of a liquid crystal panel.

FIG. 11 shows the measurement results.

Figure 12:
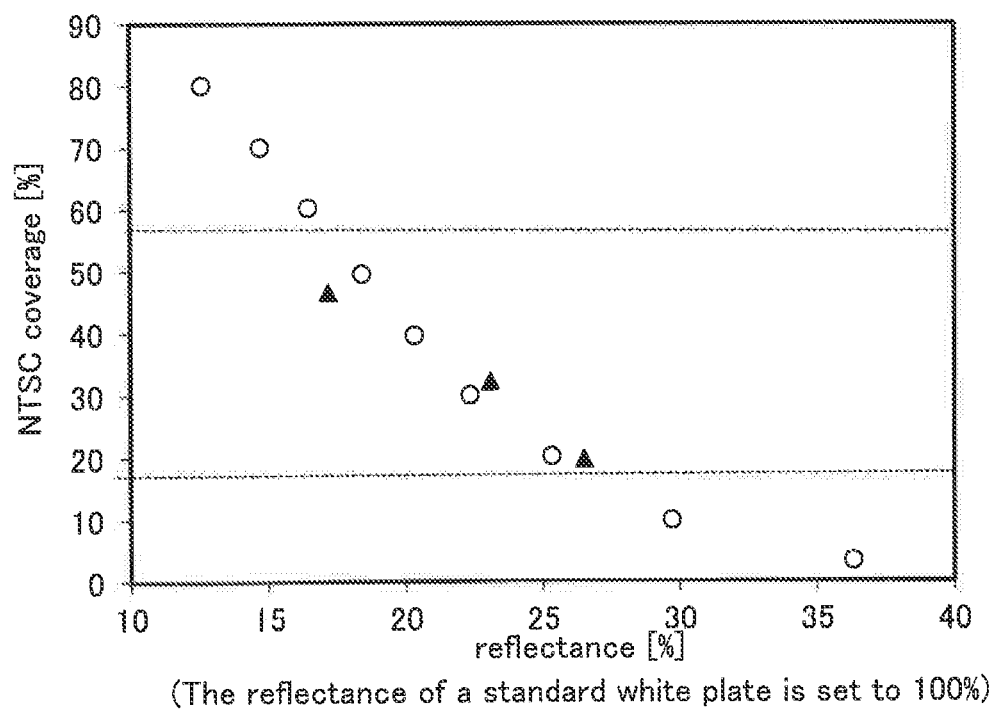
FIG. 12 is a diagram showing an NTSC coverage—reflectance characteristic of a liquid crystal panel (corrected values)

Here, the simulation results in FIG. 10 and the measurement results (actual measurement results) in FIG. 11 were corrected so as to be comparable with each other because the reflectance in the simulation and the reflectance in the measurement are differently defined. Specifically, the reflectance when the light source was 100% was multiplied by a constant such that a curve of the NTSC coverage with respect to the reflectance obtained by simulation was fitted to the plots of the measurement results. FIG. 12 shows the results.

The results in FIG. 12 indicate that a reflectance of more than or equal to 16% and less than or equal to 26% can be obtained in the panel including a reflective liquid crystal element when the NTSC area ratio or the NTSC coverage is set to more than or equal to 20% and less than or equal to 60%. That is, it is apparent that brightness (reflectance) required for the display including a reflective liquid crystal element (reflective display) can be obtained when the NTSC area ratio or the NTSC coverage is more than or equal to 20% and less than or equal to 60%.

Example 2

Figure 13:
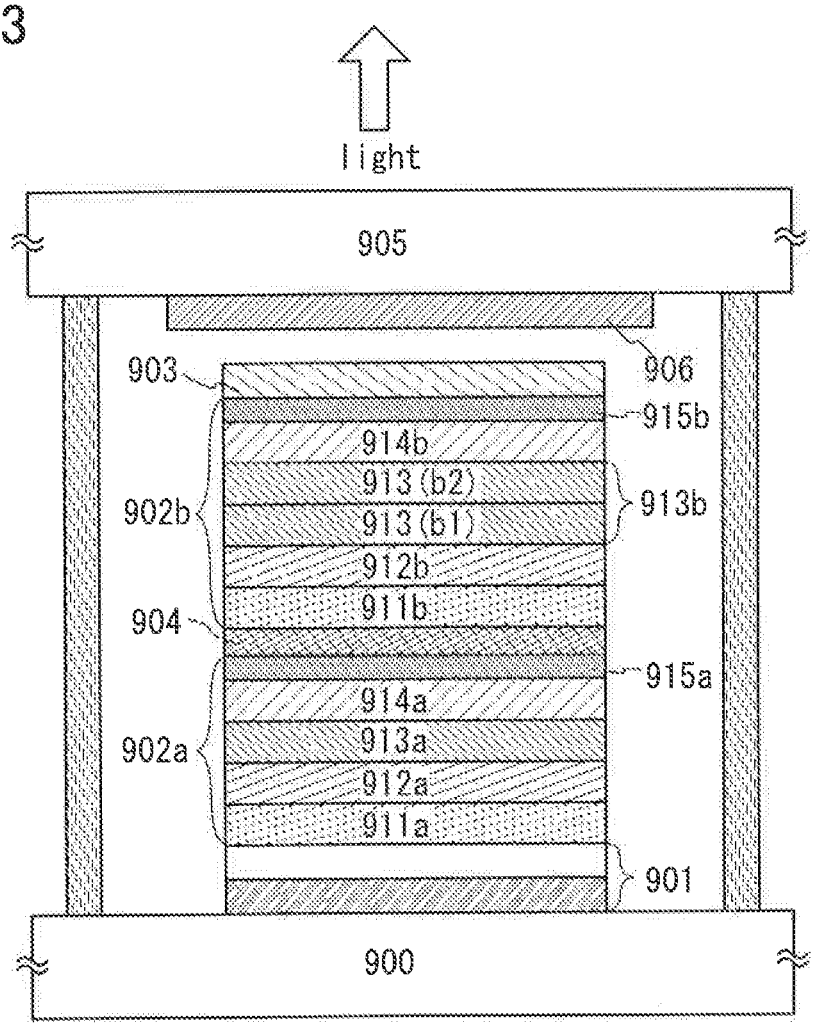
FIG. 13 is a diagram illustrating a light-emitting element.
Figure 14:
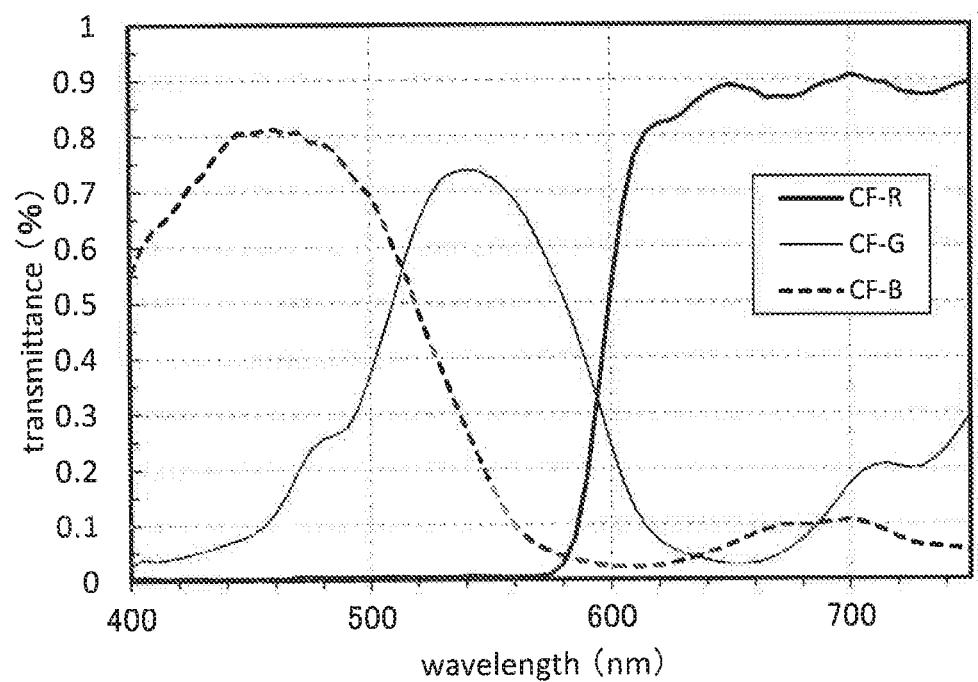
FIG. 14 shows transmission spectra of color filters.
Figure 15:
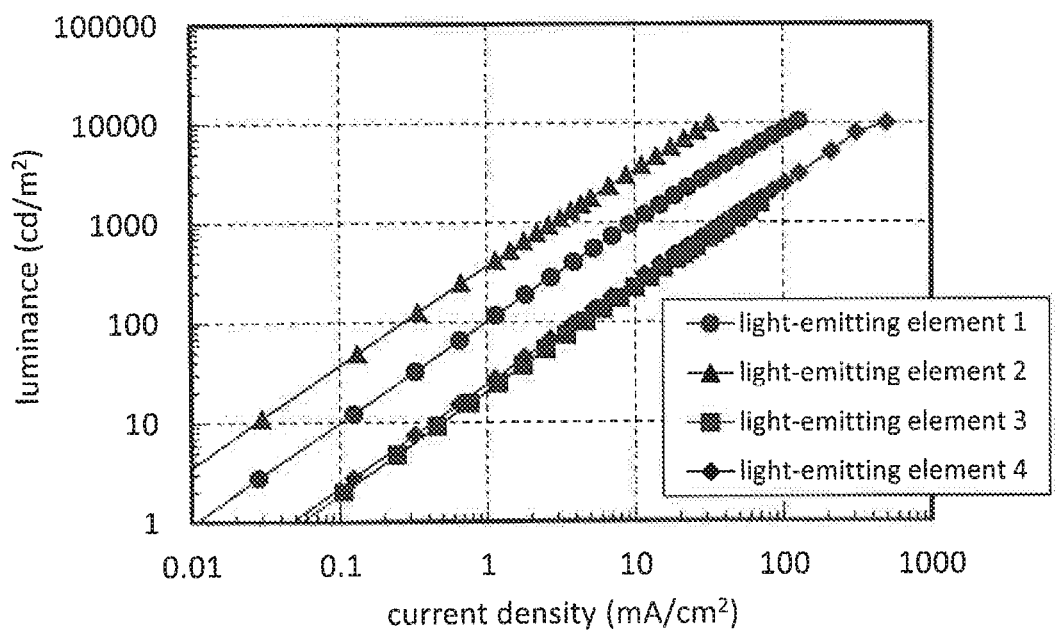
FIG. 15 is a diagram showing a luminance—current density characteristic of light-emitting elements 1 to 4.
Figure 16:
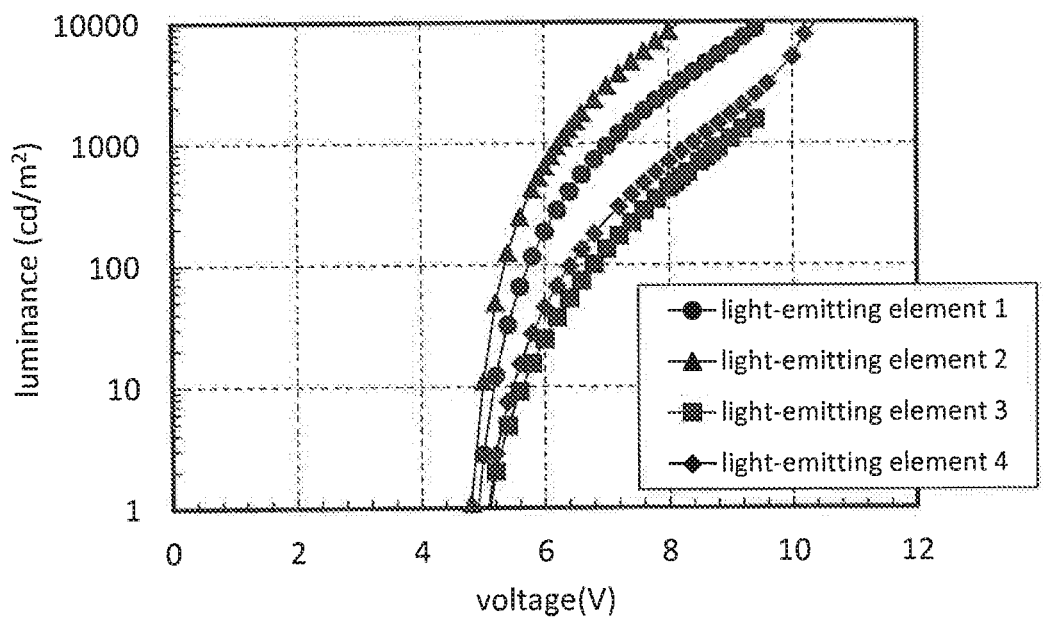
FIG. 16 is a diagram showing a luminance—voltage characteristic of light-emitting elements 1 to 4.
Figure 17:
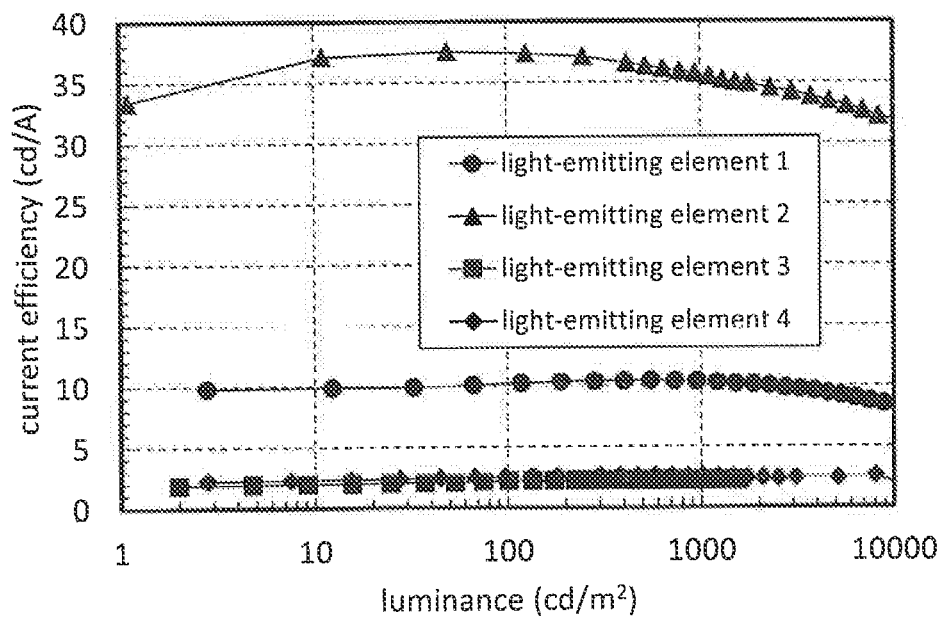
FIG. 17 is a diagram showing a current efficiency—luminance characteristic of light-emitting elements 1 to 4.
Figure 18:
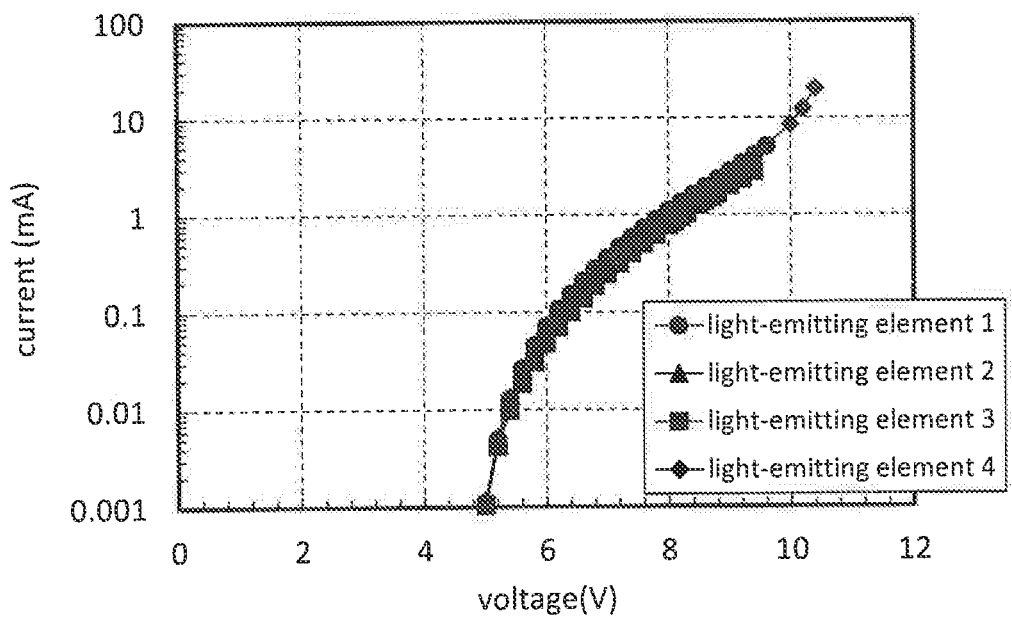
FIG. 18 is a diagram showing a current—voltage characteristic of light-emitting elements 1 to 4.

In this example, an element structure, a forming method, and properties of a light-emitting element used in the display device of one embodiment of the present invention will be described. Note that FIG. 13 illustrates an element structure of a light-emitting element described in this example, and Table 3 shows specific structures. Table 3 also shows color filters (CF) combined with light-emitting elements. A light-emitting element 1 is combined with a CF-R; a light-emitting element 2, a CF-G; and each of light-emitting elements 3 and 4, a CF-B. FIG. 14 shows transmitting properties of these CFs. Chemical formulae of materials used in this example are shown below.

TABLE 3

| Symbol in FIG. 13 | First electrode 901 | First hole-injection layer 911a | First hole-transport layer 912a | Light-emitting layer (A) 913a | First electron-transport layer 914a | |
|---|---|---|---|---|---|---|
| Light-emitting element 1(R) | Ag—Pd—Cu (200 nm) | ITSO (110 nm) | PCPPn:MoOx (1:0.5 10 nm) | PCPPn (10 nm) | *1 | cgDBCzPA (10 nm) | NBphen (15 nm) |
| Light-emitting element 2(G) | | ITSO (45 nm) | PCPPn:MoOx (1:0.5 20 nm) | | | | |
| Light-emitting element 3(B1) | | ITSO (10 nm) | PCPPn:MoOx (1:0.5 12.5 nm) | | | | |
| Light-emitting element 4(B1.5) | | ITSO (110 nm) | PCPPn:MoOx (1:0.5 16 nm) | | | | |

| | | | | | Light-emitting layer (B) | | |
|---|---|---|---|---|---|---|---|
| Symbol in FIG. 13 | First electron-injection layer 915a | Charge generation layer 904 | Second hole-injection layer 911b | Second hole-transport layer 912b | First light-emitting layer 913(b1) | Second light-emitting layer 913(b2) | (Reference) |
| Light-emitting element 1(R) | Li$_2$O (0.1 nm) | CuPc (2 nm) | DBT3P-II:MoOx (1:0.5 10 nm) | BPAFLP (15 nm) | *2 | *3 | Light-emitting element 1(R) |
| Light-emitting element 2(G) | | | | | | | Light-emitting element 2(G) |
| Light-emitting element 3(B1) | | | | | | | Light-emitting element 3(B1) |
| Light-emitting element 4(B1.5) | | | | | | | Light-emitting element 4(B1.5) |

| Symbol in FIG. 13 | Second electron-transport layer 914b | | Second electron-injection layer 915b | Second electrode 903 | | CF | |
|---|---|---|---|---|---|---|---|
| Light-emitting element 1(R) | 2mDBTBPDBq-II (25 nm) | Nbphen (15 nm) | LiF (1 nm) | AgMg (1:0.1 25 nm) | ITO (70 nm) | CF-R | Light-emitting element 1(R) |
| Light-emitting element 2(G) | | | | | | CF-G | Light-emitting element 2(G) |
| Light-emitting element 3(B1) | | | | | | CF-B | Light-emitting element 3(B1) |

TABLE 3-continued
| Light-emitting element 4(B1.5) | | CF-B | Light-emitting element 4(B1.5) |
*1 cgDBCzPA:1,6BnfAPrn-03 (1:0.03 25 nm)
*2 2mDBTBPDB1-II:PCBBiF:[Ir(tBuppm)₃] (0.8:0.2:0.06 20 nm)
*3 2mDBTBPDBq-II:[Ir(dmdppr-P)₂(dibm)] (1:0.04 20 nm)
[Chemical formula 1]
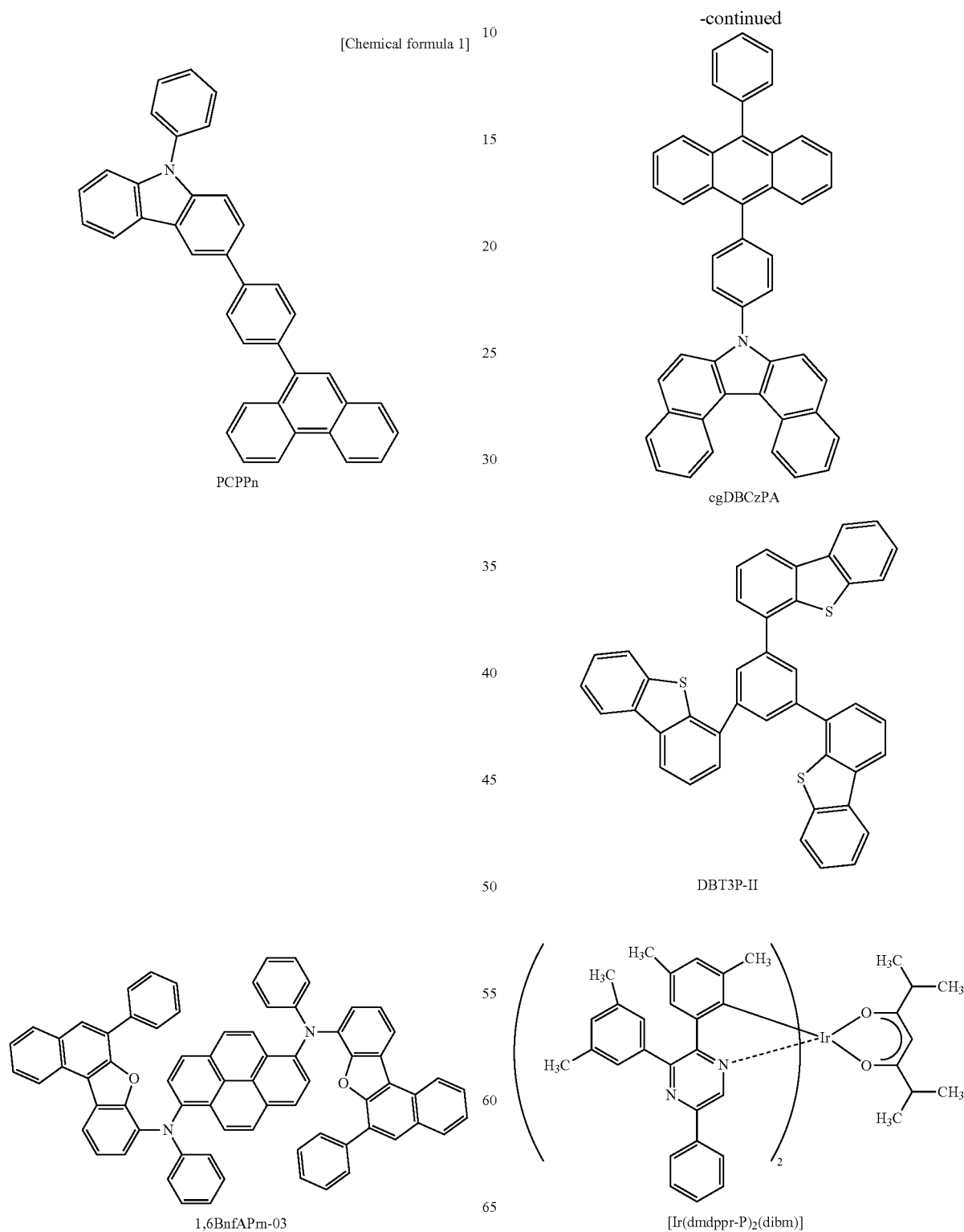

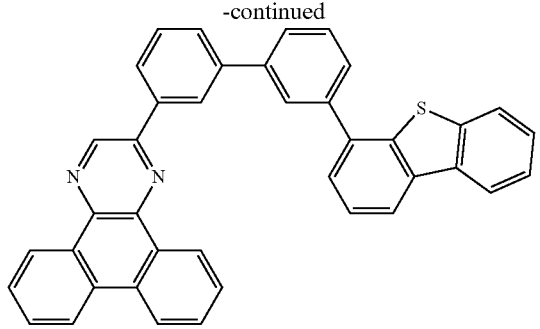

2mDBTBPDBq-II

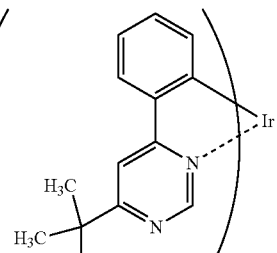

[Ir(tBuppm)₃]

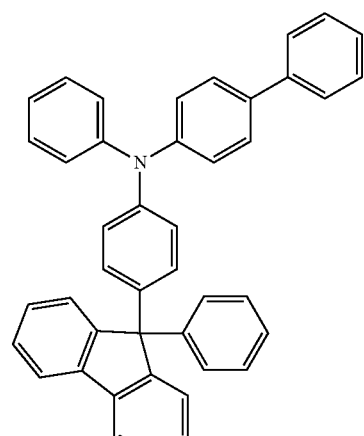

BPAFLP

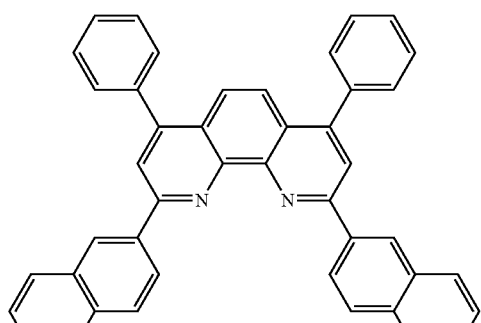

NBphen

[Chemical formula 2]

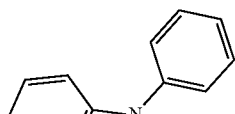

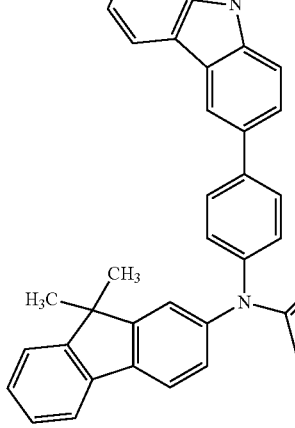

PCBBiF

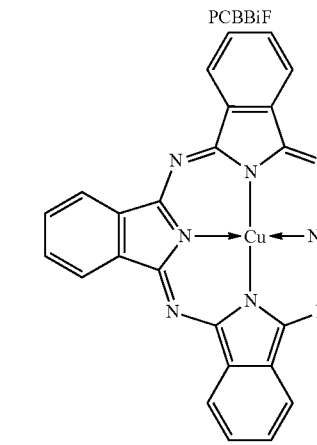

CuPc

<<Formation of Light-Emitting Element>>

A light-emitting element in this example has a structure illustrated in FIG. 13 in which a first electrode 901 is formed over a substrate 900, a first EL layer 902*a* is formed over the first electrode 901, a charge generation layer 904 is formed over the first EL layer 902*a*, a second EL layer 902*b* is formed over the charge generation layer 904, and a second electrode 903 is formed over the second EL layer 902*b*. Note that the light-emitting element 1 in this example is a light-emitting element emitting mainly red light and referred to as a light-emitting element 1(R). The light-emitting element 2 is a light-emitting element emitting mainly green light and referred to as a light-emitting element 2(G). The light-emitting element 3 and the light-emitting element 4 are each a light-emitting element emitting mainly blue light and are also referred to as a light-emitting element 3(B1) and a light-emitting element 3(B1.5), respectively.

First, the first electrode 901 was formed over the substrate 900. The electrode area was set to 4 mm² (2 mm×2 mm). A glass substrate was used as the substrate 900. The first electrode 901 was formed in the following manner: a 200-nm-thick alloy film of silver (Ag), palladium (Pd), and copper (Cu) (the alloy is also referred to as Ag—Pd—Cu) was formed by a sputtering method, and an ITSO was formed by a sputtering method. The ITSO was formed such that the thickness was 110 nm in the case of the light-emitting element 1(R), the thickness was 45 nm in the case of the light-emitting element 2(G), the thickness was 10 nm in the case of the light-emitting element 3(B1), and the thickness was 110 nm in the case of the light-emitting element 4(B1.5). In this example, the first electrode 901 functions as an anode. The first electrode 901 is a reflective electrode having a function of reflecting light. In this example, both the light-emitting element 3(B1) and the light-emitting element 4(B1.5) emit blue light but have different optical path lengths between their electrodes. The light-emitting element 3(B1) has an adjusted optical path length between its electrodes of 1 wavelength and the light-emitting element 4(B1.5) has an adjusted optical path length between its electrodes of 1.5 wavelengths.

As pretreatment, a surface of the substrate was washed with water, baking was performed at 200° C. for one hour, and then UV ozone treatment was performed for 370 seconds. After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate was cooled down for about 30 minutes.

Next, a first hole-injection layer 911a was formed over the first electrode 901. After the pressure in the vacuum evaporation apparatus was reduced to $10^{-4}$ Pa, the hole-injection layer 911a was formed by co-evaporation such that the weight ratio of 3-[4-(9-phenanthryl)-phenyl]-9-phenyl-9H-carbazole (abbreviation: PCPPn) to molybdenum oxide was 1:0.5, and such that the thickness was 10 nm in the case of the light-emitting element 1(R), the thickness was 20 nm in the case of the light-emitting element 2(G), the thickness was 12.5 nm in the case of the light-emitting element 3(B1), and the thickness was 16 nm in the case of the light-emitting element 4(B1.5).

Then, a first hole-transport layer 912a was formed over the first hole-injection layer 911a. As the first hole-transport layer 912a, PCPPn was deposited by evaporation to a thickness of 10 nm. Note that the same applies to the first light-emitting element, the second light-emitting element, the third light-emitting element, and the fourth light-emitting element. When the same applies to all the light-emitting elements, there is no description hereinafter.

Next, a light-emitting layer (A) 913a was formed over the first hole-transport layer 912a.

The light-emitting layer (A) 913a was formed to a thickness of 25 nm by co-evaporation using 7-[4-(10-phenyl-9-anthryl)phenyl]-7H-dibenzo[c,g]carbazole (abbreviation: cgDBCzPA) as a host material and using N,N'-(pyrene-1,6-diyl)bis[(6,N-diphenylbenzo[b]naphtho[1,2-d]furan)-8-amine] (abbreviation: 1,6BnfAPrn-03) as a guest material (a fluorescent material), such that the weight ratio of cgDBCzPA to 1,6BnfAPrn-03 was 1:0.03.

Next, a first electron-transport layer 914a was formed over the light-emitting layer (A) 913a. The first electron-transport layer 914a was formed in the following manner: cgDBCzPA and 2,9-bis(naphthalen-2-yl)-4,7-diphenyl-1,10-phenanthroline (abbreviation: NBphen) were sequentially deposited by evaporation to thicknesses of 10 nm and 15 nm, respectively.

Next, a first electron-injection layer 915a was formed over the first electron-transport layer 914a. The first electron-injection layer 915a was formed to a thickness of 0.1 nm by evaporation of lithium oxide ($Li_2O$).

Then, the charge generation layer 904 was formed over the first electron-injection layer 915a. The charge generation layer 904 was formed by evaporation of copper phthalocyanine (abbreviation: CuPc) to a thickness of 2 nm.

Next, a second hole-injection layer 911b was formed over the charge generation layer 904. The second hole-injection layer 911b was formed to a thickness of 10 nm by co-evaporation such that the weight ratio of 4,4',4"-(benzene-1,3,5-triyl)tri(dibenzothiophene) (abbreviation: DBT3P-II) to molybdenum oxide was 1:0.5.

Then, a second hole-transport layer 912b was formed over the second hole-injection layer 911b. The hole-transport layer 912b was formed to a thickness of 15 nm by evaporation of 4-phenyl-4'-(9-phenylfluoren-9-yl)triphenylamine (abbreviation: BPAFLP).

A light-emitting layer (B) 913b was formed over the second hole-transport layer 912b. The light-emitting layer (B) 913b had a stacked-layer structure of a first light-emitting layer (B1) 913(b1) and a second light-emitting layer (B2) 913(b2).

The first light-emitting layer (B1) 913(b1) was formed to a thickness of 20 nm by co-evaporation using 2-[3'-(dibenzothiophen-4-yl)biphenyl-3-yl]dibenzo[f,h]quinoxaline (abbreviation: 2mDBTBPDBq-II) as a host material, using N-(1,1'-biphenyl-4-yl)-N-[4-(9-phenyl-9H-carbazol-3-yl)phenyl]-9,9-dimethyl-9H-fluoren-2-amine (abbreviation: PCBBiF) as an assist material, and using tris(4-t-butyl-6-phenylpyrimidinato)iridium(III) (abbreviation: [Ir(tBuppm)$_3$]) as a guest material (a phosphorescent material) such that the weight ratio of 2mDBTBPDBq-II: PCBBiF: [Ir(tBuppm)$_3$] was 0.8:0.2:0.06. The second light-emitting layer (B2) 913(b2) was formed to a thickness of 20 nm by co-evaporation using 2mDBTBPDBq-II as a host material and using bis {4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]) as a guest material (a phosphorescent material), such that the weight ratio of 2mDBTBPDBq-II to [Ir(dmdppr-P)$_2$(dibm)] was 1:0.04.

Next, a second electron-transport layer 914b was formed over the second light-emitting layer (B2) 913(b2). The second electron-transport layer 914b was formed in the following manner: 2mDBTBPDBq-II and NBphen were sequentially deposited by evaporation to thicknesses of 10 nm and 15 nm, respectively.

Then, a second electron-injection layer 915b was formed over the second electron-transport layer 914b. The second electron-injection layer 915b was formed to a thickness of 1 nm by evaporation of lithium fluoride (LiF).

Then, the second electrode 903 was formed over the second electron-injection layer 915b. The second electrode 903 was formed in the following manner: a film of silver (Ag) and magnesium (Mg) was formed to a thickness of 15 nm by co-evaporation at a volume ratio of Ag:Mg=1:0.1, and then indium tin oxide (ITO) was formed to a thickness of 70 nm by a sputtering method. In this example, the second electrode 903 functions as a cathode. Moreover, the second electrode 903 is a semi-transmissive and semi-reflective electrode having functions of transmitting light and reflecting light.

Through the above steps, the light-emitting element in which the EL layers are provided between the pair of electrodes was formed over the substrate 900. The first hole-injection layer 911a, the first hole-transport layer 912a, the light-emitting layer 913a, the first electron-transport layer 914a, the first electron-injection layer 915a, the second hole-injection layer 911b, the second hole-transport layer 912b, the light-emitting layer (B) 913b, the second electron-transport layer 914b, and the second electron-injection layer 915b that are described above are functional layers forming the EL layers of one embodiment of the present invention. Furthermore, in all the evaporation steps in the above forming method, evaporation was performed by a resistance-heating method.

The light-emitting element formed in this example is sealed between the substrate 900 and a substrate 905 as illustrated in FIG. 13. The substrate 905 is provided with a color filter 906. The sealing between the substrate 900 and the substrate 905 was performed in such a manner that the substrate 905 was fixed to the substrate 900 with a sealing material in a glove box containing a nitrogen atmosphere, a sealant was applied to surround the light-emitting element formed over the substrate 900, and then irradiation with 365-nm ultraviolet light at 6 J/cm$^2$ was performed and heat treatment was performed at 80° C. for 1 hour for sealing.

The light-emitting elements formed in this example each have a structure in which light is emitted in the direction indicated by the arrow from the second electrode 903 side of the light-emitting element.

<<Operation Characteristics of Light-Emitting Elements>>

Figure 19:
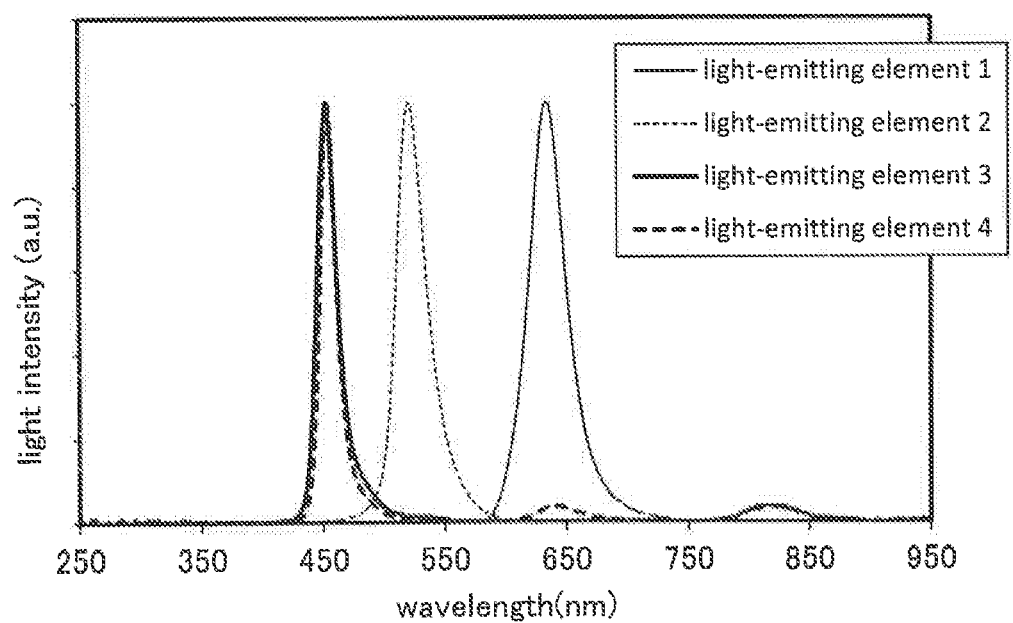
FIG. 19 shows light emission spectra of light-emitting elements 1 to 4.
Figure 20:
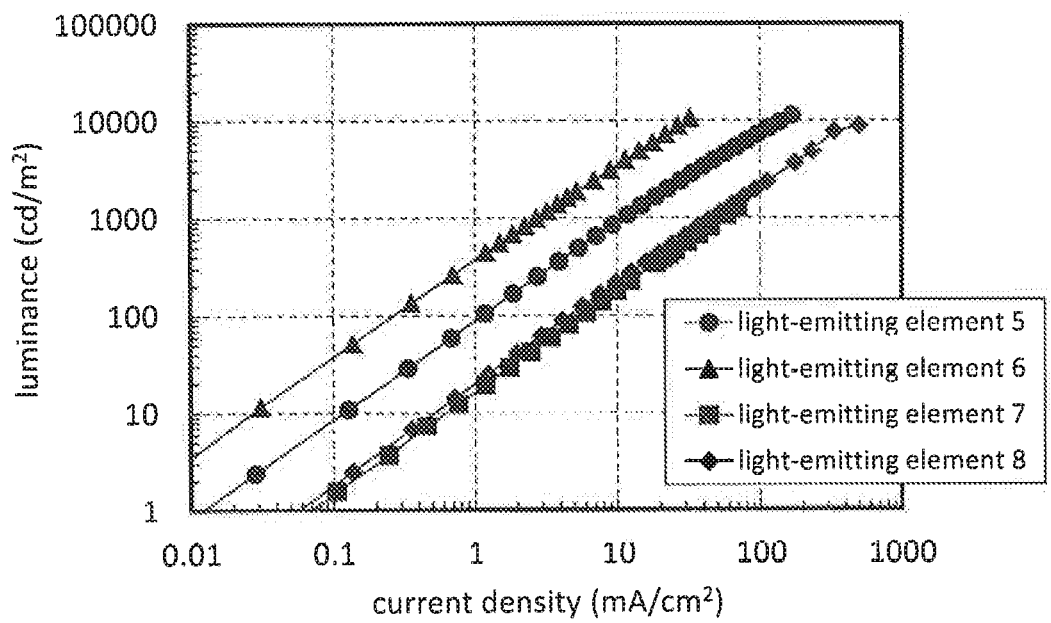
FIG. 20 is a diagram showing a luminance—current density characteristic of light-emitting elements 5 to 8.
Figure 21:
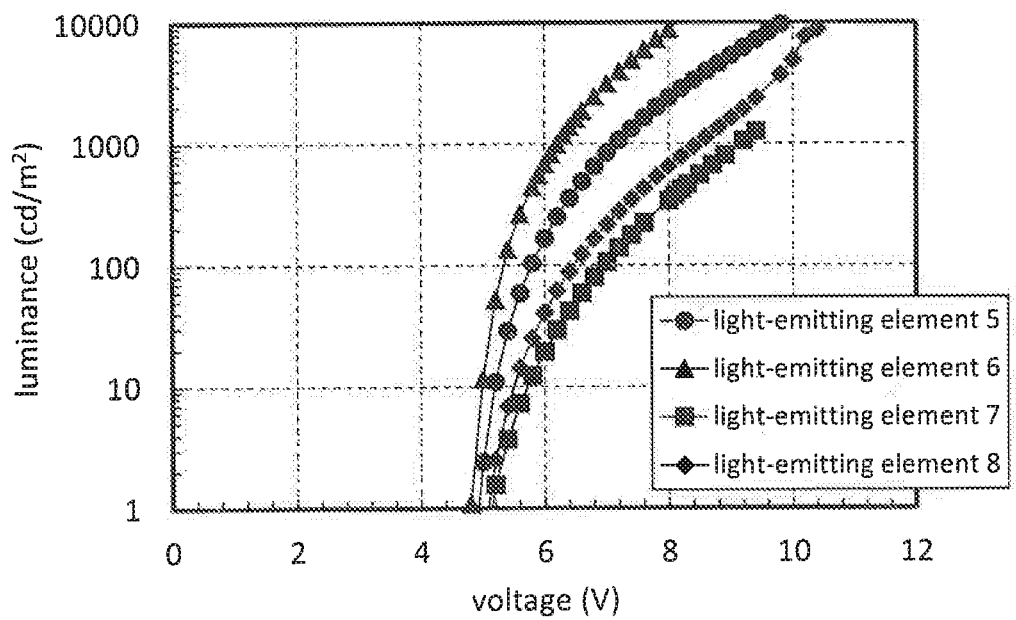
FIG. 21 is a diagram showing a luminance—voltage characteristic of light-emitting elements 5 to 8.
Figure 22:
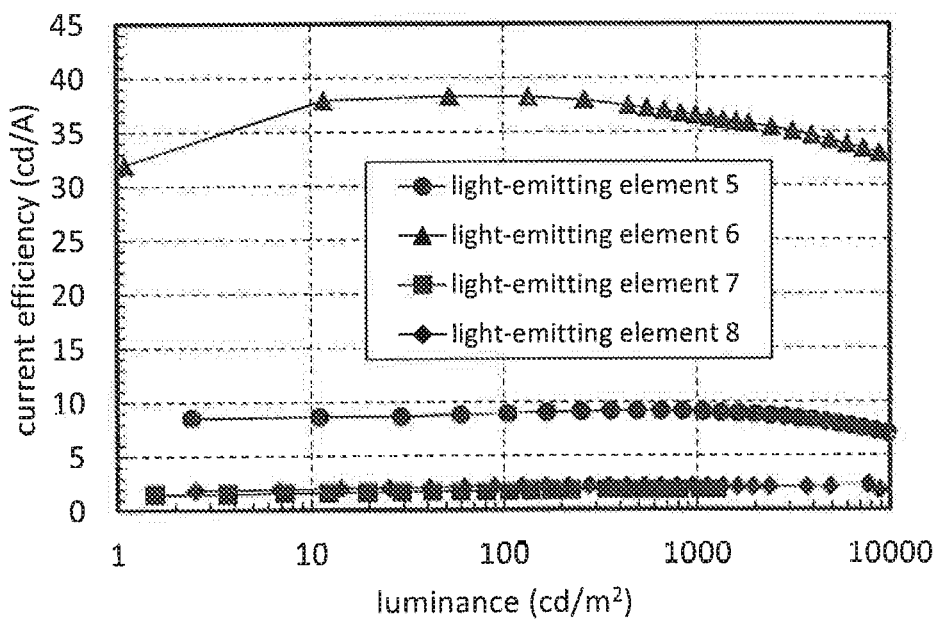
FIG. 22 is a diagram showing a current efficiency—luminance characteristic of light-emitting elements 5 to 8.
Figure 23:
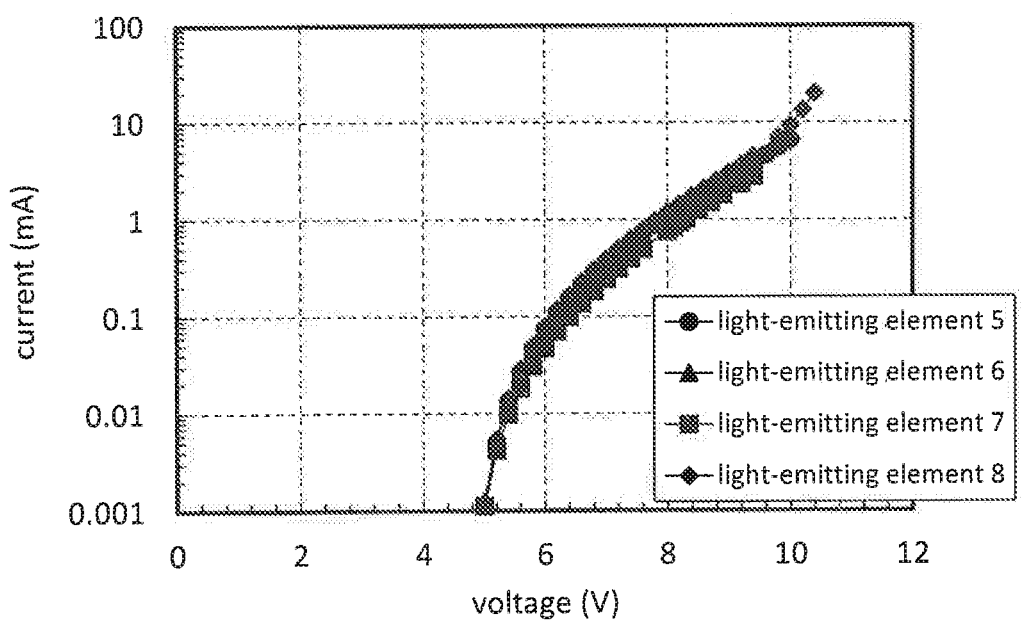
FIG. 23 is a diagram showing a current—voltage characteristic of light-emitting elements 5 to 8.

Operation characteristics of the formed light-emitting elements were measured. Note that the measurement was performed at room temperature (in an atmosphere kept at 25° C.). The results are shown in FIG. 15, FIG. 16, FIG. 17, and FIG. 18. FIG. 19 shows light emission spectra when current at a current density of 2.5 mA/cm$^2$ was applied to the light-emitting elements. The light emission spectra were measured with a multi-channel spectrometer (PMA-12 produced by Hamamatsu Photonics K.K.). As shown in FIG. 19, the light emission spectrum of the light-emitting element 1(R) which emits red light has a peak around 635 nm, the light emission spectrum of the light-emitting element 2(G) which emits green light has a peak around 521 nm, and the light emission spectra of the light-emitting elements 3(B1) and 4(B1.5) which emit blue light each have a peak around 453 nm. The spectrum shapes were narrowed. In this example, the results of measuring light emission obtained from a combination of light-emitting elements and color filters are shown.

FIG. 14 shows transmission spectra of the color filter (red) (CF-R) used in combination with the light-emitting element 1(R), the color filter (green) (CF-G) used in combination with the light-emitting element 2(G), and the color filter (blue) (CF-B) used in combination with the light-emitting elements 3(B1) and 4(B1.5). FIG. 14 shows that the transmittance of the CF-R at 600 nm is lower than or equal to 60% and is 52%, whereas the transmittance of the CF-R at 650 nm is higher than or equal to 70% and is 89%. In addition, the transmittance of the CF-G at 480 nm and at 580 nm are lower than or equal to 60% and are 26% and 52%, respectively, whereas the transmittance of the CF-G at 530 nm is higher than or equal to 70% and is 72%. Furthermore, the transmittance of the CF-B at 510 nm is lower than or equal to 60% and is 60%, whereas the transmittance of the CF-B at 450 nm is higher than or equal to 70% and is 80%.

The results of measuring the chromaticities (x, y) of the light-emitting elements formed in this example (the light-emitting element 1(R), the light-emitting element 2(G), and the light-emitting element 3(B1)) with a luminance colorimeter (BM-5A manufactured by TOPCON CORPORATION) are shown in Table 4 below. The chromaticity of the light-emitting element 1(R) was measured at a luminance of approximately 730 cd/m$^2$. The chromaticity of the light-emitting element 2(G) was measured at a luminance of approximately 1800 cd/m$^2$. The chromaticity of the light-emitting element 3(B1) was measured at a luminance of approximately 130 cd/m$^2$. Note that white light emission close to D65 can be obtained by summing the luminance of R, the luminance of G, and the luminance of B.

TABLE 4

| | x | y |
|---|---|---|
| Light-emitting element 1 (R) | 0.697 | 0.297 |
| Light-emitting element 2 (G) | 0.186 | 0.778 |
| Light-emitting element 3 (B1) | 0.142 | 0.046 |

On the basis of the results in Table 4, the BT.2020 area ratio and the BT.2020 coverage were calculated using these chromaticities (x, y) and were 93% and 91%, respectively. Note that the BT.2020 area ratio was obtained in such a manner that an area A of a triangle formed by connecting the CIE chromaticity coordinates (x, y) of RGB which fulfill the BT.2020 standard and area B of a triangle formed by connecting the CIE chromaticity coordinates (x, y) of the three light-emitting elements described in this example were calculated and the area ratio (B/A) was calculated. The BT.2020 coverage is a value which represents how much percentage of the BT.2020 standard color gamut (the inside of the above triangle) can be reproduced using a combination of the chromaticities of the three light-emitting elements described in this example.

The results of measuring the chromaticities (x, y) of the light-emitting element 1(R), the light-emitting element 2(G), and the light-emitting element 4(B1.5)) with a luminance colorimeter among the light-emitting elements formed in this example are shown in Table 5 below. The chromaticity of the light-emitting element 1(R) was measured at a luminance of approximately 550 cd/m$^2$. The chromaticity of the light-emitting element 2(G) was measured at a luminance of approximately 1800 cd/m$^2$. The chromaticity of the light-emitting element 4(B1.5) was measured at a luminance of approximately 130 cd/m$^2$. Note that white light emission close to D65 can be obtained by summing the luminance of R, the luminance of G, and the luminance of B.

TABLE 5

| | x | y |
|---|---|---|
| Light-emitting element 1 (R) | 0.697 | 0.297 |
| Light-emitting element 2 (G) | 0.186 | 0.778 |
| Light-emitting element 4 (B1.5) | 0.156 | 0.042 |

On the basis of the results in Table 5, the BT.2020 area ratio and the BT.2020 coverage were calculated using the chromaticities (x, y) and were 92% and 90%, respectively. Even such a structure having improved blue light emission efficiency can achieve extremely wide-range color reproducibility.

The above results shows that, in this example, the chromaticity of the light-emitting element 1(R) falls within a chromaticity range in which x is more than 0.680 and less than or equal to 0.720 and y is more than or equal to 0.260 and less than or equal to 0.320, the chromaticity of the light-emitting element 2(G) falls within a chromaticity range in which x is more than or equal to 0.130 and less than or equal to 0.250 and y is more than 0.710 and less than or equal to 0.810, and the chromaticity of the light-emitting element 3(B1) falls within a chromaticity range in which x is more than or equal to 0.120 and less than or equal to 0.170 and y is more than or equal to 0.020 and less than 0.060. The light-emitting element 1(R) has x of more than 0.680, and thus particularly has a better red chromaticity than the Digital Cinema Initiatives (DCI-P3) standard, in which the chromaticity coordinates (x, y) of red (R) are (0.680, 0.320);

green (G), (0.265, 0.690); and blue (B), (0.150, 0.060). The light-emitting element 2(G) has y of more than 0.71, and thus particularly has a better green chromaticity than the materials used in this example are shown below. The color filters whose transmission spectra are shown in FIG. 14 were used.

TABLE 6

| Symbol in FIG. 13 | First electrode 901 | | First hole-injection layer 911a | First hole-transport layer 912a | Light-emitting layer (A) 913a | First electron-transport layer 914a | |
|---|---|---|---|---|---|---|---|
| Light-emitting element 5(R) | Ag—Pd—Cu (200 nm) | ITSO (110 nm) | PCPPn:MoOx (1:0.5 10 nm) | PCPPn (10 nm) | *1 | cgDBCzPA (10 nm) | NBphen (15 nm) |
| Light-emitting element 6(G) | | ITSO (45 nm) | PCPPn:MoOx (1:0.5 20 nm) | | | | |
| Light-emitting element 7(B1) | | ITSO (10 nm) | PCPPn:MoOx (1:0.5 12.5 nm) | | | | |
| Light-emitting element 8(B1.5) | | ITSO (110 nm) | PCPPn:MoOx (1:0.5 19 nm) | | | | |

| Symbol in FIG. 13 | First electron-injection layer 915a | Charge generation layer 904 | Second hole-injection layer 911b | Second hole-transport layer 912b | Light-emitting layer (B) | | (Reference) |
|---|---|---|---|---|---|---|---|
| | | | | | First light-emitting layer 913(b1) | Second light-emitting layer 913(b2) | |
| Light-emitting element 5(R) | Li$_2$O (0.1 nm) | CuPc (2 nm) | DBT3P-II:MoOx (1:0.5 10 nm) | BPAFLP (15 nm) | *2 | *3 | Light-emitting element 5(R) |
| Light-emitting element 6(G) | | | | | | | Light-emitting element 6(G) |
| Light-emitting element 7(B1) | | | | | | | Light-emitting element 7(B1) |
| Light-emitting element 8(B1.5) | | | | | | | Light-emitting element 8(B1.5) |

| Symbol in FIG. 13 | Second electron-transport layer 914b | | Second electron-injection layer 915b | Second electrode 903 | | CF | |
|---|---|---|---|---|---|---|---|
| Light-emitting element 5(R) | 2mDBTBPDBq-II (25 nm) | Nbphen (15 nm) | LiF (1 nm) | Ag:Mg (1:0.1 30 nm) | ITO (70 nm) | CF-R | Light-emitting element 5(R) |
| Light-emitting element 6(G) | | | | | | CF-G | Light-emitting element 6(G) |
| Light-emitting element 7(B1) | | | | | | CF-B | Light-emitting element 7(B1) |
| Light-emitting element 8(B1.5) | | | | | | CF-B | Light-emitting element 8(B1.5) |

*1 cgDBCzPA:1,6BnfAPrn-03 (1:0.03 25 nm)
*2 2mDBTBPDBq-II:PCBBiF:[Ir(tBuppm)$_3$] (0.8:0.2:0.06 20 nm)
*3 2mDBTBPDBq-II:[Ir(dmdppr-P)$_2$(dibm)] (1:0.04 20 nm)

DCI-P3 standard and the NTSC standard. In addition, the light-emitting elements 3(B1) and 4(B1.5) each have y of less than 0.06, and thus particularly has a better blue chromaticity than the DCI-P3 standard.

Note that the chromaticities (x, y) of the light-emitting elements 1(R), 2(G), 3(B1), and 4(B1.5) calculated using the values of the light emission spectra shown in FIG. 19 are (0.693, 0.303), (0.202, 0.744), (0.139, 0.056), and (0.160, 0.057), respectively. Therefore, when the chromaticities of a combination of the light-emitting elements 1(R), 2(G), and 3(B1) are calculated using the light emission spectra, the BT.2020 area ratio is 86% and the BT.2020 coverage is 84%. In addition, when the chromaticities of a combination of the light-emitting elements 1(R), 2(G), and 4(B1.5) are calculated using the light emission spectra, the BT.2020 area ratio is 84% and the BT.2020 coverage is 82%.

Example 3

In this example, an element structure, a forming method, and properties of a light-emitting element used in a display device of one embodiment of the present invention will be described. Note that FIG. 13 illustrates an element structure of a light-emitting element described in this example, and Table 6 shows specific structures. Chemical formulae of

[Chemical formula 3]

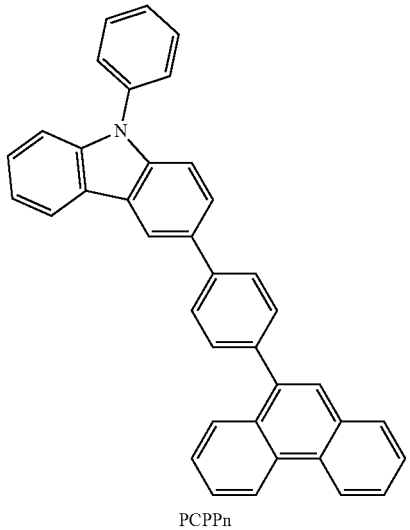

PCPPn

-continued
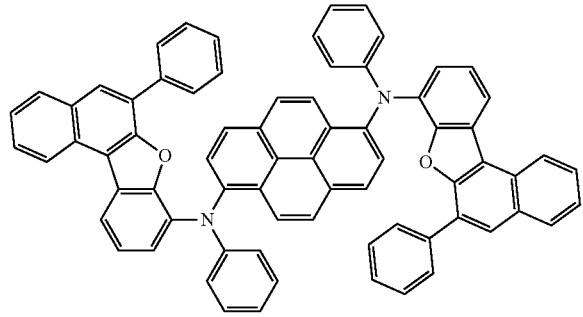
1,6BnfAPrn-03
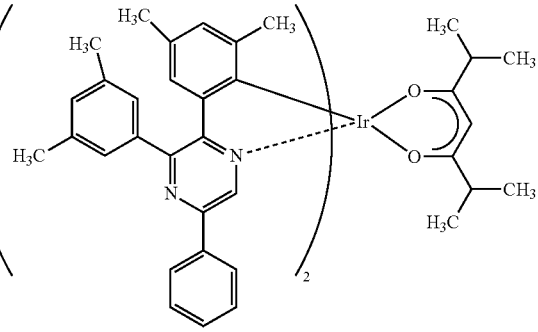
[Ir(dmdppr-P)₂(dibm)]
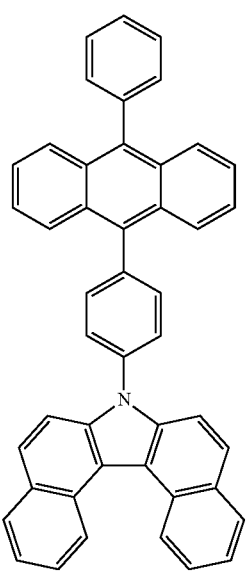
cgDBCzPA
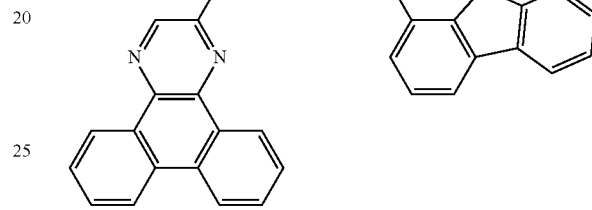
2mDBTBPDBq-II
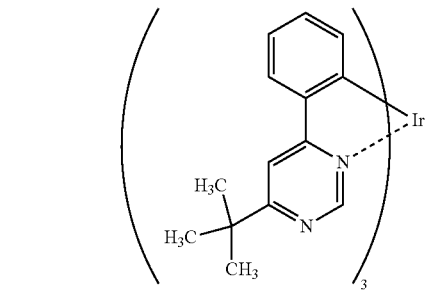
[Ir(tBuppm)₃]
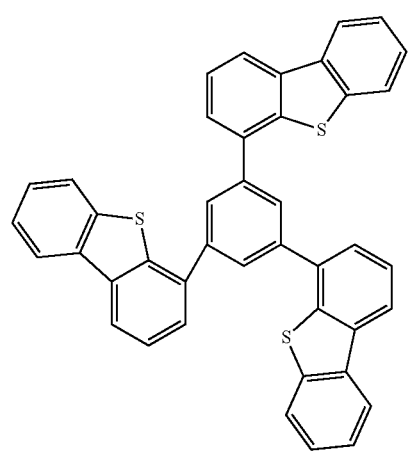
DBT3P-II
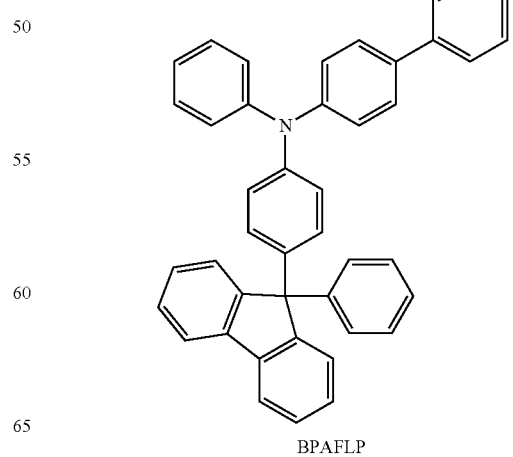
BPAFLP

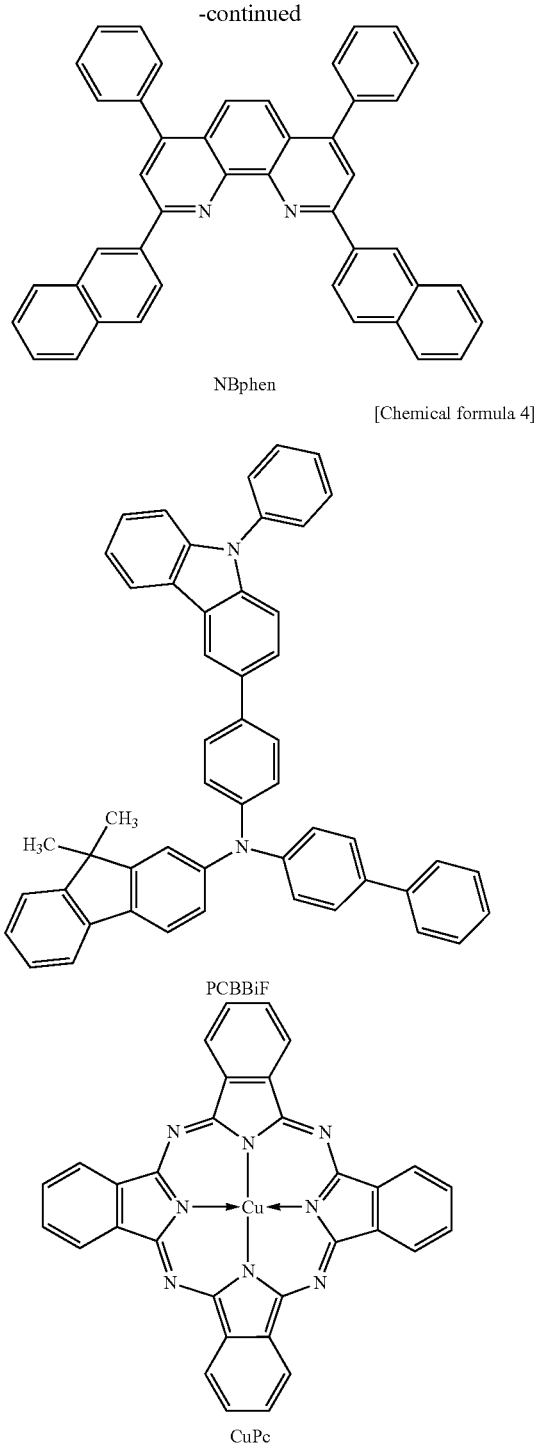

NBphen

[Chemical formula 4]

PCBBiF

CuPc

<<Formation of Light-Emitting Element>>

A light-emitting element in this example has the structure illustrated in FIG. 13 in which the first electrode 901 is formed over the substrate 900, the first EL layer 902a is formed over the first electrode 901, the charge generation layer 904 is formed over the first EL layer 902a, the second EL layer 902b is formed over the charge generation layer 904, and the second electrode 903 is formed over the second EL layer 902b as in Example 2. Note that a light-emitting element 5 in this example is a light-emitting element emitting mainly red light and referred to as a light-emitting element 5(R). A light-emitting element 6 is a light-emitting element emitting mainly green light and referred to as a light-emitting element 6(G). A light-emitting element 7 and a light-emitting element 8 are each a light-emitting element emitting mainly blue light and are also referred to as a light-emitting element 7(B1) and a light-emitting element 8(B1.5), respectively.

In the light-emitting elements in this example, the thicknesses of the layers formed at the time of forming the elements are different from each other. However, the layers can be formed using the same material and in the same manner as in Example 2; therefore, Example 2 can be referred to and description is omitted in this example.

<<Operation Characteristics of Light-Emitting Elements>>

Figure 24:
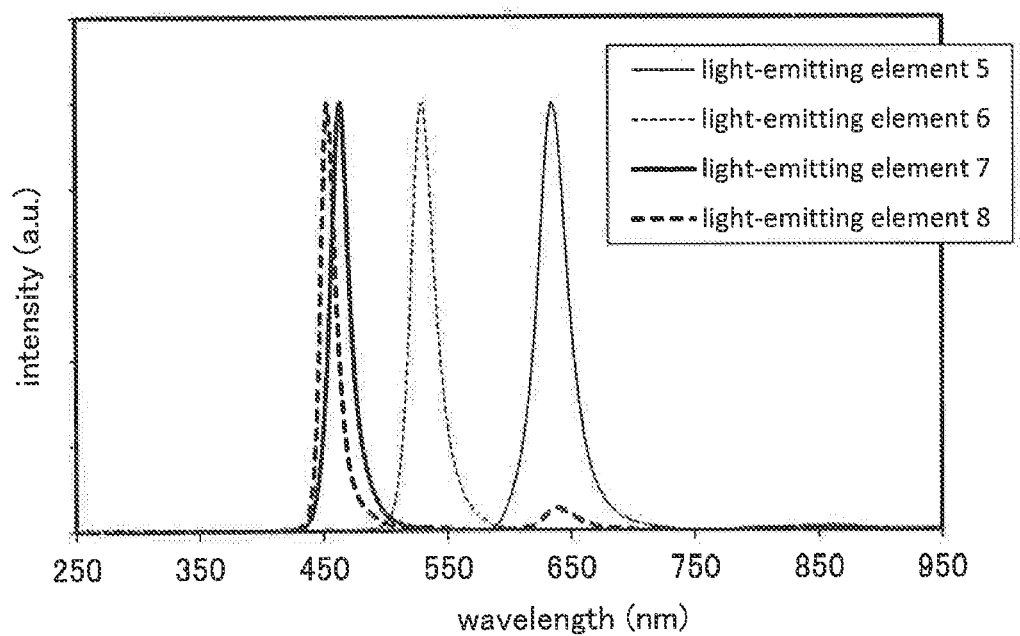
FIG. 24 shows light emission spectra of light-emitting elements 5 to 8.

Operation characteristics of the formed light-emitting elements were measured. Note that the measurement was performed at room temperature (in an atmosphere kept at 25° C.). The results are shown in FIG. 20, FIG. 21, FIG. 22, and FIG. 23. FIG. 24 shows light emission spectra when current at a current density of 2.5 mA/cm$^2$ was applied to the light-emitting elements. The light emission spectra were measured with a multi-channel spectrometer (PMA-12 produced by Hamamatsu Photonics K.K.). As shown in FIG. 24, the light emission spectrum of the light-emitting element 5(R) which emits red light has a peak around 635 nm, the light emission spectrum of the light-emitting element 6(G) which emits green light has a peak around 530 nm, and the light emission spectra of the light-emitting elements 7(B1) and 8(B1.5) which emit blue light have peaks around 464 nm and 453 nm, respectively. The spectrum shapes were narrowed. In this example, the results of measuring light emission obtained from a combination of light-emitting elements and color filters are shown.

Next, the results of measuring the chromaticities (x, y) of the light-emitting elements formed in this example (the light-emitting element 5(R), the light-emitting element 6(G), and the light-emitting element 7(B1)) with a luminance colorimeter (BM-5A manufactured by TOPCON CORPORATION) are shown in Table 7 below. The chromaticity of the light-emitting element 5(R) was measured at a luminance of approximately 650 cd/m$^2$. The chromaticity of the light-emitting element 6(G) was measured at a luminance of approximately 1900 cd/m$^2$. The chromaticity of the light-emitting element 7(B1) was measured at a luminance of approximately 140 cd/m$^2$. Note that white light emission close to D65 can be obtained by summing the luminance of R, the luminance of G, and the luminance of B.

TABLE 7

|  | x | y |
|---|---|---|
| Light-emitting element 5 (R) | 0.700 | 0.294 |
| Light-emitting element 6 (G) | 0.175 | 0.793 |
| Light-emitting element 7 (B1) | 0.142 | 0.039 |

On the basis of the results in Table 7, the BT.2020 area ratio and the BT.2020 coverage were calculated using the chromaticities (x, y) and were 97% and 95%, respectively.

The results of measuring the chromaticities (x, y) of the light-emitting element 5(R), the light-emitting element 6(G), and the light-emitting element 8(B1.5)) among the light-emitting elements formed in this example with a luminance colorimeter are shown in Table 8 below. The chromaticity of the light-emitting element 5(R) was measured at a luminance of approximately 650 cd/m². The chromaticity of the light-emitting element 6(G) was measured at a luminance of approximately 1900 cd/m². The chromaticity of the light-emitting element 8(B1.5) was measured at a luminance of approximately 170 cd/m². Note that white light emission close to D65 can be obtained by summing the luminance of R, the luminance of G, and the luminance of B.

TABLE 8

|  | x | y |
|---|---|---|
| Light-emitting element 5 (R) | 0.700 | 0.294 |
| Light-emitting element 6 (G) | 0.175 | 0.793 |
| Light-emitting element 8 (B1.5) | 0.153 | 0.046 |

On the basis of the results in Table 8, the BT.2020 area ratio and the BT.2020 coverage were calculated using the chromaticities (x, y) and were 95% and 93%, respectively. Even such a structure having improved blue light emission efficiency can achieve extremely wide-range color reproducibility.

The above results shows that, in this example, the chromaticity of the light-emitting element 5(R) falls within a chromaticity range in which x is more than 0.680 and less than or equal to 0.720 and y is greater than or equal to 0.260 and less than or equal to 0.320, the chromaticity of the light-emitting element 6(G) falls within a chromaticity range in which x is more than or equal to 0.130 and less than or equal to 0.250 and y is more than 0.710 and less than or equal to 0.810, and the chromaticity of the light-emitting element 7(B1) falls within a chromaticity range in which x is more than or equal to 0.120 and less than or equal to 0.170 and y is more than or equal to 0.020 and less than 0.060. The light-emitting element 6(G) has y of more than 0.71, and thus particularly has a better green chromaticity than the DCI-P3 standard and the NTSC standard. In addition, the light-emitting elements 7(B1) and 8(B1.5) each have y of less than 0.06, and thus particularly has a better blue chromaticity than the DCI-P3 standard.

Note that the chromaticities (x, y) of the light-emitting elements 5, 6, 7, and 8 calculated using the values of the light emission spectra shown in FIG. 24 are (0.696, 0.300), (0.185, 0.760), (0.140, 0.048), and (0.154, 0.056), respectively. Therefore, when the chromaticities of a combination of the light-emitting elements 5(R), 6(G), and 7(B1) are calculated using the light emission spectra, the BT.2020 area ratio is 91% and the BT.2020 coverage is 89%. In addition, when the chromaticities of a combination of the light-emitting elements 5(R), 6(G), and 8(B1.5) are calculated using the light emission spectra, the BT.2020 area ratio is 88% and the BT.2020 coverage is 86%.

Reference Example

In this reference example, a synthesis method of bis{4,6-dimethyl-2-[5-(4-cyano-2,6-dimethylphenyl)-3-(3,5-dimethylphenyl)-2-pyrazinyl-κN]phenyl-C}(2,2,6,6-tetramethyl-3,5-heptanedionato-$\kappa^2$O,O')iridium(III) (abbreviation: [Ir(dmdppr-dmCP)$_2$(dpm)]) (Structural formula (100)), which is an organometallic complex and a light-emitting material that can be used for the light-emitting layer in the light-emitting element of one embodiment of the present invention, is described. The organometallic complex has a peak of a light emission spectrum at more than or equal to 600 nm and less than or equal to 700 nm. The structure of [Ir(dmdppr-dmCP)$_2$(dpm)] is shown below.

[Chemical formula 5]

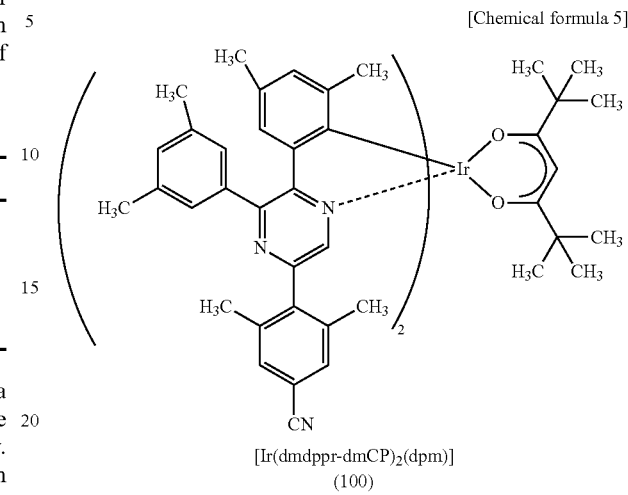

[Ir(dmdppr-dmCP)$_2$(dpm)]
(100)

Step 1: Synthesis of 5-hydroxy-2,3-(3,5-dimethylphenyl)pyrazine

First, 5.27 g of 3,3',5,5'-tetramethylbenzyl, 2.61 g of glycinamide hydrochloride, 1.92 g of sodium hydroxide, and 50 mL of methanol were put into a three-necked flask equipped with a reflux pipe, and the air in the flask was replaced with nitrogen. After that, the mixture was stirred at 80° C. for 7 hours to cause a reaction. Then, 2.5 mL of 12M hydrochloric acid was added thereto and stirring was performed for 30 minutes. Then, 2.02 g of potassium bicarbonate was added, and stirring was performed for 30 minutes. After the resulting suspension was subjected to suction filtration, the obtained solid was washed with water and methanol to give an objective pyrazine derivative as milky white powder in a yield of 79%. A synthesis scheme of Step 1 is shown in (a-1).

[Chemical formula 6]

Step 2: Synthesis of 5,6-bis(3,5-dimethylphenyl)pyrazin-2-yl trifluoromethanesulfonate Next, 4.80 g of 5-hydroxy-2,3-(3,5-dimethylphenyl)pyrazine which was obtained in Step 1, 4.5 mL of triethylamine, and 80 mL of dehydrated dichloromethane were put into a three-necked flask, and the air in the flask was replaced with nitrogen. The flask was cooled down to −20° C. Then, 3.5 mL of trifluoromethanesulfonic anhydride was dropped therein, and stirring was performed at room temperature for 17.5 hours. After that, the flask was cooled down to 0° C. Then, 0.7 mL of trifluoromethanesulfonic anhydride was further dropped therein, and stirring was performed at room temperature for 22 hours to cause a reaction. To the reaction solution, 50 mL of water and 5 mL of 1M hydrochloric acid were added and then, dichloromethane was added, so that a substance contained in the reaction solution was extracted in the dichloromethane. A saturated aqueous solution of sodium hydrogencarbonate and saturated saline were added to this dichloromethane for washing. Then, magnesium sulfate was added thereto for drying. After being dried, the solution was filtered, and the filtrate was concentrated and the obtained residue was purified by silica gel column chromatography using toluene:hexane=1:1 (volume ratio) as a developing solvent, to give an objective pyrazine derivative as yellow oil in a yield of 96%. A synthesis scheme of Step 2 is shown in (a-2).

[Chemical formula 7]

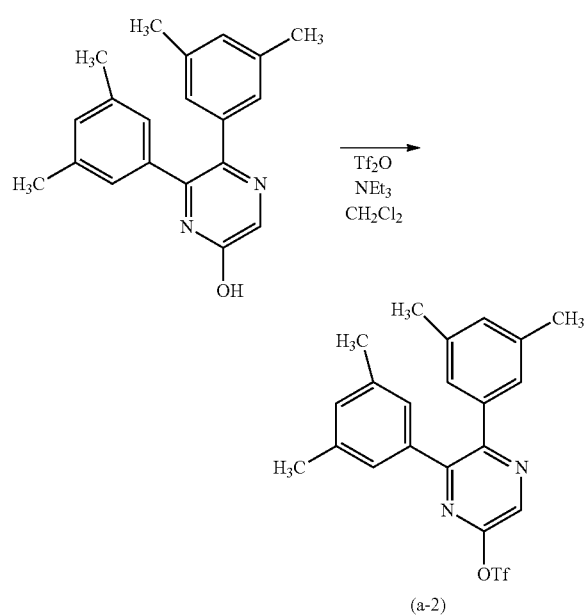

(a-2)

Step 3: Synthesis of 5-(4-cyano-2,6-dimethylphenyl)-2,3-bis(3,5-dimethylphenyl)pyrazine (abbreviation: Hdmdppr-dmCP)

Next, 2.05 g of 5,6-bis(3,5-dimethylphenyl)pyrazin-2-yl trifluoromethanesulfonate which was obtained in Step 2, 1.00 g of 4-cyano-2,6-dimethylphenylboronic acid, 3.81 g of tripotassium phosphate, 40 mL of toluene, and 4 mL of water were put into a three-necked flask, and the air in the flask was replaced with nitrogen. The mixture in the flask was degassed by being stirred under reduced pressure, 0.044 g of tris(dibenzylideneacetone)dipalladium(0) and 0.084 g of tris (2,6-dimethoxyphenyl)phosphine were then added thereto, and the mixture was refluxed for 7 hours. Water was added to the reaction solution, and then toluene was added, so that the material contained in the reaction solution was extracted in the toluene. Saturated saline was added to the toluene solution, and the toluene solution was washed. Then, magnesium sulfate was added thereto for drying. After being dried, the solution was filtered, and the filtrate was concentrated and the obtained residue was purified by silica gel column chromatography using hexane:ethyl acetate=5:1 (volume ratio) as a developing solvent, to give an objective pyrazine derivative Hdmdppr-dmCP as white powder in a yield of 90%. A synthesis scheme of Step 3 is shown in (a-3).

[Chemical formula 8]

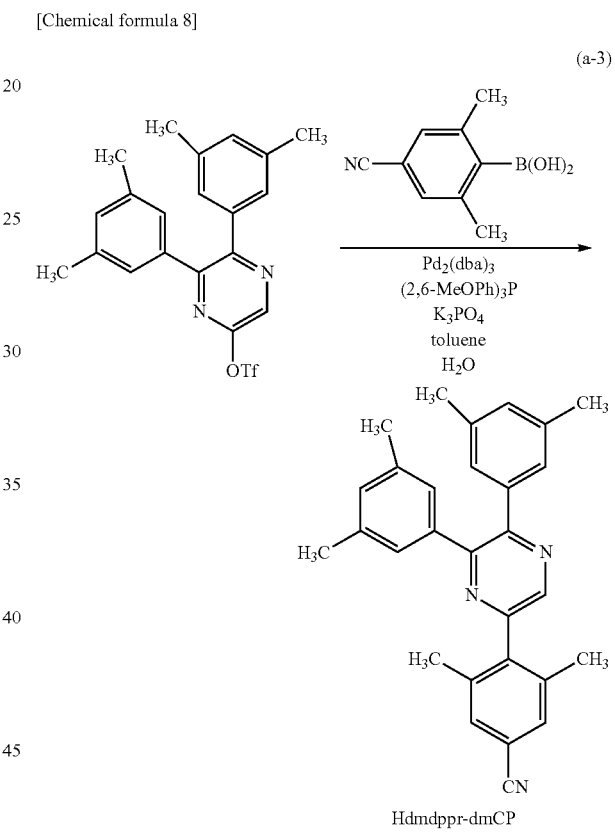

(a-3)

Step 4: Synthesis of di-μ-chloro-tetrakis{4,6-dimethyl-2-[5-(4-cyano-2,6-dimethylphenyl)-3-(3,5-dimethylphenyl)-2-pyrazinyl-N]phenyl-C}diiridium (III) (abbreviation: [Ir(dmdppr-dmCP)$_2$Cl]$_2$)

Next, 15 mL of 2-ethoxyethanol, 5 mL of water, 1.74 g of Hdmdppr-dmCP (abbreviation) which was obtained in Step 3, and 0.60 g of iridium chloride hydrate (IrCl$_3$×H$_2$O) (produced by FURUYA METAL Co., Ltd.) were put into a recovery flask equipped with a reflux pipe, and the air in the flask was replaced with argon. After that, microwave irradiation (2.45 GHz, 100 W) was performed for an hour to cause a reaction. The solvent was distilled off, and then the obtained residue was suction-filtered and washed with hexane to give a dinuclear complex [Ir(dmdppr-dmCP)$_2$Cl]$_2$ as brown powder in a yield of 89%. A synthesis scheme of Step 4 is shown in (a-4).

[Chemical formula 9]

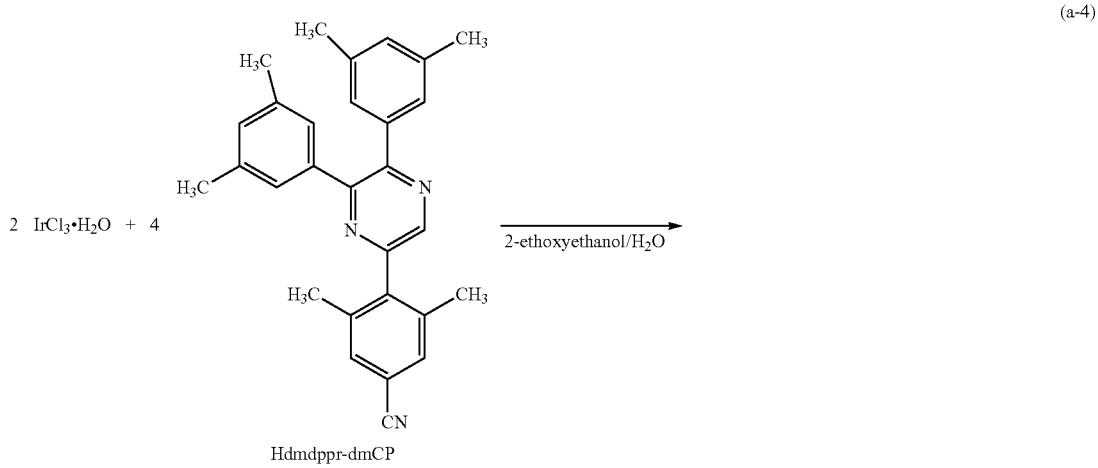

Hdmdppr-dmCP

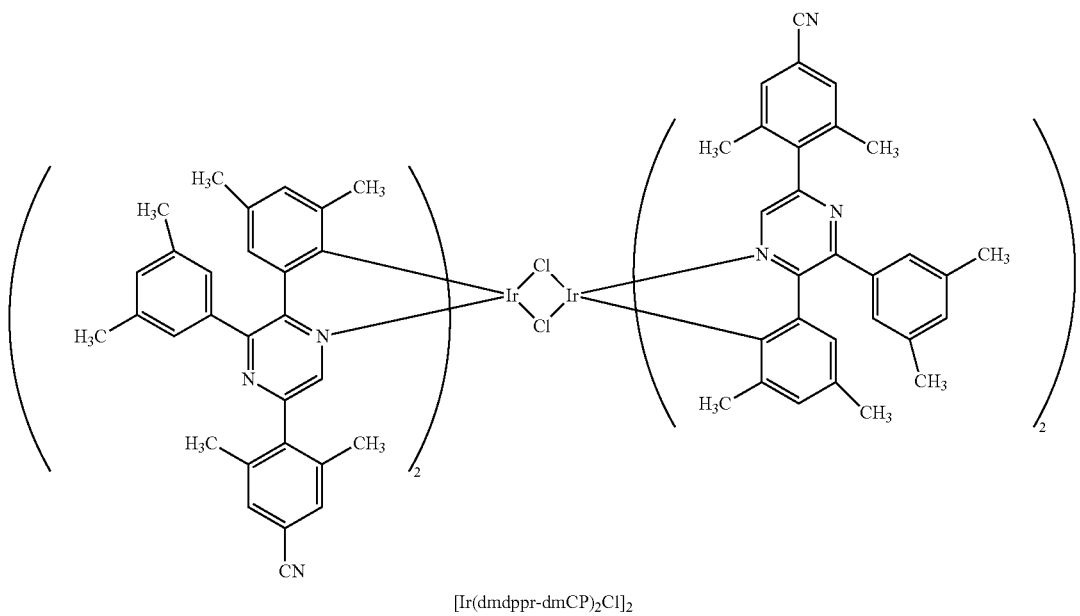

[Ir(dmdppr-dmCP)$_2$Cl]$_2$

Step 5: Synthesis of bis {4,6-dimethyl-2-[5-(4-cyano-2,6-dimethylphenyl)-3-(3,5-dimethylphenyl)-2-pyrazinyl-N]phenyl-C}(2,2,6,6-tetramethyl-3,5-heptanedionato-$\kappa^2$O,O')iridium(III) (abbreviation: [Ir(dmdppr-dmCP)$_2$(dpm)])

Furthermore, 30 mL of 2-ethoxyethanol, 0.96 g of [Ir(dmdppr-dmCP)$_2$Cl]$_2$ that is the dinuclear complex obtained in Step 4, 0.26 g of dipivaloylmethane (abbreviation: Hdpm), and 0.48 g of sodium carbonate were put into a recovery flask equipped with a reflux pipe, and the air in the flask was replaced with argon. After that, microwave irradiation (2.45 GHz, 100 W) was performed for 60 minutes. Moreover, 0.13 g of Hdpm was added thereto, and the reaction container was subjected to microwave irradiation (2.45 GHz, 120 W) for 60 minutes to cause a reaction. The solvent was distilled off, and the obtained residue was purified by silica gel column chromatography using dichloromethane and hexane as a developing solvent in a volume ratio of 1:1. The obtained residue was further purified by silica gel column chromatography using dichloromethane as a developing solvent, and then recrystallization was performed with a mixed solvent of dichloromethane and methanol to give [Ir(dmdppr-dmCP)$_2$(dpm)] which is the organometallic complex as red powder in a yield of 37%. By a train sublimation method, 0.39 g of the obtained red powder was purified. The sublimation purification was carried out at 300° C. under a pressure of 2.6 Pa with a flow rate of an argon gas at 5 mL/min. After the purification by sublimation, a red solid, which was an objective substance, was obtained in a yield of 85%. A synthetic scheme of Step 5 is shown in (a-5).

[Chemical formula 10]

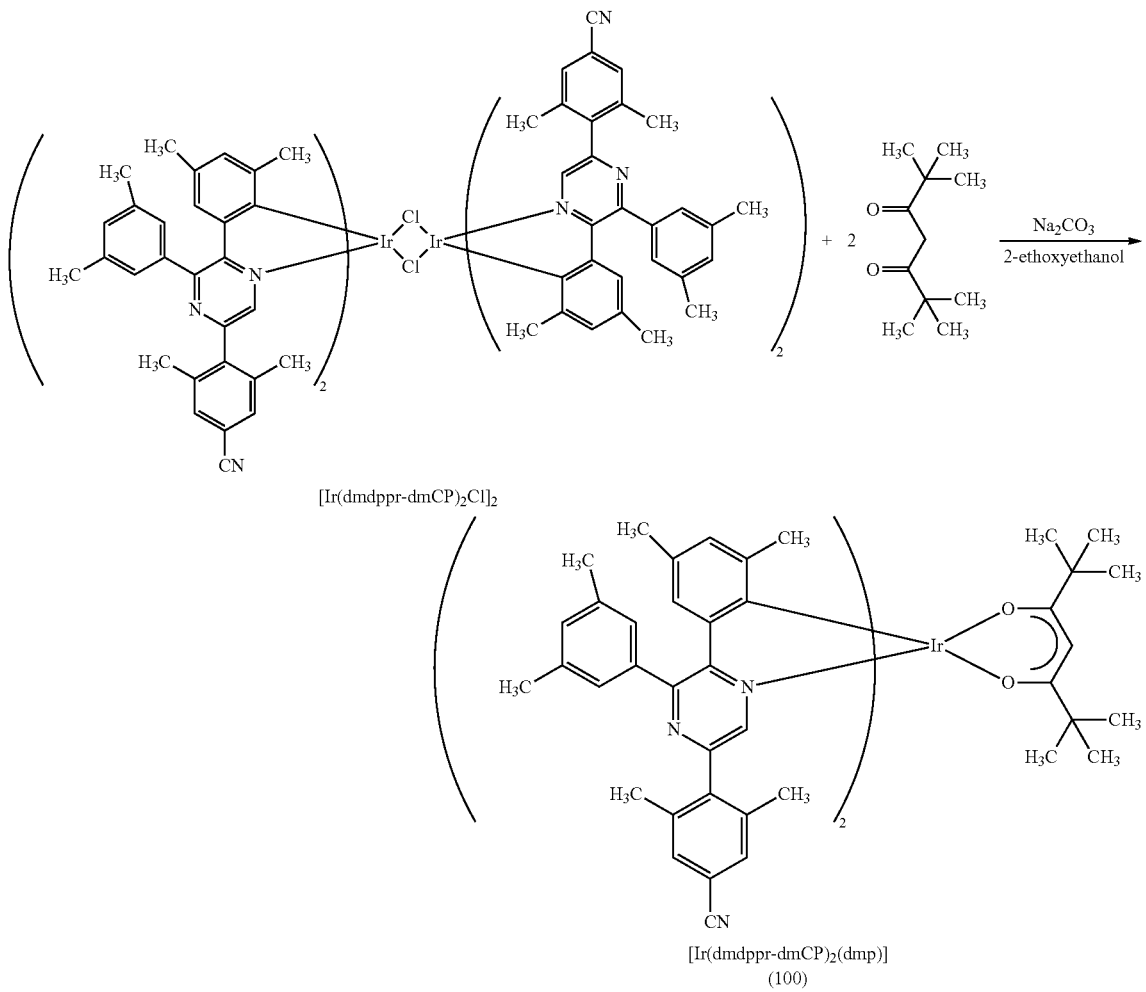

Note that results of the analysis of the red powder obtained in Step 5 by nuclear magnetic resonance spectrometry (1H-NMR) are given below. These results revealed that [Ir(dmdppr-dmCP)$_2$(dpm)], which is the organometallic complex represented by Structural Formula (100), was obtained in this synthesis example.

$^1$H-NMR. δ (CD$_2$Cl$_2$): 0.91 (s, 18H), 1.41 (s, 6H), 1.95 (s, 6H), 2.12 (s, 12H), 2.35 (s, 12H), 5.63 (s, 1H), 6.49 (s, 2H), 6.86 (s, 2H), 7.17 (s, 2H), 7.34 (s, 4H), 7.43 (s, 4H), 8.15 (s, 2H).

EXPLANATION OF REFERENCE

100L: liquid crystal element, 100E: light-emitting element, 101L, 101E: first electrode, 102L, 102E: second electrode, 103L: liquid crystal layer, 103E: EL layer, 104: alignment film, 105L: color filter, 105E: color filter, 106: polarizing layer, 107L, 107E, 108: light, 200R, 200R', 200R": light-emitting element (red), 200G, 200G', 200G": light-emitting element (green), 200B, 200B', 200B": light-emitting element (blue), 201: first electrode, 202, 202': second electrode, 203R, 203G, 203B, 203W: EL layer, 204R, 204G, 204B: EL layer, 207R, 207R', 207R": light emission (red), 207G, 207G', 207G": light emission (green), 207B, 207B', 207B": light emission (blue), 301: first electrode, 302: second electrode, 303: EL layer, 303a, 303b: EL layer, 304: charge generation layer, 311, 311a, 311b: hole-injection layer, 312, 312a, 312b: hole-transport layer, 313, 313a, 313b: light-emitting layer, 314, 314a, 314b: electron-transport layer, 315, 315a, 315b: electron-injection layer, 401: liquid crystal element, 402: light-emitting element, 403: conductive layer, 404: opening, 405: second substrate, 407: conductive layer, 408: conductive layer, 409: liquid crystal layer, 410: first element layer (display element layer), 411: second element layer (display element layer), 412: third element layer (driving element layer), 415: alignment film, 416: alignment film, 418: color filter, 419: insulating layer, 420: conductive layer, 421: conductive layer, 422: EL layer, 423: color filter, 424: polarizing layer, 425: transistor, 426: transistor, 427: terminal portion, 501: circuit (G), 502: circuit (S), 503: display portion, 504: pixel, 505: conductive film, 506: position, 507: opening, 510: liquid crystal element, 511: light-emitting element, 900: substrate, 901: first electrode, 902a: first EL layer, 902b: second EL layer, 903: second electrode, 904: charge generation layer, 905: substrate, 906: color filter, 911a: first hole-injection layer, 911b: second hole-injection layer, 912a: first hole-transport layer, 912b: second hole-transport layer, 913a: light-emitting layer (A), 913*b*: light-emitting layer (B), 913(*b*1): first light-emitting layer (B1), 913(*b*2): second light-emitting layer (B2), 914*a*: first electron-transport layer, 914*b*: second electron-transport layer, 915*a*: first electron-injection layer, 915*b*: second electron-injection layer, 5101: light, 5102: wheel, 5103: door, 5104: display portion, 5105: steering wheel, 5106: gear lever, 5107: seat, 5108: inner rearview mirror, 7100: television device, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7302: housing, 7304: display portion, 7305: icon indicating time, 7306: another icon, 7311: operation button, 7312: operation button, 7313: connection terminal, 7321: band, 7322: clasp, 7400: mobile phone, 7401: housing, 7402: display portion, 7403: operation button, 7404: external connection portion, 7405: speaker, 7406: microphone, 7407: camera, 7500(1), 7500(2): housing, 7501(1), 7501(2): first screen, 7502(1), 7502(2): second screen, 7601: main body, 7602: display portion, 7603: arm, 9310: mobile information terminal, 9311: display portion, 9312: display region, 9313: hinge, 9315: housing This application is based on Japanese Patent Application serial No. 2016-159793 filed with Japan Patent Office on Aug. 17, 2016, the entire contents of which are hereby incorporated by reference.

The invention claimed is:
1. A display device comprising:
a transistor;
a liquid crystal element electrically connected to the transistor; and
a first light-emitting element electrically connected to the transistor,
wherein the liquid crystal element is configured to reflect outside light,
wherein light obtained from the display device is configured to meet an NTSC standard,
wherein light obtained from the liquid crystal element has an NTSC coverage of more than or equal to 20% and less than or equal to 60%,
wherein the liquid crystal element has a reflectance of more than or equal to 16% and less than or equal to 26%,
wherein light emitted by the first light-emitting element has CIE 1931 chromaticity coordinates (x1, y1), and
wherein y1 is more than 0.710 and less than or equal to 0.810.
2. The display device according to claim 1, wherein the liquid crystal element overlaps with the first light-emitting element.
3. The display device according to claim 1,
wherein the liquid crystal element is a reflective liquid crystal element, and
wherein the first light-emitting element comprises an EL layer between a reflective electrode and a semi-transmissive and semi-reflective electrode.
4. The display device according to claim 1, further comprising,
a second light-emitting element,
wherein light emitted by the second light-emitting element has CIE 1931 chromaticity coordinates (x2, y2),
wherein x2 is more than 0.680 and less than or equal to 0.720, and
wherein y2 is more than or equal to 0.260 and less than or equal to 0.320.

5. The display device according to claim 4, wherein the liquid crystal element overlaps with the second light-emitting element.
6. The display device according to claim 1, further comprising a third light-emitting element,
wherein light emitted by the third light-emitting element has CIE 1931 chromaticity coordinates (x3, y3),
wherein x3 is more than or equal to 0.120 and less than or equal to 0.170, and
wherein y3 is more than or equal to 0.020 and less than 0.060.
7. The display device according to claim 6, wherein the liquid crystal element overlaps the third light-emitting element.
8. The display device according to claim 1, wherein x1 is more than or equal to 0.130 and less than or equal to 0.250.
9. The display device according to claim 1,
wherein the liquid crystal element comprises a reflective electrode, a liquid crystal layer and a color filter,
wherein the first light-emitting element comprises a pair of electrodes and a first light-emitting layer between the pair of electrodes, and the color filter,
wherein the liquid crystal element is configured to reflect outside light through the color filter, and
wherein the first light-emitting element is configured to make light emitted from the first light-emitting layer pass through the color filter.
10. The display device according to claim 9, wherein a driving mode for the liquid crystal element is an electrically controlled birefringence mode.
11. The display device according to claim 9, wherein the liquid crystal layer is positioned between the first light-emitting layer and the color filter.
12. The display device according to claim 1, wherein the display device is a head-mounted display.
13. A display device comprising:
a transistor;
a liquid crystal element electrically connected to the transistor; and
a light-emitting element electrically connected to the transistor, the light-emitting element comprising:
a first light-emitting element;
a second light-emitting element; and
a third light-emitting element,
wherein the liquid crystal element is configured to reflect outside light,
wherein light obtained from the display device is configured to meet an NTSC standard,
wherein light obtained from the liquid crystal element has an NTSC coverage of more than or equal to 20% and less than or equal to 60%,
wherein the liquid crystal element has a reflectance of more than or equal to 16% and less than or equal to 26%,
wherein light emitted by the first light-emitting element has CIE 1931 chromaticity coordinates (x1, y1),
wherein light emitted by the first light-emitting element has CIE 1931 chromaticity coordinates (x2, y2),
wherein light emitted by the first light-emitting element has CIE 1931 chromaticity coordinates (x3, y3),
wherein y1 is more than 0.710 and less than or equal to 0.810,
wherein x2 is more than 0.680 and less than or equal to 0.720, and
wherein y3 is more than or equal to 0.020 and less than 0.060.

14. The display device according to claim 13,
wherein the first light-emitting element is configured to emit green light,
wherein the second light-emitting element is configured to emit red light, and
wherein the third light-emitting element is configured to emit blue light.

15. The display device according to claim 13,
wherein the liquid crystal element comprises a reflective electrode, a liquid crystal layer and a color filter,
wherein each of the first light-emitting element, the second light-emitting element, the third light-emitting element comprises a pair of electrodes and a light-emitting layer between the pair of electrodes, and the color filter,
wherein the liquid crystal element is configured to reflect outside light through the color filter,
wherein the first light-emitting element is configured to make light emitted from the light-emitting layer pass through the color filter, and
wherein the liquid crystal layer and the light-emitting layer overlap each other.

16. The display device according to claim 15, wherein a driving mode for the liquid crystal element is an electrically controlled birefringence mode.

17. The display device according to claim 15, wherein the liquid crystal layer is positioned between the color filter and the light-emitting layer of the first light-emitting element.

18. The display device according to claim 13, further comprising a fourth light-emitting element,
wherein lights emitted from the first light-emitting element, the second light-emitting element, the third light-emitting element and the fourth light-emitting element are different from each other.

19. The display device according to claim 18, wherein the fourth light-emitting element is configured to emit white light.

20. The display device according to claim 13, wherein each of the first light-emitting element, the second light-emitting element and the third light-emitting element comprises the same light-emitting layer.

\* \* \* \* \*